US012772590B2

(12) United States Patent
Kim

(10) Patent No.: US 12,772,590 B2
(45) Date of Patent: Oct. 20, 2026

(54) IMAGE SENSOR HAVING A DEVICE ISOLATION PATTERN CONTAINING A CONDUCTIVE LINER AND METHOD OF FABRICATING THE SAME

(71) Applicant: Samsung Electronics Co., Ltd., Suwon-si (KR)

(72) Inventor: Kook Tae Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 377 days.

(21) Appl. No.: 18/393,786

(22) Filed: Dec. 22, 2023

(65) Prior Publication Data

US 2025/0006761 A1 Jan. 2, 2025

(30) Foreign Application Priority Data

Jun. 28, 2023 (KR) ........................ 10-2023-0083429

(51) Int. Cl.
*H10F 39/00* (2025.01)
*H10F 39/18* (2025.01)

(52) U.S. Cl.
CPC ......... *H10F 39/807* (2025.01); *H10F 39/182* (2025.01)

(58) Field of Classification Search
CPC ............................... H10F 39/807; H10F 39/18
See application file for complete search history.

(56) References Cited

U.S. PATENT DOCUMENTS

| | | | | |
|---|---|---|---|---|
| 8,558,340 | B2 | 10/2013 | Miyanami | |
| 8,941,198 | B2 | 1/2015 | Enomoto | |
| 9,466,629 | B2 | 10/2016 | Yoon et al. | |
| 10,319,768 | B2 | 6/2019 | Li et al. | |
| 11,239,269 | B2 | 2/2022 | Kim et al. | |
| 2022/0130876 | A1 * | 4/2022 | Park | H04N 25/77 |
| 2022/0344383 | A1 * | 10/2022 | Kao | H10F 39/014 |
| 2022/0392930 | A1 | 12/2022 | Chang et al. | |
| 2025/0006763 | A1 | 1/2025 | Kim et al. | |

FOREIGN PATENT DOCUMENTS

| | | | |
|---|---|---|---|
| JP | 2005294759 | A | 10/2005 |
| KR | 20250001197 | A | 1/2025 |

* cited by examiner

*Primary Examiner* — Davienne N Monbleau
*Assistant Examiner* — Emily Farmer
(74) *Attorney, Agent, or Firm* — Wolf, Greenfield & Sacks, P.C.

(57) ABSTRACT

An image sensor includes a substrate that includes a plurality of pixel areas, where the substrate includes a first surface and a second surface that are opposite to each other; and a device isolation pattern that extends from the first surface and into the substrate, where the device isolation pattern is between the plurality of pixel areas, where the device isolation pattern includes an intervening region, a crossing region, a first device isolation portion, and a second device isolation portion, where the intervening region includes: a first dielectric pattern; a conductive liner; and a second dielectric pattern, where the first dielectric pattern extends from the first device isolation portion and toward the second device isolation portion, and where the first device isolation portion includes the conductive liner and the second dielectric pattern.

19 Claims, 71 Drawing Sheets

IMAGE SENSOR HAVING A DEVICE ISOLATION PATTERN CONTAINING A CONDUCTIVE LINER AND METHOD OF FABRICATING THE SAME

CROSS-REFERENCE TO RELATED APPLICATION

This U.S. nonprovisional application claims priority under 35 U.S.C. § 119 to Korean Patent Application No. 10-2023-0083429 filed on Jun. 28, 2023 in the Korean Intellectual Property Office, the disclosure of which is hereby incorporated by reference in its entirety.

TECHNICAL FIELD

The present disclosure relate to an image sensor and a method of fabricating the same, and more particularly, to a complementary metal oxide semiconductor (CMOS) image sensor and a method of fabricating the same.

BACKGROUND

An image sensor is a semiconductor device that transforms optical images into electrical signals. Recent advances in computer and communication industries have led to strong demands in high performances image sensors in various consumer electronic devices such as digital cameras, camcorders, PCSs (Personal Communication Systems), game devices, security cameras, medical micro cameras, etc. An image sensor can be classified as a charge coupled device (CCD) type and a complementary metal oxide semiconductor (CMOS) type. A CMOS type image sensor may be abbreviated as a CIS (CMOS image sensor). The CIS has a plurality of two-dimensionally arranged pixels. Each of the pixels includes a photodiode. The photodiode transforms an incident light into an electrical signal. The plurality of pixels are defined by a deep device isolation pattern disposed therebetween.

SUMMARY

Some embodiments of the present disclosure provide an image sensor configured to minimize or inhibit the occurrence of dark current and a method of fabricating the same.

Some embodiments of the present disclosure provide a highly-integrated image sensor and a method of fabricating the same.

According to some embodiments of the present disclosure, an image sensor may comprise: a substrate that includes a plurality of pixel areas, where the substrate includes a first surface and a second surface that are opposite to each other; and a device isolation pattern that extends from the first surface and into the substrate, where the device isolation pattern is between the plurality of pixel areas, where the device isolation pattern includes an intervening region, a crossing region, a first device isolation portion, and a second device isolation portion, where the intervening region includes: a first dielectric pattern; a conductive liner that contacts a sidewall of the first dielectric pattern; and a second dielectric pattern that contacts a sidewall of the conductive liner and a top surface of the conductive liner, where the first dielectric pattern extends from the first device isolation portion and toward the second device isolation portion, and where the first device isolation portion includes the conductive liner and the second dielectric pattern.

According to some embodiments of the present disclosure, an image sensor may comprise: a substrate that includes a plurality of pixel areas, where the substrate includes a first surface and a second surface that are opposite to each other; and a device isolation pattern that extends from the first surface and into the substrate, where the device isolation pattern is between the plurality of pixel areas, where the device isolation pattern includes an intervening region, a crossing region, a first device isolation portion, and a second device isolation portion, where the intervening region includes: an intervening dielectric pattern; a conductive liner that contacts the intervening dielectric pattern; a first dielectric pattern that contacts the conductive liner; and a second dielectric pattern on the first dielectric pattern, where the first dielectric pattern extends from the first device isolation portion and toward the second device isolation portion, where the first device isolation portion includes the intervening dielectric pattern, the conductive liner, and the second dielectric pattern, and where the first dielectric pattern includes a stepwise shape on the first device isolation portion.

According to some embodiments of the present disclosure, an image sensor may comprise: a substrate that includes a plurality of pixel areas, where the substrate includes a first surface and a second surface that are opposite to each other; a device isolation pattern that extends from the first surface and into the substrate, where the device isolation pattern is between the plurality of pixel areas; and a shallow device isolation pattern that is adjacent to the second surface of the substrate, where the device isolation pattern includes an intervening region, a crossing region, a first device isolation portion, and a second device isolation portion, where, in the intervening region: a width of the first device isolation portion is less than a width of the shallow device isolation pattern, a width of the second device isolation portion is less than the width of the first device isolation portion, the first device isolation portion includes at least one dielectric material and at least one conductive material, and the second device isolation portion includes at least one dielectric material.

DETAILED DESCRIPTION OF EMBODIMENTS

Figure 1:
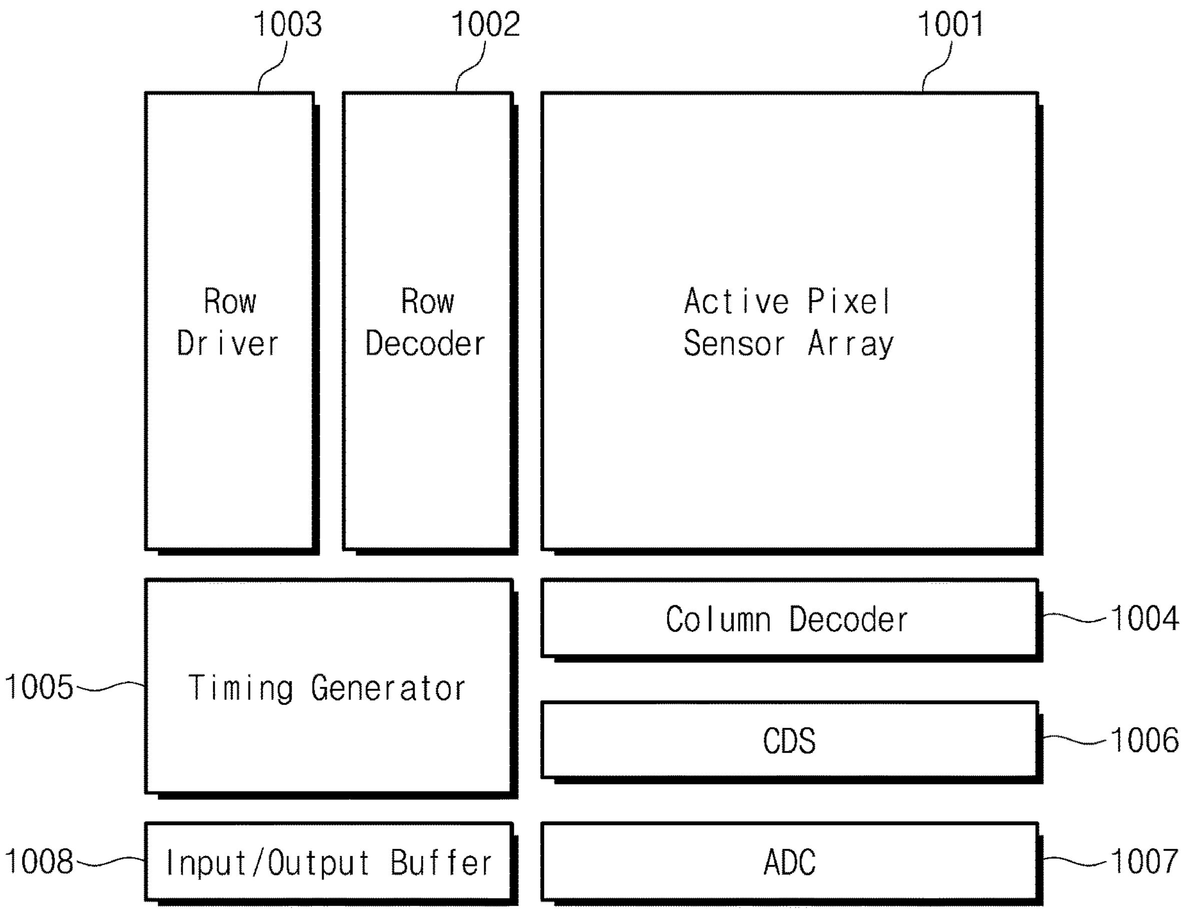
FIG. 1 illustrates a simplified block diagram of an image sensor according to some embodiments of the present disclosure.

To clarify the present disclosure, parts that are not connected with the description will be omitted, and the same elements or equivalents are referred to by the same reference numerals throughout the specification. Further, since sizes and thicknesses of constituent members shown in the accompanying drawings are arbitrarily given for better understanding and ease of description, the present disclosure is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

In addition, unless explicitly described to the contrary, the word "comprises", and variations such as "comprises" or "comprising", will be understood to imply the inclusion of stated elements but not the exclusion of any other elements. As used herein, the phrase "at least one of A, B, and C" refers to a logical (A OR B OR C) using a non-exclusive logical OR, and should not be construed to mean "at least one of A, at least one of B and at least one of C." As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof. The term "and/or" includes any and all combinations of one or more of the associated listed items. The term "connected" may be used herein to refer to a physical and/or electrical connection and may refer to a direct or indirect physical and/or electrical connection. The phrase "an element A surrounds element B" may refer to element A at least partially surrounding element B. The phrases "an element A is filled with element B" or "element B fills element A" refer to element B being at least partially in a space defined by element A. As used herein, "an element A is at a same level as element B" refers to at least one surface of element A that is coplanar with at least one surface of element B.

The following will now describe in detail some embodiments of the present disclosure with reference to the accompanying drawings.

FIG. 1 illustrates a simplified block diagram showing an image sensor according to some embodiments of the present disclosure.

Referring to FIG. 1, an image sensor may include an active pixel sensor array 1001, a row decoder 1002, a row driver 1003, a column decoder 1004, a timing generator 1005, a correlated double sampler (CDS) 1006, an analog-to-digital converter (ADC) 1007, and an input/output (I/O) buffer 1008.

The active pixel sensor array 1001 may include a plurality of two-dimensionally arranged unit pixels, each of which is configured to convert optical signals into electrical signals. The active pixel sensor array 1001 may be driven by a plurality of driving signals such as a pixel selection signal, a reset signal, and a charge transfer signal from the row driver 1003. The correlated double sampler 1006 may receive the converted electrical signals.

The row driver 1003 may provide the active pixel sensor array 1001 with several driving signals for driving several unit pixels in accordance with a decoded result obtained from the row decoder 1002. When the unit pixels are arranged in a matrix shape, the driving signals may be provided for respective rows.

The timing generator 1005 may provide timing and control signals to the row decoder 1002 and the column decoder 1004.

The correlated double sampler 1006 may receive the electrical signals generated by the active pixel sensor array 1001, and may hold and sample the received electrical signals. The correlated double sampler 1006 may perform a double sampling operation to sample a specific noise level and a signal level of the electrical signal, and then may output a difference level corresponding to a difference between the noise and signal levels.

The analog-to-digital converter 1007 may convert analog signals, which correspond to the difference level received from the correlated double sampler 1006, into digital signals, and then output the converted digital signals.

The input/output buffer 1008 may latch the digital signals and then sequentially output the latched digital signals to an image signal processing unit (not shown) in response to obtaining the decoded result from the column decoder 1004.

Figure 2:
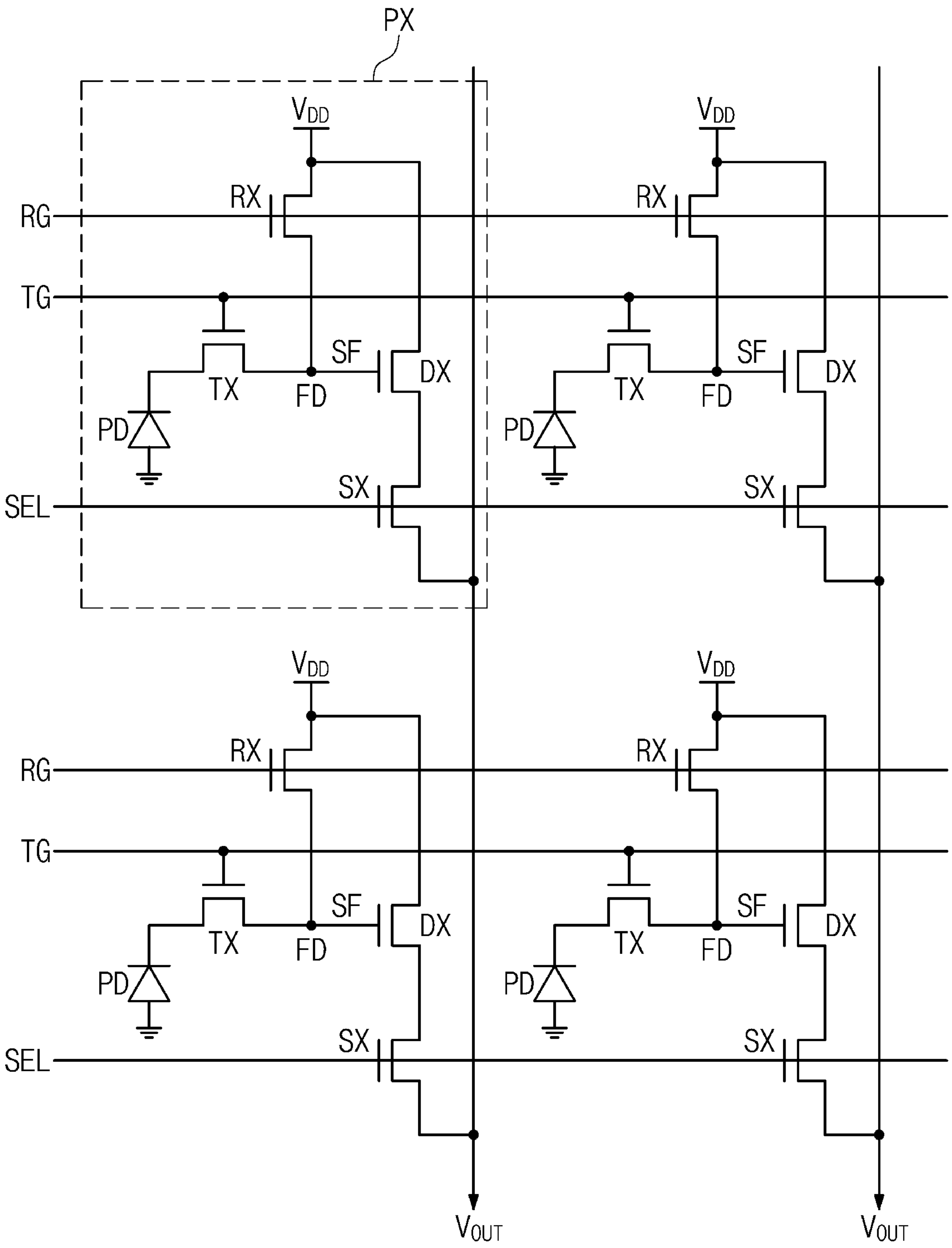
FIG. 2 illustrates a circuit diagram of an active pixel sensor array of an image sensor according to some embodiments of the present disclosure.

FIG. 2 illustrates a circuit diagram showing an active pixel sensor array of an image sensor according to some embodiments of the present disclosure.

Referring to FIGS. 1 and 2, the active pixel sensor array 1001 may include a plurality of pixel areas PX, and the pixel areas PX may be arranged in a matrix shape. Each pixel area PX may include a transfer transistor TX. Each pixel area PX may further include logic transistors RX, SX, and DX. The logic transistors RX, SX, and DX may include a reset transistor RX, a selection transistor SX, and a source follower transistor DX. The transfer transistor TX may include a transfer gate TG. Each of the pixel areas PX may further include a photoelectric conversion element PD and a floating diffusion region FD. The logic transistors RX, SX, and DX may be shared by a plurality of pixel areas PX.

The photoelectric conversion element PD may create and accumulate photo-charges in proportion to an amount of externally incident light. The photoelectric conversion element PD may include a photodiode, phototransistor, a photogate, a pinned photodiode, or a combination thereof. The transfer transistor TX may transfer charges generated in the photoelectric conversion element PD into the floating diffusion region FD. The floating diffusion region FD may accumulate and store charges that are generated and transferred from the photoelectric conversion element PD. The source follower transistor DX may be controlled by an amount of photo-charges accumulated in the floating diffusion region FD.

The reset transistor RX may periodically reset the charges accumulated in the floating diffusion region FD. The reset transistor RX may have a drain electrode connected to the floating diffusion region FD and a source electrode connected to a power voltage VDD. When the reset transistor RX is turned on, the floating diffusion region FD may be supplied with the power voltage VDD connected to the source electrode of the reset transistor RX. Accordingly, when the reset transistor RX is turned on, the charges accumulated in the floating diffusion region FD may be exhausted and thus the floating diffusion region FD may be reset.

The source follower transistor DX including a source follower gate SF may serve as a source follower buffer amplifier. The source follower transistor DX may amplify a variation in electrical potential of the floating diffusion region FD and may output the amplified electrical potential to an output line $V_{OUT}$.

The selection transistor SX including a selection gate SEL may select each row of the pixel area PX to be read out. When the selection transistor SX is turned on, the power voltage VDD) may be applied to a drain electrode of the source follower transistor DX.

Figure 3:
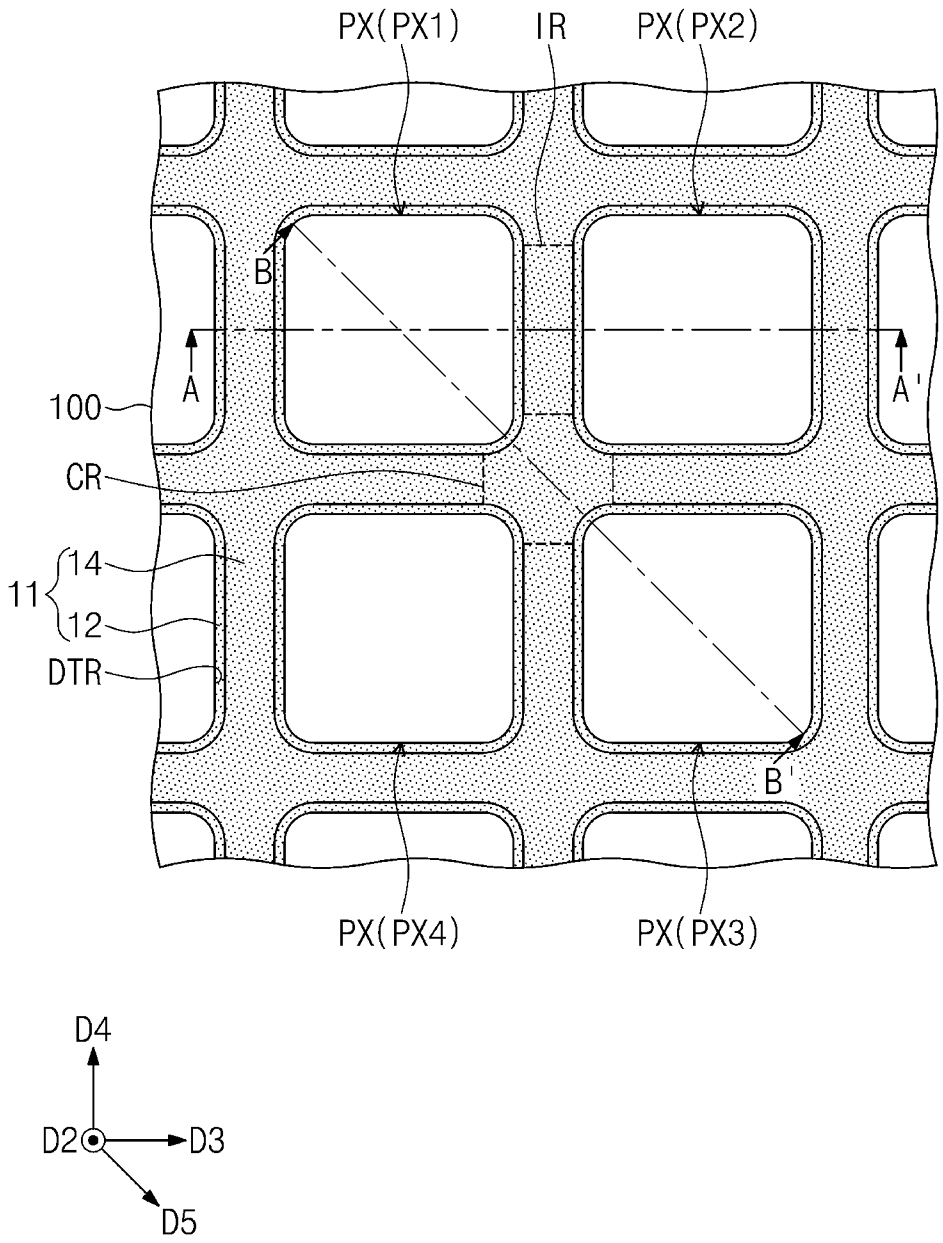
FIG. 3 illustrates a plan view of an image sensor according to some embodiments of the present disclosure.
Figure 4A:
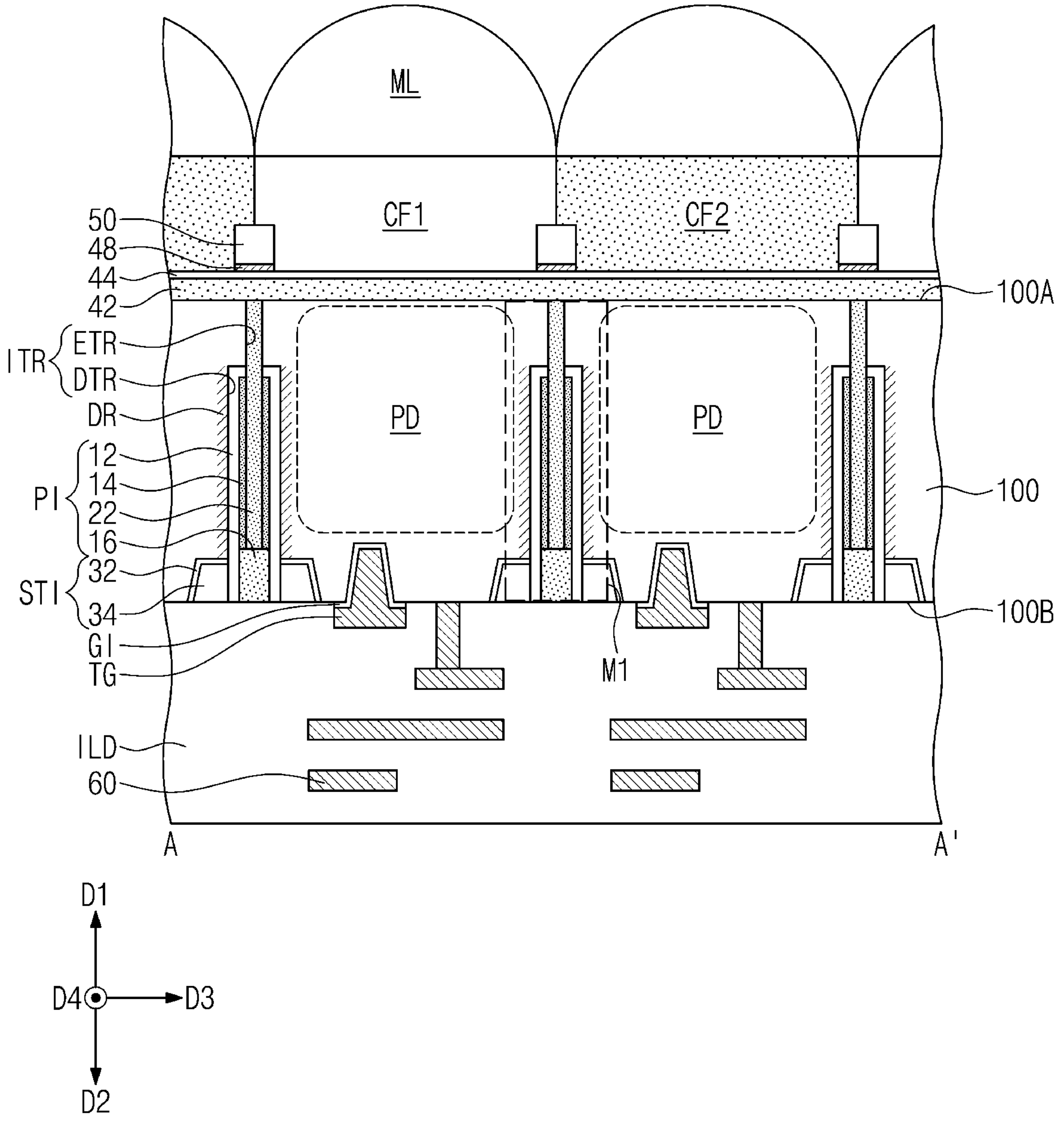
FIG. 4A illustrates a cross-sectional view taken along line A-A' of FIG. 3.
Figure 4B:
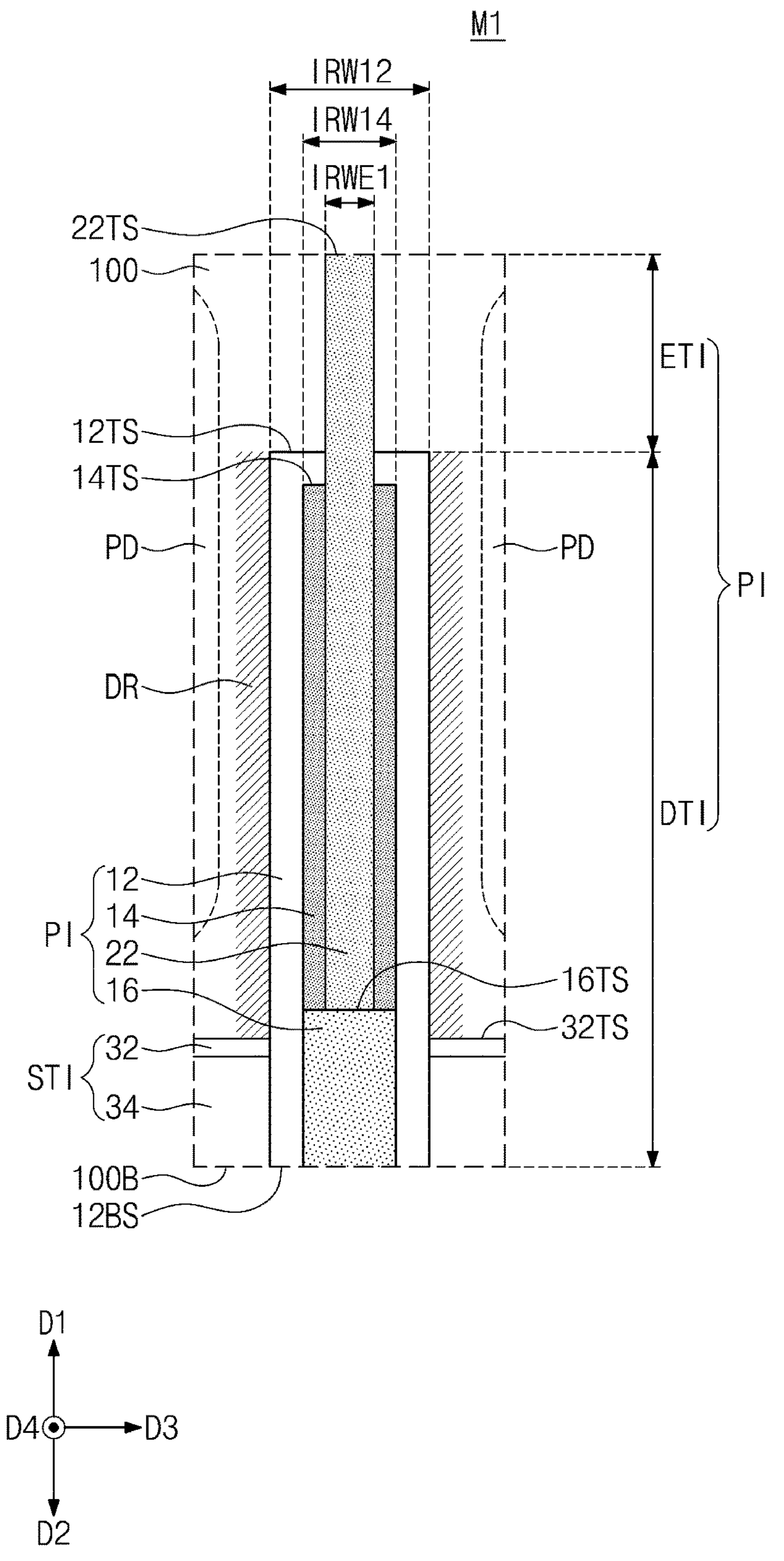
FIG. 4B illustrates an enlarged view showing section M1 of FIG. 4A.
Figure 4C:
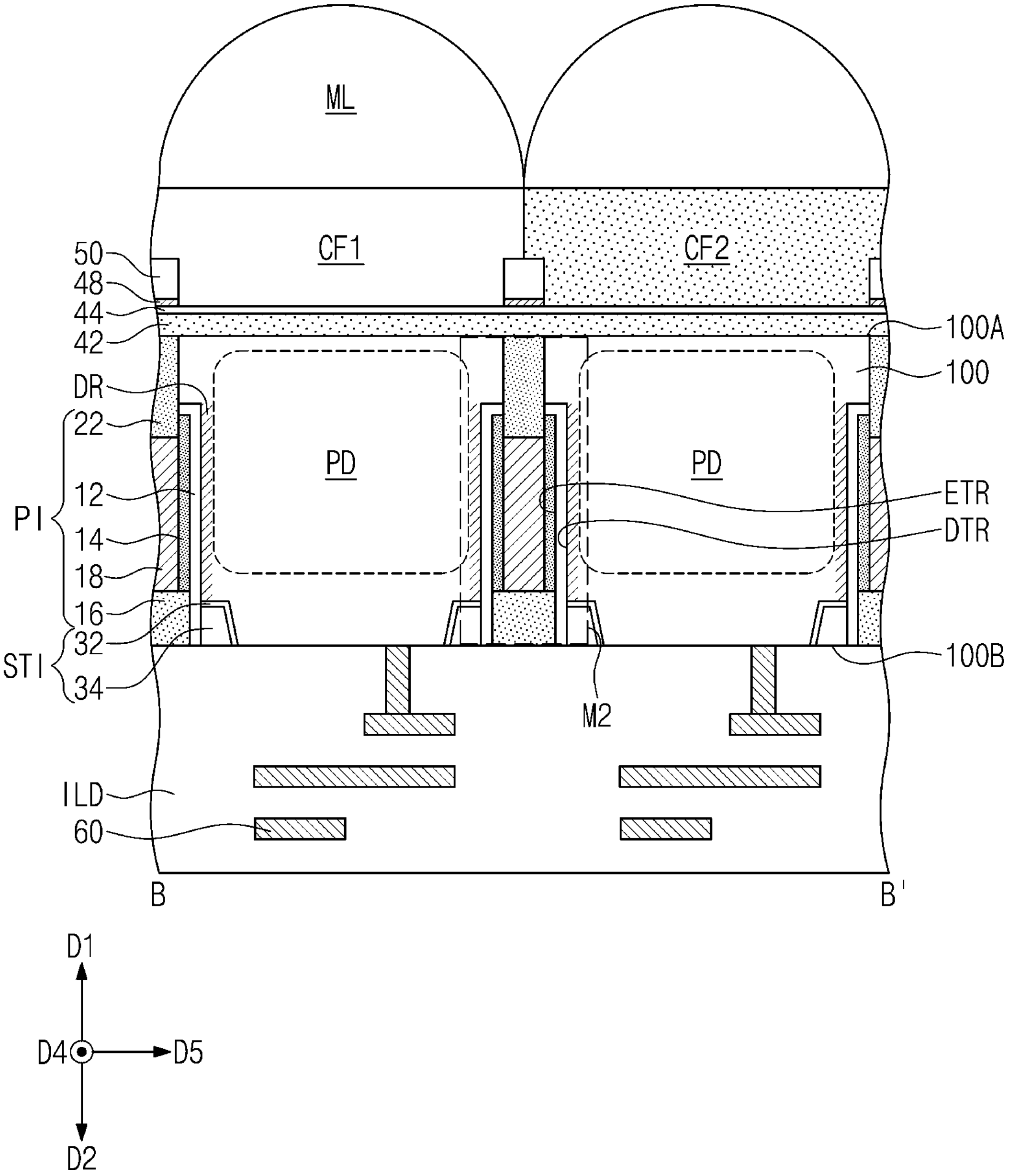
FIG. 4C illustrates a cross-sectional view taken along line B-B' of FIG. 3.
Figure 4D:
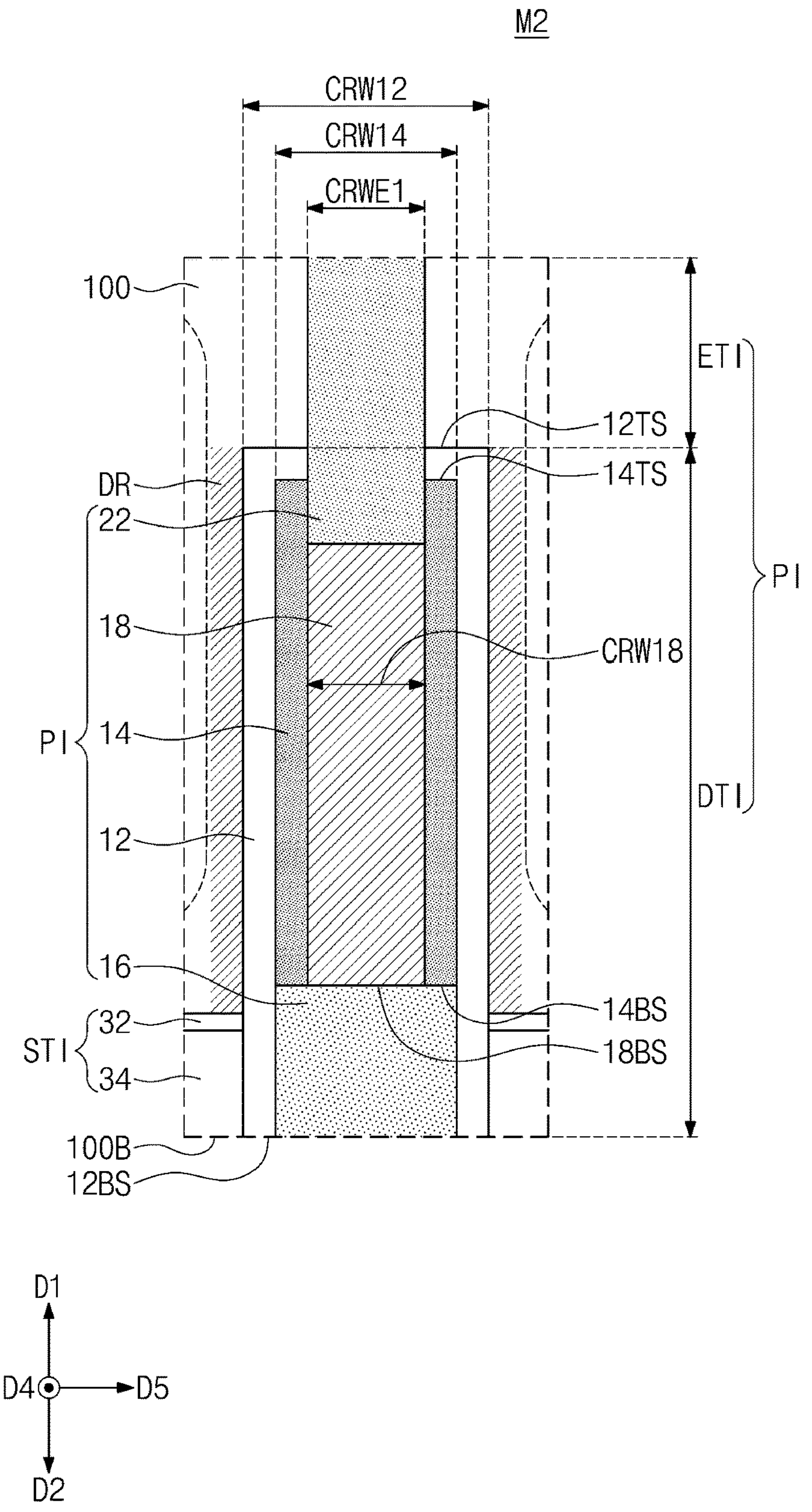
FIG. 4D illustrates an enlarged view of section M2 of FIG. 4C.

FIG. 3 illustrates a plan view showing an image sensor according to some embodiments of the present disclosure. FIG. 4A illustrates a cross-sectional view taken along line A-A' of FIG. 3. FIG. 4B illustrates an enlarged view showing section M1 of FIG. 4A. FIG. 4C illustrates a cross-sectional view taken along line B-B' of FIG. 3. FIG. 4D illustrates an enlarged view showing section M2 of FIG. 4C.

Referring to FIGS. 3 and 4A to 4D, a substrate 100 may be provided. For example, the substrate 100 may be a monocrystalline silicon wafer, a silicon epitaxial layer, or a silicon-on-insulator (SOI) substrate. The substrate 100 may be doped with impurities to have a first conductivity type (e.g., p-type). The substrate 100 may have a first surface 100A and a second surface 100B that are opposite to each other. The first surface 100A may be spaced apart from the second surface 100B in a first direction D1, and the second surface 100B may be spaced apart from the first surface 100B in a second direction D2. The first direction D1 and the second direction D2 may be opposite to each other.

The substrate 100 may include a plurality of pixel areas PX. For example, when viewed in plan, the substrate 100 may include first, second, third, and fourth pixel areas PX1, PX2, PX3, and PX4 that are sequentially arranged in a clockwise direction. The first and second pixel areas PX1 and PX2 may be adjacent to each other in or arranged side by side along a third direction D3, and the third and fourth pixel areas PX3 and PX4 may also be adjacent to each other in the third direction D3. The third direction D3 may be parallel to the second surface 100B of the substrate 100. The second and third pixel areas PX2 and PX3 may be adjacent to each other in a fourth direction D4, and the first and fourth pixel areas PX1 and PX4 may also be adjacent to each other in the fourth direction D4. The fourth direction D4 may be parallel to the second surface 100B of the substrate 100, and may intersect the third direction D3.

A device isolation pattern PI may be in the substrate 100. The device isolation pattern PI may limit and separate the pixel areas PX from each other. The device isolation pattern PI may penetrate or extend along the second direction D2 and through the substrate 100 between the pixel areas PX.

The device isolation pattern PI may be disposed in an isolation trench ITR that extends from the second surface 100B toward the first surface 100A. The isolation trench ITR may include a deep trench DTR and an extension trench ETR. When viewed in plan, the device isolation pattern PI may shave a mesh shape in which lines extending in the third direction D3 intersect lines extending in the fourth direction D4.

The device isolation pattern PI may extend from the second surface 100B and into the substrate 100, and may be interposed between a plurality of pixel areas PX. The device isolation pattern PI may include an intervening region IR and a crossing region CR.

The intervening region IR may be defined to indicate a region between two neighboring pixel areas PX. The crossing region CR may be defined to indicate a region between four neighboring pixel areas PX. The intervening region IR and the crossing region CR may be continuous with each other.

The device isolation pattern PI may include a first device isolation portion DTI and a second device isolation portion ETI. The first device isolation portion DTI and the second device isolation portion ETI may have different widths from each other.

In the intervening region IR, the device isolation pattern PI may include a first dielectric pattern 22, a conductive liner 14 on the first dielectric pattern 22, a second dielectric pattern 12 on the conductive liner 14, and a buried dielectric pattern 16.

In the crossing region CR, the device isolation pattern PI may include the first dielectric pattern 22, a buried conductive pattern 18 below the first dielectric pattern 22, the conductive liner 14 in contact with the buried conductive pattern 18, the second dielectric pattern 12 in contact with the conductive liner 14, and the buried dielectric pattern 16.

In the intervening region IR, the first dielectric pattern 22 may extend from the first device isolation portion DTI to the second device isolation portion ETI. The conductive liner 14 and the second dielectric pattern 12 may be disposed in the first device isolation portion DTI.

In the crossing region CR, the first dielectric pattern 22 may be disposed in the second device isolation portion ETI, and may extend from the second device isolation portion ETI to the first device isolation portion DTI. The buried conductive pattern 18 may be disposed in the first device isolation portion DTI.

The first dielectric pattern 22 or the second dielectric pattern 12 may include an oxide, such as $SiO_2$, $Al_2O_3$, or HfO. The conductive liner 14 may include Si. The conductive liner 14 may include Si doped with B or P. The conductive liner 14 may include metal, such as one or more of Cu, W, Al, and Ti. The buried dielectric pattern 16 may include silicon oxide or silicon nitride.

A doping region DR may further be provided on the substrate 100. The doping region DR may be adjacent to the first device isolation portion DTI. The doping region DR may include boron. In this case, the doping region DR may be doped with boron to at least partially surround the second dielectric pattern 12.

In an embodiment, the doping region DR may be in contact with the first device isolation portion DTI and the second device isolation portion ETI. In this case, the doping region DR may be doped with boron to at least partially surround the first dielectric pattern 22 and the second dielectric pattern 12.

A photoelectric conversion element PD may be provided in each of the pixel areas PX. The photoelectric conversion element PD may be doped with impurities having a second conductivity type (e.g., n-type) that is opposite to the first conductivity type. The impurities doped into the photoelectric conversion element PD and the impurities having the first conductivity type in the substrate 100 may constitute a PN junction, thereby providing a photodiode.

A shallow device isolation trench STR may be recessed into the substrate 100 from the second surface 100B of the substrate 100, and a shallow device isolation portion STI may be in the shallow device isolation trench STR. The shallow device isolation portion STI may be disposed adjacent to the second surface 100B of the substrate 100.

The shallow device isolation portion STI may include a first isolation portion 32 and a second isolation portion 34. The first isolation portion 32 may conformally cover or overlap an inner wall of the shallow device isolation trench STR. The second isolation portion 34 may be in the shallow device isolation trench STR. The first and second isolation portions 32 and 34 may independently include at least one selected from silicon oxide (SiO), silicon nitride (SiN), silicon carbonitride (SiCN), silicon oxycarbonitride (SiOCN), and any combination thereof. The device isolation pattern PI may extend in the second direction D2 through the shallow device isolation portion STI. In the pixel area PX, the shallow device isolation portion STI may limit active regions (not shown) adjacent to the second surface 100B of the substrate 100. The active regions may be provided for the transistors TX, RX, DX, and SX of FIG. 2.

The buried dielectric pattern 16 may extend into the shallow device isolation portion STI. The second dielectric pattern 12 may be interposed between the buried dielectric pattern 16 and the shallow device isolation portion STI. In an embodiment, the first dielectric pattern 22 and the second dielectric pattern 12 may be interposed between the buried dielectric pattern 16 and the shallow device isolation portion STI.

On each pixel area PX, a transfer gate TG may be provided on the first surface 100A of the substrate 100. For example, a portion of the transfer gate TG may be buried in the substrate 100. The transfer gate TG may be a vertical type. Alternatively, the transfer gate TG may be a planar type that is flat on the first surface 100A of the substrate 100.

A gate dielectric pattern GI may be interposed between the transfer gate TG and the substrate 100. A floating diffusion region (not shown) may be provided in the substrate 100, while being adjacent to one side of the transfer gate TG. For example, the floating diffusion region (not shown) may be implanted with impurities having the second conductivity type.

According to some embodiments of the present disclosure, light may pass through the first surface 100A of the substrate 100 to enter the substrate 100. Electron-hole pairs may be created from the incident light at the PN junction. These created electrons may move toward the photoelectric conversion element PD. When a voltage is applied to the transfer gate TG, the electrons may move to the floating diffusion region (not shown).

An interlayer dielectric layer ILD may be provided on and cover or overlap the second surface 100B of the substrate 100. The interlayer dielectric layer ILD may be a multiple layer structure including at least one selected from a silicon oxide layer, a silicon nitride layer, a silicon oxynitride layer, a porous low-k dielectric layer, and a combination thereof. The interlayer dielectric layer ILD may be provided with wiring lines 60 therein. The floating diffusion region (not shown) may be connected to the wiring lines 60.

A fixed charge layer 42 may be provided on and cover or overlap the first surface 100A of the substrate 100. The fixed charge layer 42 may be a single or multiple layer structure including at least one selected from a metal oxide layer whose oxygen ratio is less than a stoichiometric ratio, a metal fluoride layer whose fluorine ratio is less than a stoichiometric ratio, or a combination thereof. The fixed charge layer may thus have a negative fixed charge. For example, the fixed charge layer 42 may include a metal oxide layer or a metal fluoride layer including at least one selected from hafnium (Hf), zirconium (Zr), aluminum (Al), tantalum (Ta), titanium (Ti), yttrium (Y), lanthanide, and any combination thereof. The fixed charge layer 42 may suppress or reduce dark current and white spots.

A protection layer 44 may be stacked on the fixed charge layer 42. The protection layer 44 may include at least one selected from silicon oxide (SiO), silicon carboxide (SiOC), silicon nitride (SiN), and any combination thereof. The protection layer 44 may serve as an antireflection layer and a planarization layer.

Light-shield patterns 48 may be disposed on the protection layer 44. Low-refractive patterns 50 may be correspondingly disposed on the light-shield patterns 48. The light-shield pattern 48 and the low-refractive pattern 50 may overlap the device isolation pattern PI, and may have a grid shape when viewed in plan. The light-shield pattern 48 may include, for example, titanium. The low-refractive pattern 50 may have the same thickness and include organic material. The low-refractive pattern 50 may have a refractive index less than that of color filters CF1 and CF2 which will be discussed below. The light-shield pattern 48 and the low-refractive pattern 50 may prevent crosstalk between neighboring pixel areas PX.

Color filters CF1 and CF2 may be disposed between the low-refractive patterns 50. The color filters CF1 and CF2 may each have one of blue, green, and red colors. Alternatively, the color filters CF1 and CF2 may have different colors such as cyan, magenta, or yellow. In an image sensor according to the present embodiment, the color filters CF1 and CF2 may be arranged as a Bayer pattern. Alternatively, the color filters CF1 and CF2 may be arranged as one of a 2×2 Tetra pattern, a 3×3 Nona pattern, and a 4×4 Hexadeca pattern.

Microlenses ML may be disposed on the color filters CF1 and CF2. The microlenses ML may have edges in contact with and connected to each other.

Referring back to FIG. 4B, the device isolation pattern PI and the shallow device isolation portion STI are on the intervening region IR.

The second surface 100B of the substrate 100 may be located at the same level as that of a bottom surface 12BS of the second dielectric pattern 12. The first device isolation portion DTI may be defined between the level of the bottom surface 12BS of the second dielectric pattern 12 and a level of a top surface 12TS of the second dielectric pattern 12. The second device isolation portion ETI may be defined between the level of the top surface 12TS of the second dielectric pattern 12 and a level of a top surface 22TS of the first dielectric pattern 22.

The second dielectric pattern 12 may be interposed between the buried dielectric pattern 16 and the shallow device isolation portion STI.

The first dielectric pattern 22 may have a width IRWE1 that is less than a width IRW12 of the second dielectric pattern 12. The conductive liner 14 may have a width IRW14 that is greater than the width IRWE1 of the first dielectric pattern 22. The width IRW14 of the conductive liner 14 may be less than the width IRW12 of the second dielectric pattern 12.

The buried dielectric pattern 16 may have a top surface 16TS at a level higher than that of a top surface 32TS of the first isolation portion 32 included in the shallow device isolation portion STI (e.g., the top surface 16TS extends from the second surface 100B of the substrate 100 by a greater distance in the first direction D1 than the top surface 32TS extends from the second surface 100B of the substrate 100).

In the intervening region IR, a sidewall of the first dielectric pattern 22 may be in contact with the conductive liner 14. The second dielectric pattern 12 may be in contact with a top surface and a sidewall of the conductive liner 14. The top surface 16TS of the buried dielectric pattern 16 may be in contact with the conductive liner 14 and the first dielectric pattern 22. The conductive liner 14 may have a top surface 14TS at a level lower than that of the top surface 12TS of the second dielectric pattern 12 (e.g., the top surface 12TS extends from the second surface 100B of the substrate 100 by a greater distance in the first direction D1 than the top surface 14TS extends from the second surface 100B of the substrate 100).

In the intervening region IR, the first device isolation portion DTI may be provided therein with one or more dielectric materials and one or more conductive materials, and the second device isolation portion ETI may be provided therein either with one or more dielectric materials or with one or more dielectric materials and one or more conductive materials.

Referring back to FIG. 4D, the device isolation pattern PI and the shallow device isolation portion STI are on the crossing region CR.

The second surface 100B of the substrate 100 may be located at the same level as that of the bottom surface 12BS of the second dielectric pattern 12. The first device isolation portion DTI may be defined between the level of the bottom surface 12BS of the second dielectric pattern 12 and the level of the top surface 12TS of the second dielectric pattern 12. The second device isolation portion ETI may be defined between the level of the top surface 12TS of the second dielectric pattern 12 and the level of the top surface 22TS of the first dielectric pattern 22.

The buried conductive pattern 18 may have a bottom surface 18BS that is coplanar with a bottom surface 14BS of the conductive liner 14. The bottom surface 18BS of the buried conductive pattern 18 may be located at the same level as that of the bottom surface 14BS of the conductive liner 14 (e.g., the bottom surface 18BS and the bottom surface 14BS extend from the second surface 100B of the substrate 100 by a same distance).

The conductive liner 14 may be disposed between the second dielectric pattern 12 and the buried conductive pattern 18. The top surface 14TS of the conductive liner 14 may be in contact with the second dielectric pattern 12. The conductive liner 14 may have a sidewall in contact with the second dielectric pattern 12, the buried conductive pattern 18, and the first dielectric pattern 22. The top surface 14TS of the conductive liner 14 may be located at a level lower than that of the top surface 12TS of the second dielectric pattern 12. The top surface 14TS of the conductive liner 14 may be located at a level higher than that of a top surface 18TS of the buried conductive pattern 18. The top surface 12TS of the second dielectric pattern 12 may be located at a level higher than that of the top surface 18TS of the buried conductive pattern 18. The top surface 18TS of the buried conductive pattern 18 may be in contact with the first dielectric pattern 22.

The first dielectric pattern 22 may have a width CRWE1 that is the same as a width CRW18 of the buried conductive pattern 18. The second dielectric pattern 12 may have a width CRW12 that is greater than a width CRW14 of the conductive liner 14. The width CRW14 of the conductive liner 14 may be greater than the width CRW18 of the buried conductive pattern 18.

FIGS. 5A to 14B illustrate cross-sectional views taken along lines A-A' and B-B' of FIG. 3, showing a method of fabricating an image sensor according to some embodiments of the present disclosure. With reference to FIGS. 5A to 14B, the following will discuss a method of fabricating the image sensor discussed with reference to FIGS. 3 to 4D. For brevity of description, a repetitive description will be omitted.

Figure 5A:
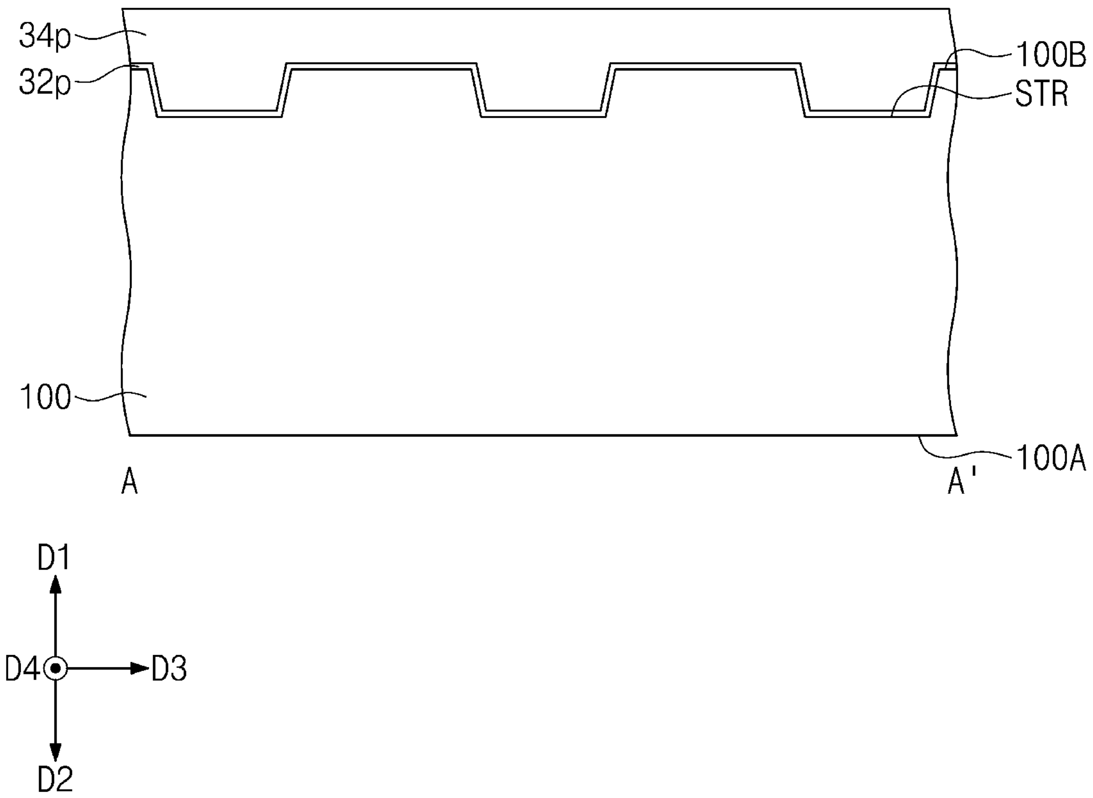
FIGS. 5A, 5B, 6A, 6B, 7A, 7B, 8A, 8B, 9A, 9B, 10A, 10B, 11A, 11B, 12A, 12B, 13A, 13B, 14A, and 14B illustrate cross-sectional views taken along lines A-A' and B-B' of FIG. 3 and of a method of fabricating an image sensor according to some embodiments of the present disclosure.
Figure 5B:
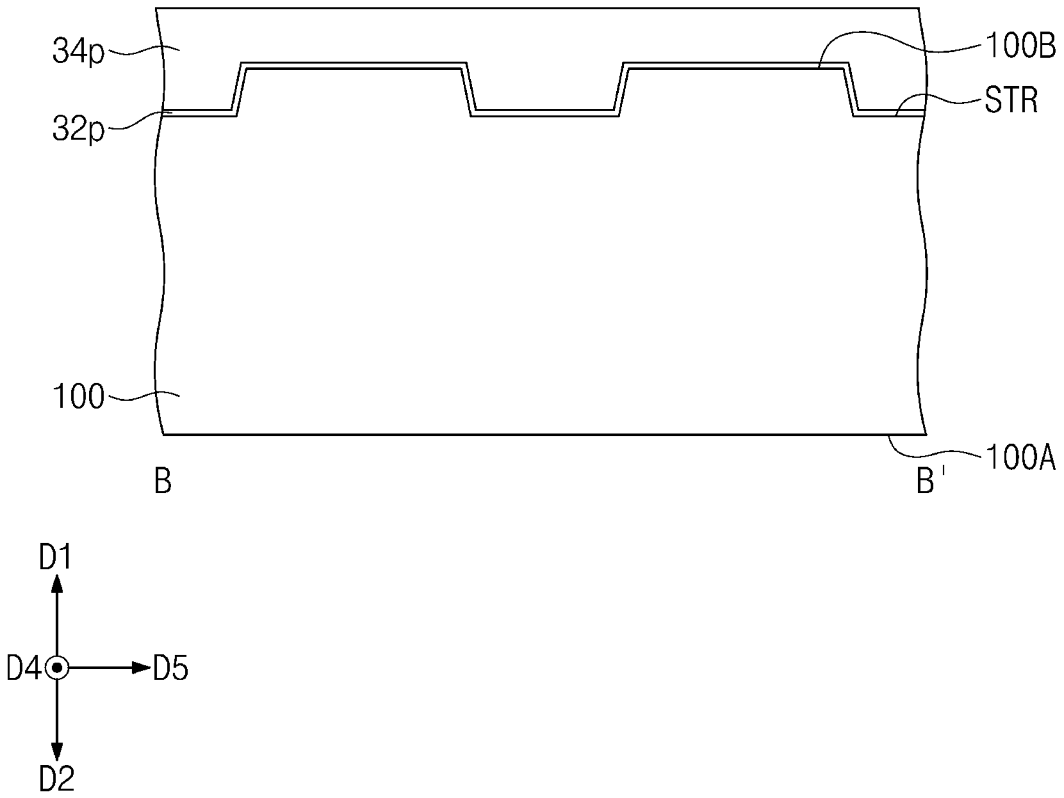

Referring to FIGS. 5A and 5B, a substrate 100 may be prepared. A shallow device isolation trench STR may be formed that is recessed into the substrate 100 from a second surface 100B of the substrate 100. The formation of the shallow device isolation trench STR may include forming a mask pattern on a first surface 100A of the substrate 100, and using the mask pattern as an etching mask to etch the substrate 100. A portion of the mask pattern may remain or may not remain through the etching process.

A first isolation layer 32*p* may be formed to cover or overlap an inner wall of the shallow device isolation trench STR and the second surface 100B of the substrate 100. The first isolation layer 32*p* may be the mask pattern that remains after the etching process for forming the shallow device isolation trench STR. A second isolation layer 34*p* may be formed in an unoccupied portion of the device isolation trench STR and to cover or overlap the second surface 100B of the substrate 100. The first isolation layer 32*p* and the second isolation layer 34*p* may independently include at least one selected from silicon oxide (SiO), silicon nitride (SiN), silicon carbonitride (SiCN), silicon oxycarbonitride (SiCON), and any combination thereof.

Figure 6A:
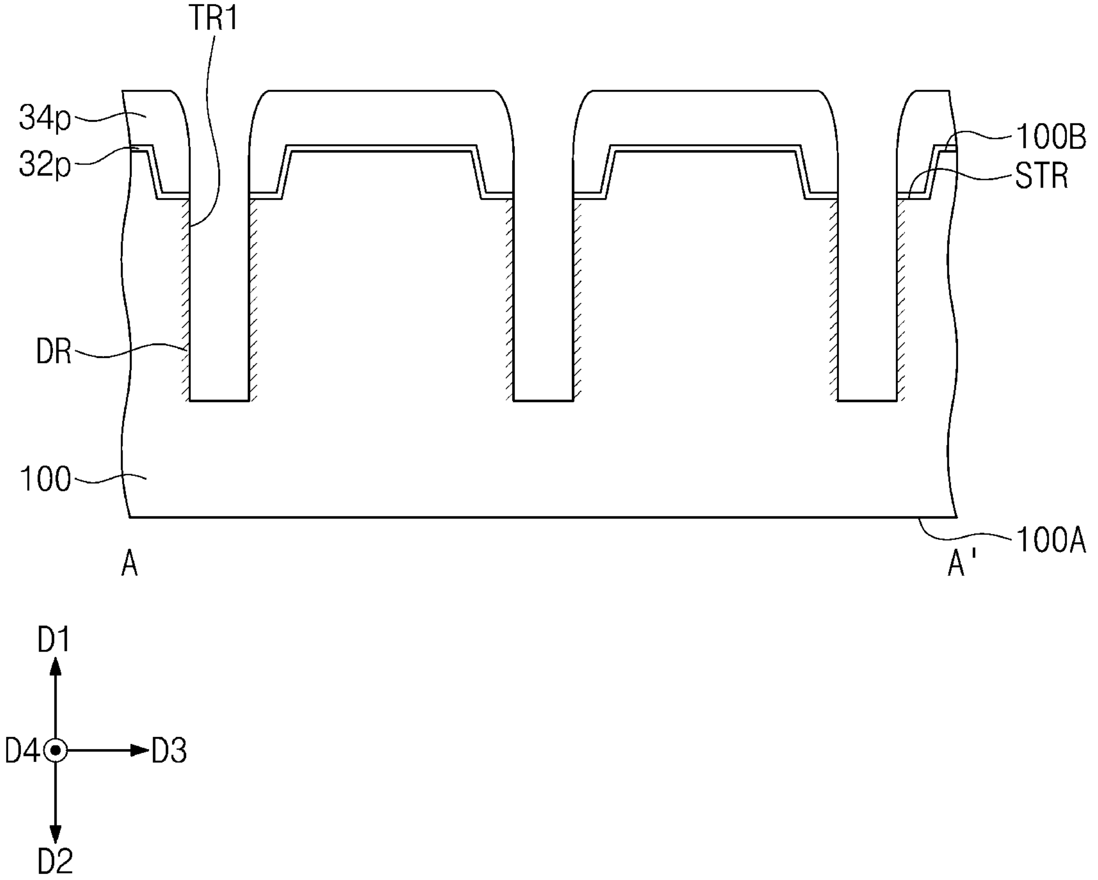
Figure 6B:
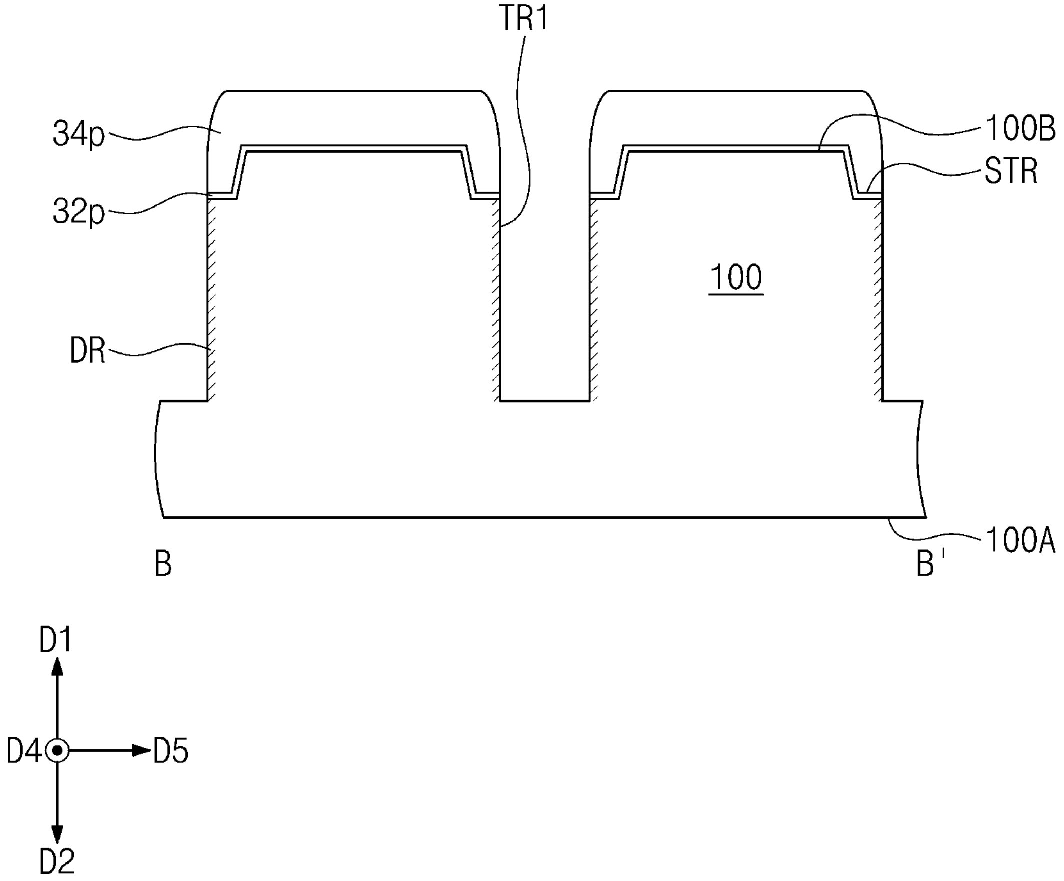

Referring to FIGS. 6A and 6B, a first trench TR1 may be formed to extend into the first isolation layer 32*p*, the second isolation layer 34*p*, and a portion of the substrate 100. When viewed in plan, the first trench TR1 may have a mesh shape in which lines extending in a third direction D3 intersect lines extending in a fourth direction D4. The first trench TR1 may expose an inside of the substrate 100. The first trench TR1 may limit a position of a pixel area (see PX of FIG. 3). The first trench TR1 on an intervening region (see IR of FIG. 3) may be less than that of the first trench TR1 on a crossing region (see CR of FIG. 3).

A doping region DR may be formed along an inner wall of the first trench TR1. The doping region DR may be formed by, for example, a boron doping along the inner wall of the first trench TR1.

Figure 7A:
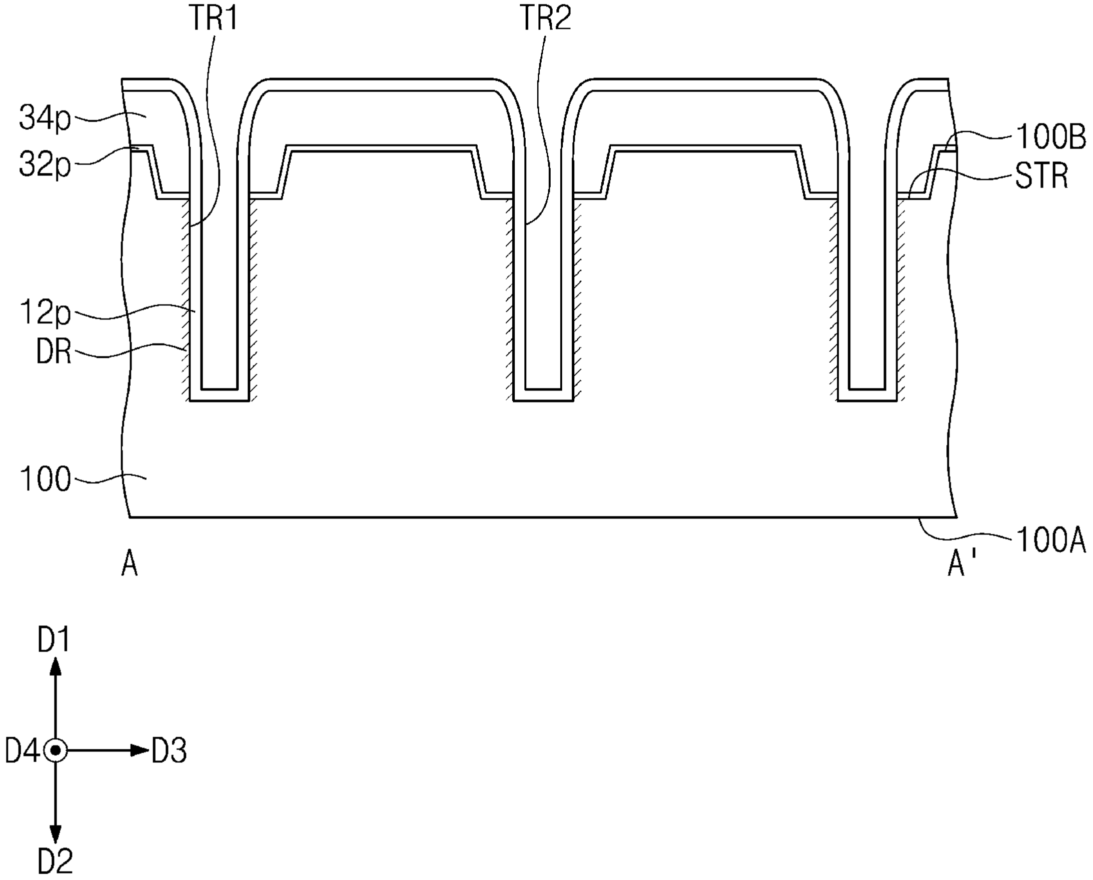
Figure 7B:
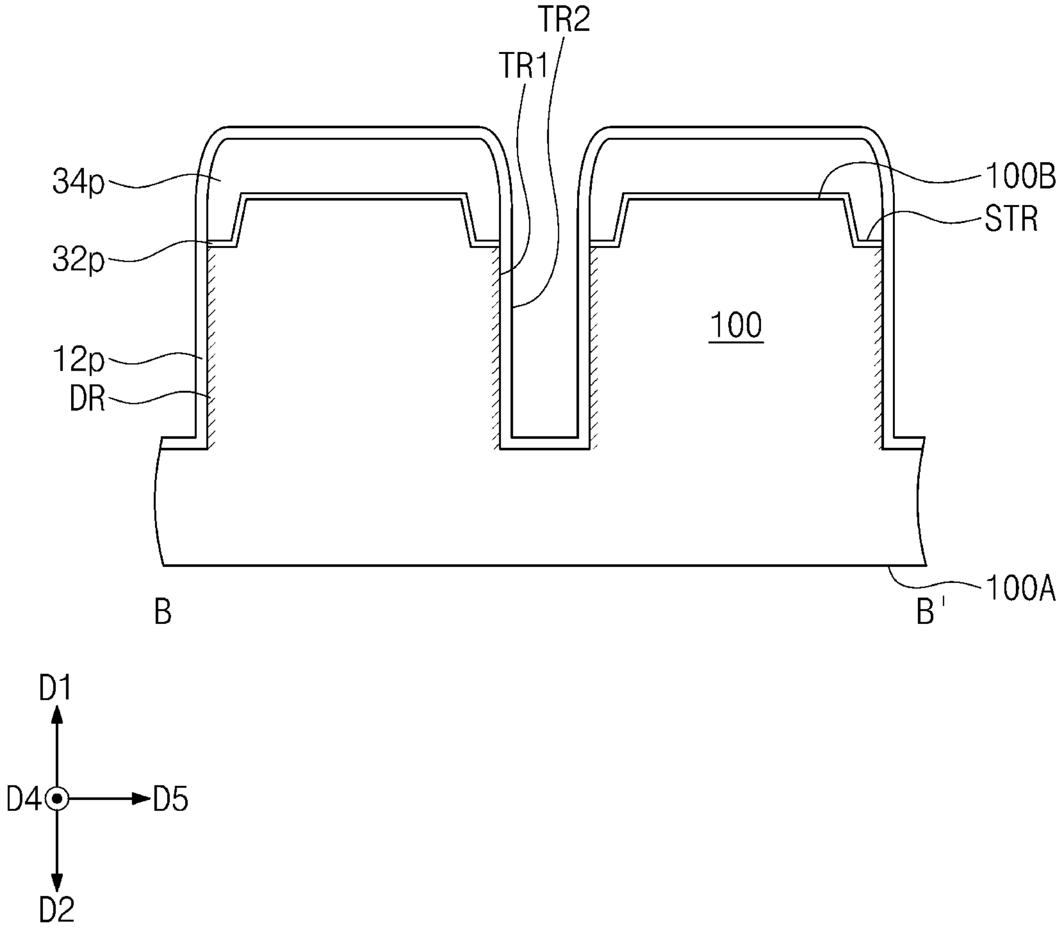

Referring to FIGS. 7A and 7B, a dielectric liner layer 12*p* may be formed on the second surface 100B of the substrate 100. The dielectric liner layer 12*p* may conformally cover or overlap the inner wall of the first trench TR1. The dielectric liner layer 12*p* may be formed in a portion of the first trench TR1. The dielectric liner layer 12*p* may include silicon oxide (SiO). For example, the dielectric liner layer 12*p* may further include a material other than silicon oxide, such as silicon nitride (SiN), silicon carbonitride (SiCN), or silicon oxycarbonitride (SiCON). The dielectric liner layer 12*p* may be a single layer or a multiple layer structure including two or more layers. A second trench TR2 may be formed while the dielectric liner layer 12*p* conformally covers or overlaps the inner wall of the first trench TR1.

Figure 8A:
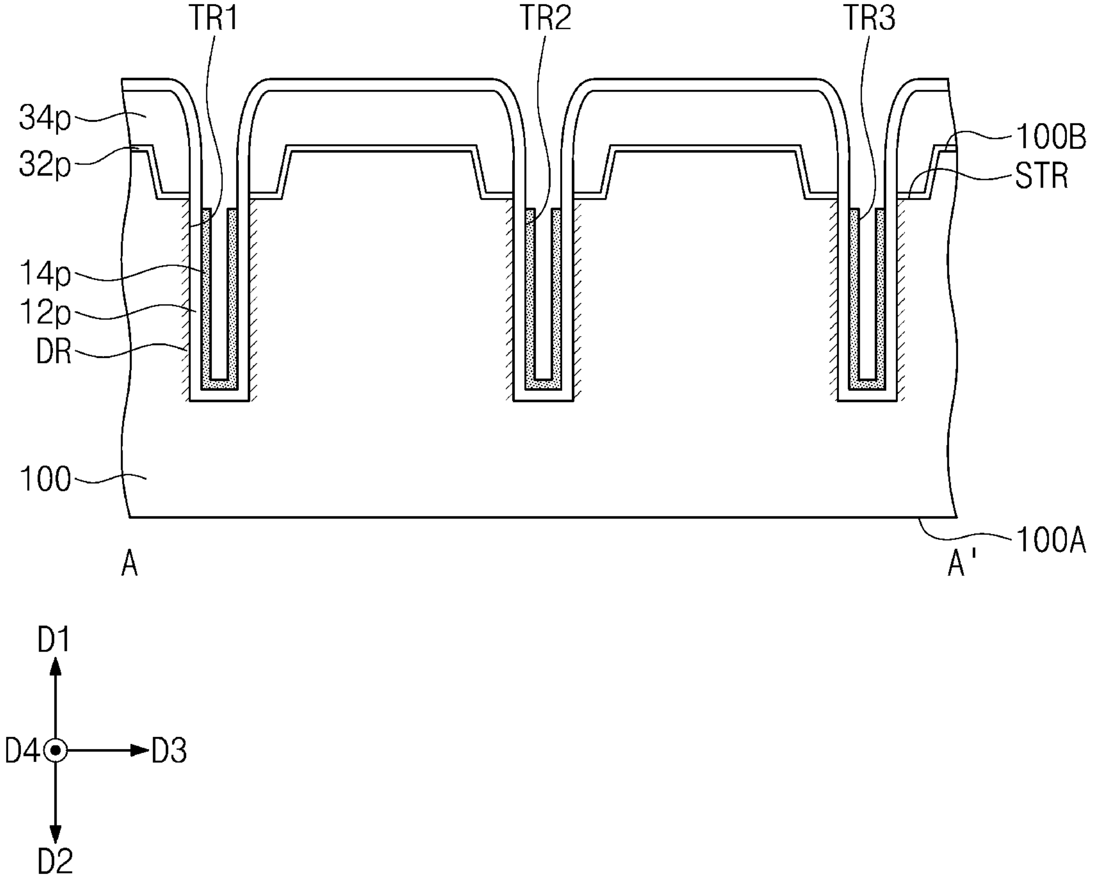
Figure 8B:
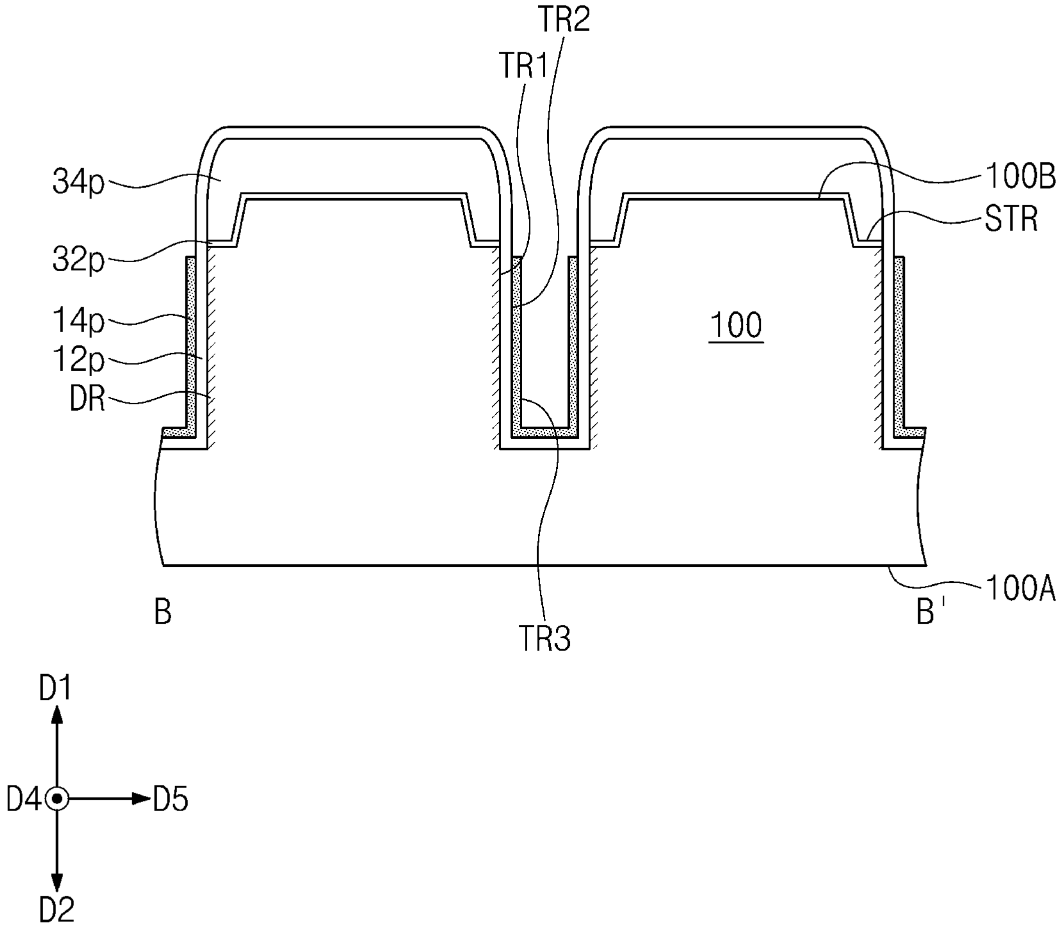

Referring to FIGS. 8A and 8B, a preliminary conductive liner 14*p* may conformally cover or overlap an inner wall of the second trench TR2. The preliminary conductive liner 14*p* may conformally cover or overlap a bottom surface of the second trench TR2 and may also conformally cover or overlap a sidewall of the second trench TR2. The preliminary conductive liner 14*p* on the sidewall of the second trench TR2 may extend to a level the same as a top surface of a conductive liner 14, which will be formed below. The formation of the preliminary conductive liner 14*p* may form a third trench TR3.

Figure 9A:
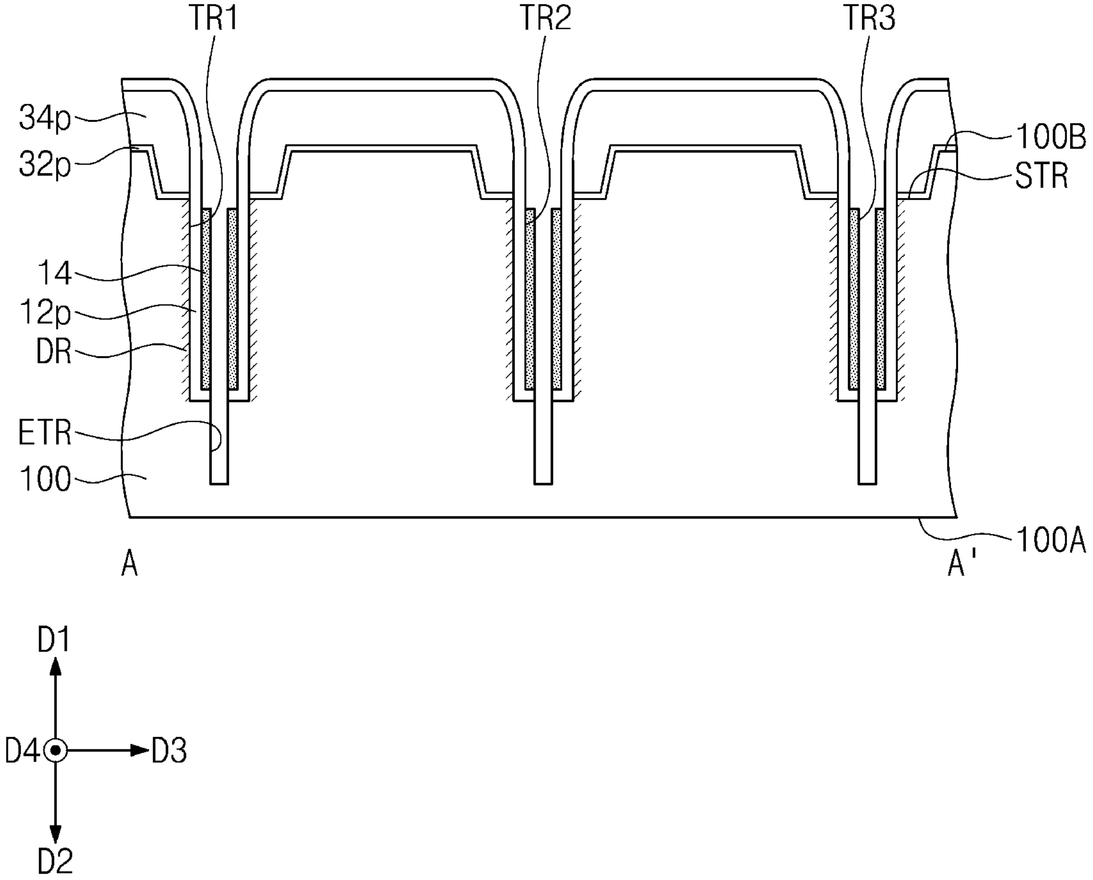
Figure 9B:
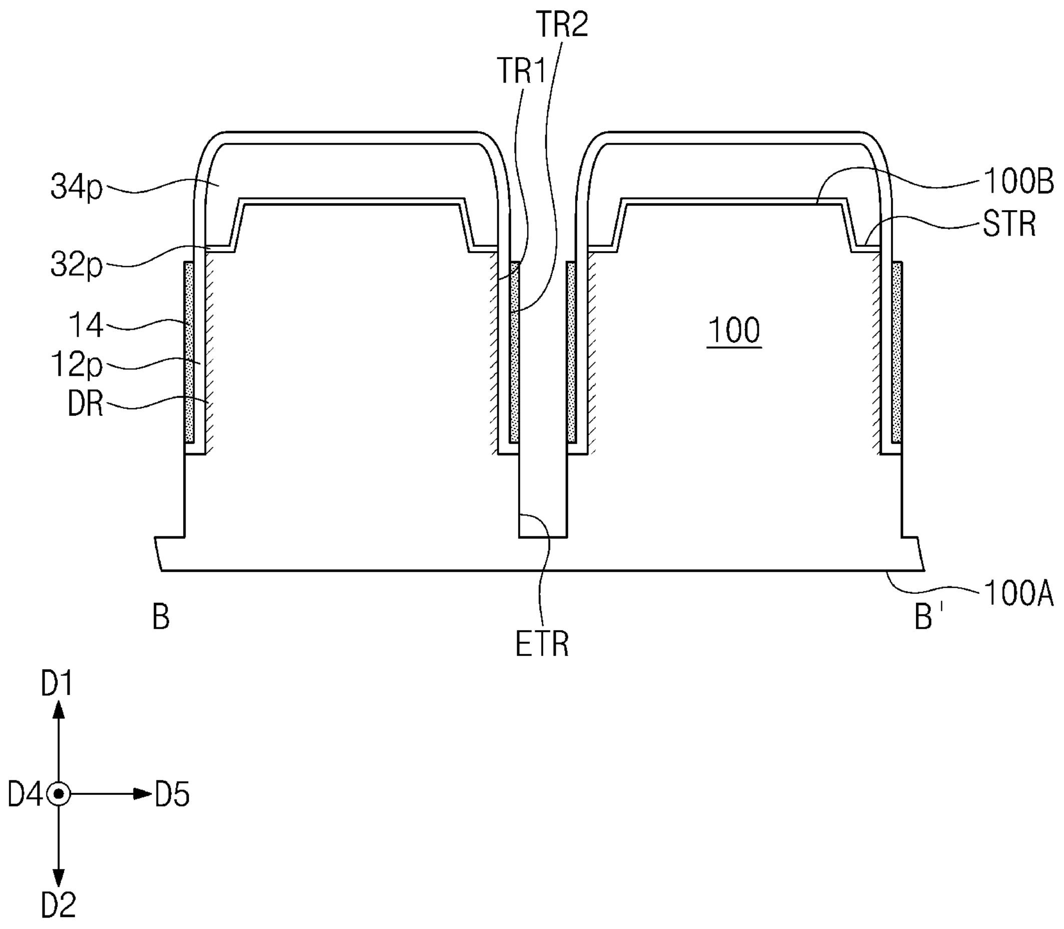

Referring to FIGS. 9A and 9B, an extension trench ETR may be formed to extend into the preliminary conductive liner 14*p*, the dielectric liner layer 12*p*, and a portion of the substrate 100. The extension trench ETR may expose the preliminary conductive liner 14*p*, the dielectric liner layer 12*p*, and a portion of the substrate 100. A portion of the preliminary conductive liner 14*p* may be removed while the extension trench ETR is formed. A conductive liner 14 may be formed.

Figure 10A:
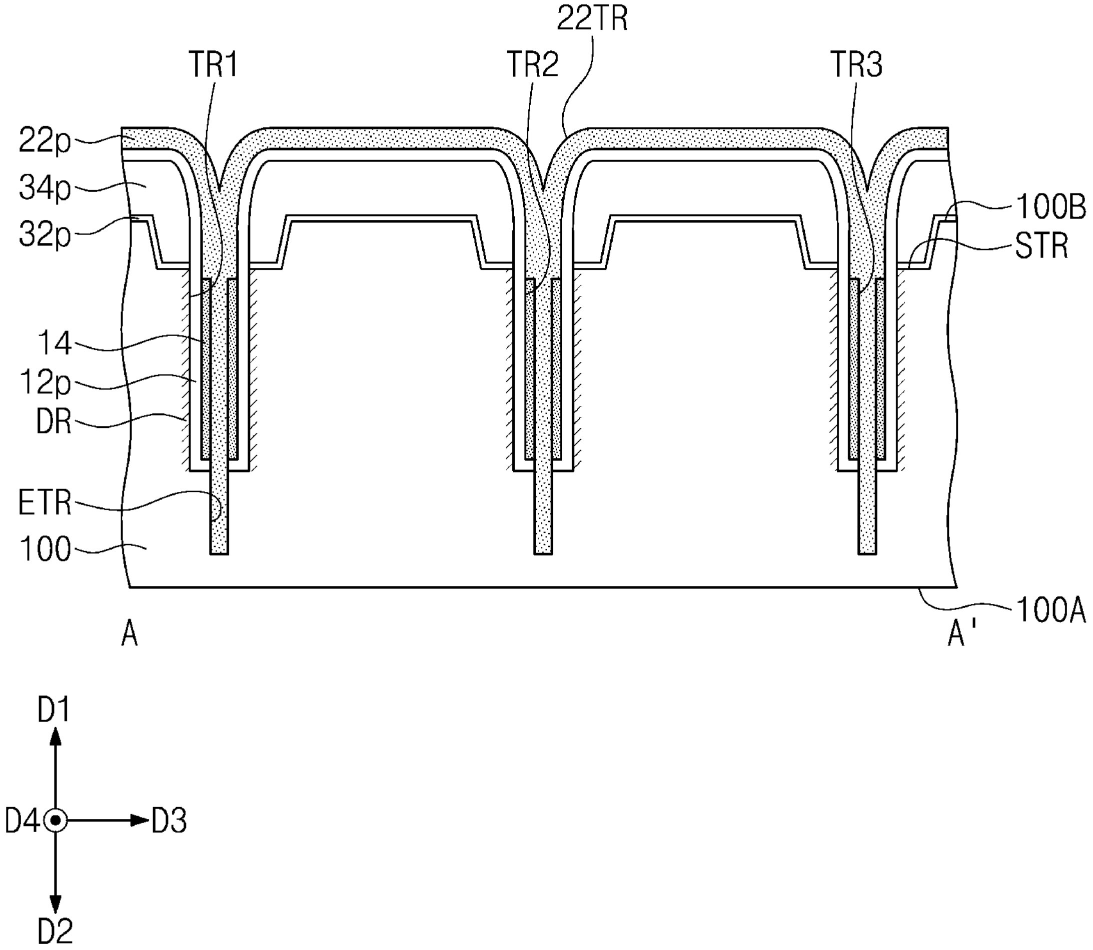
Figure 10B:
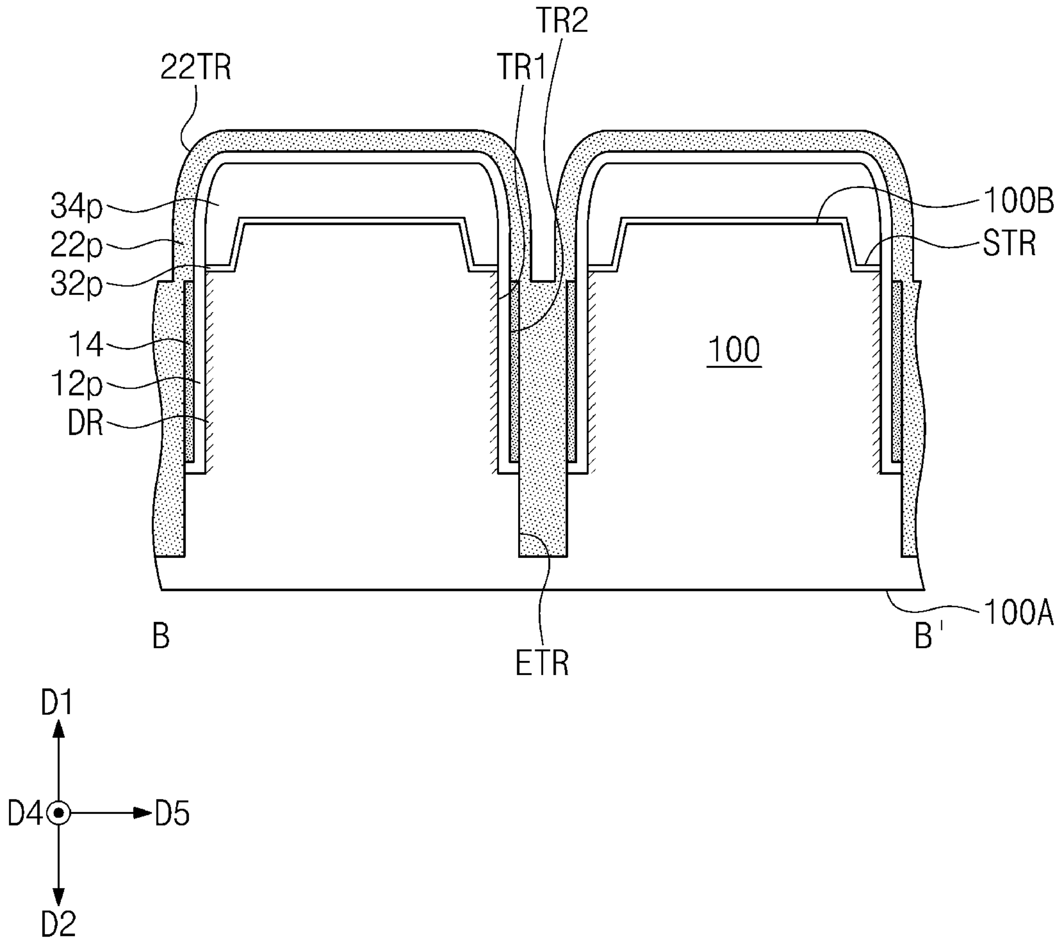

Referring to FIGS. 10A and 10B, a preliminary first dielectric pattern 22*p* may be formed in the extension trench ETR, the third trench TR3, and a portion of the second trench TR2. The preliminary first dielectric pattern 22*p* may be in the extension trench ETR and the third trench TR3. The preliminary first dielectric pattern 22*p* may be conformally on the second trench TR2, and thus a preliminary dielectric pattern trench 22TR.

Figure 11A:
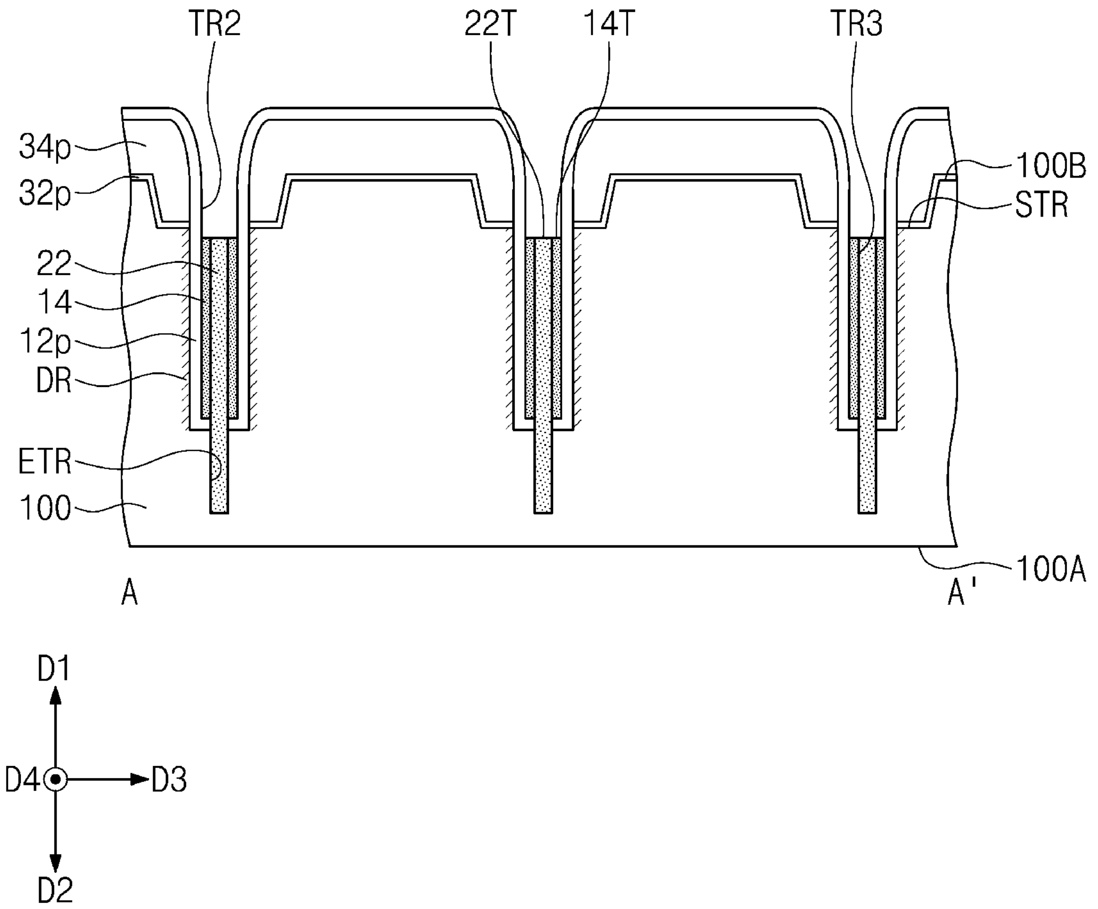
Figure 11B:
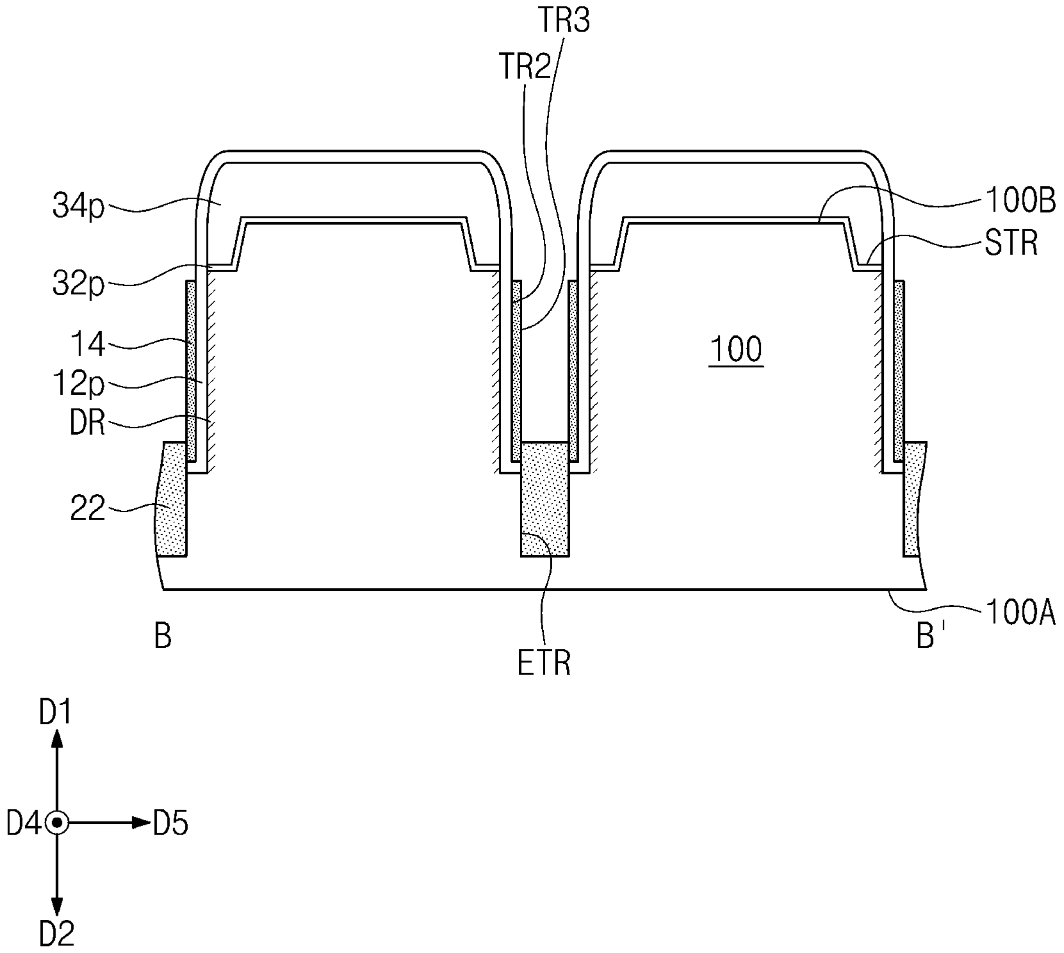

Referring to FIGS. 11A and 11B, an upper portion of the preliminary first dielectric pattern 22*p* may be removed.

In the intervening region IR, the removal of the upper portion of the preliminary first dielectric pattern 22*p* may include removing the preliminary first dielectric pattern 22*p* until a top surface of the conductive liner 14 is exposed. In the crossing region CR, the removal of the upper portion of the preliminary first dielectric pattern 22*p* may include removing the preliminary first dielectric pattern 22*p* to expose a boundary between a buried conductive pattern 18 and a first dielectric pattern 22, which will be formed below and boundary thereof is defined between the top and bottom surfaces of the conductive liner 14.

The removal of the upper portion of the preliminary first dielectric pattern 22*p* may include performing an etch-back process on the preliminary first dielectric pattern 22*p*. A first dielectric pattern 22 may include the preliminary first dielectric pattern 22*p* that remains after the removal process. The removal of the upper portion of the preliminary first dielectric pattern 22*p* may expose a portion of a sidewall of the second trench TR2 on the intervening region IR, and may also expose the third trench TR3 and a portion of a sidewall of the second trench TR2 on the crossing region CR.

Figure 12A:
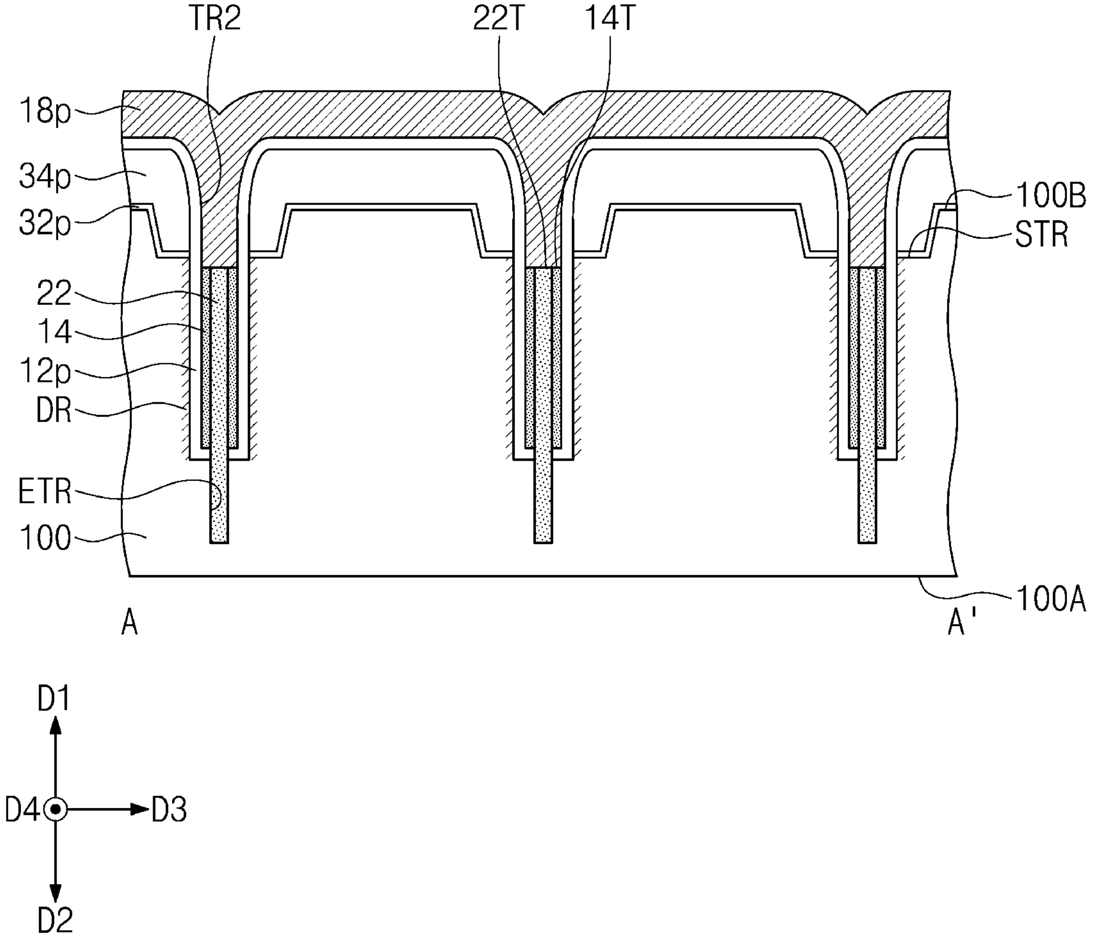
Figure 12B:
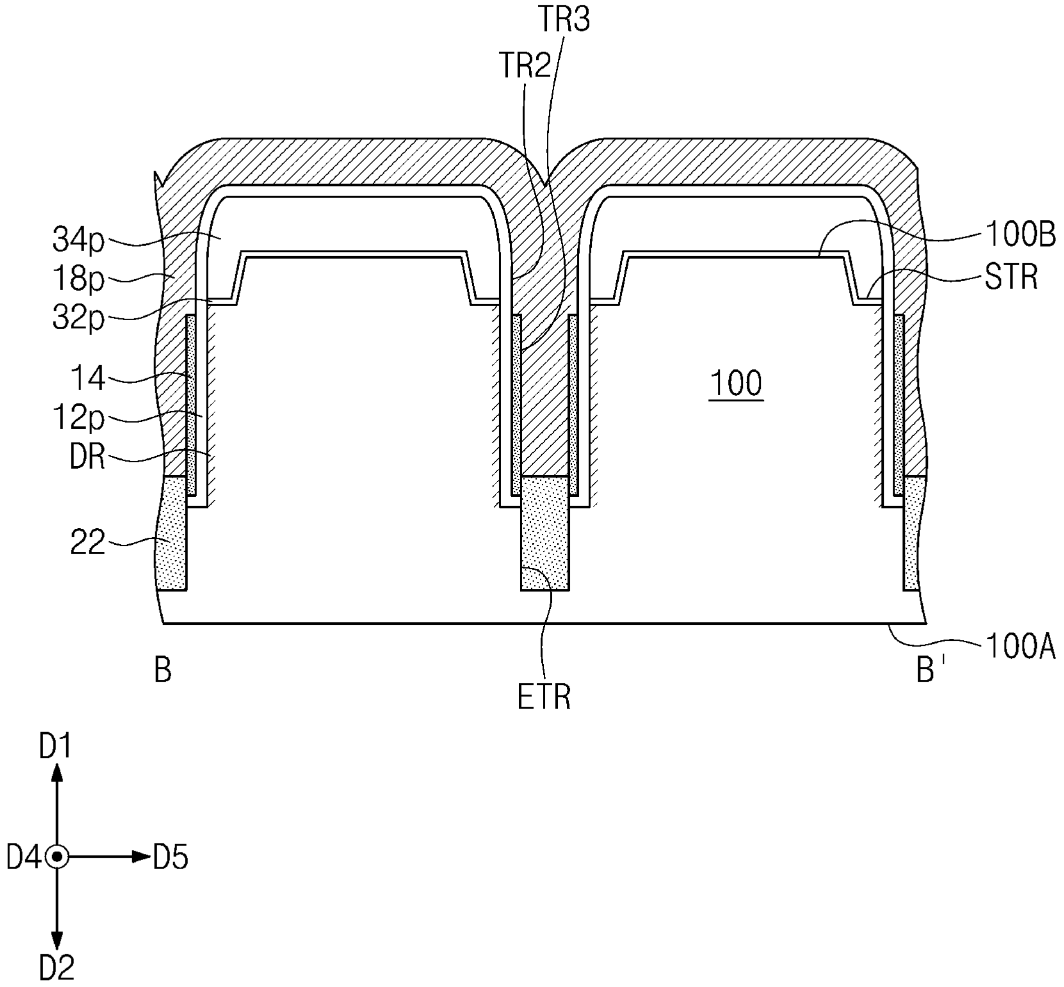

Referring to FIGS. 12A and 12B, a preliminary buried conductive pattern 18*p* may be formed on the first dielectric pattern 22 and the conductive liner 14. The preliminary buried conductive pattern 18*p* may be formed to conformally cover or overlap the exposed portion of the second trench TR2.

In the intervening region IR, the preliminary buried conductive pattern 18*p* may be formed to cover or overlap a top surface 14T of the conductive liner 14 and a top surface 22T of the first dielectric pattern 22. In the crossing region CR, the preliminary buried conductive pattern 18*p* may be formed in the third trench TR3 and to conformally cover or overlap the exposed portion of the second trench TR2. In the crossing region CR, the preliminary buried conductive pattern 18*p* may be formed to cover or overlap the first dielectric pattern 22.

Figure 13A:
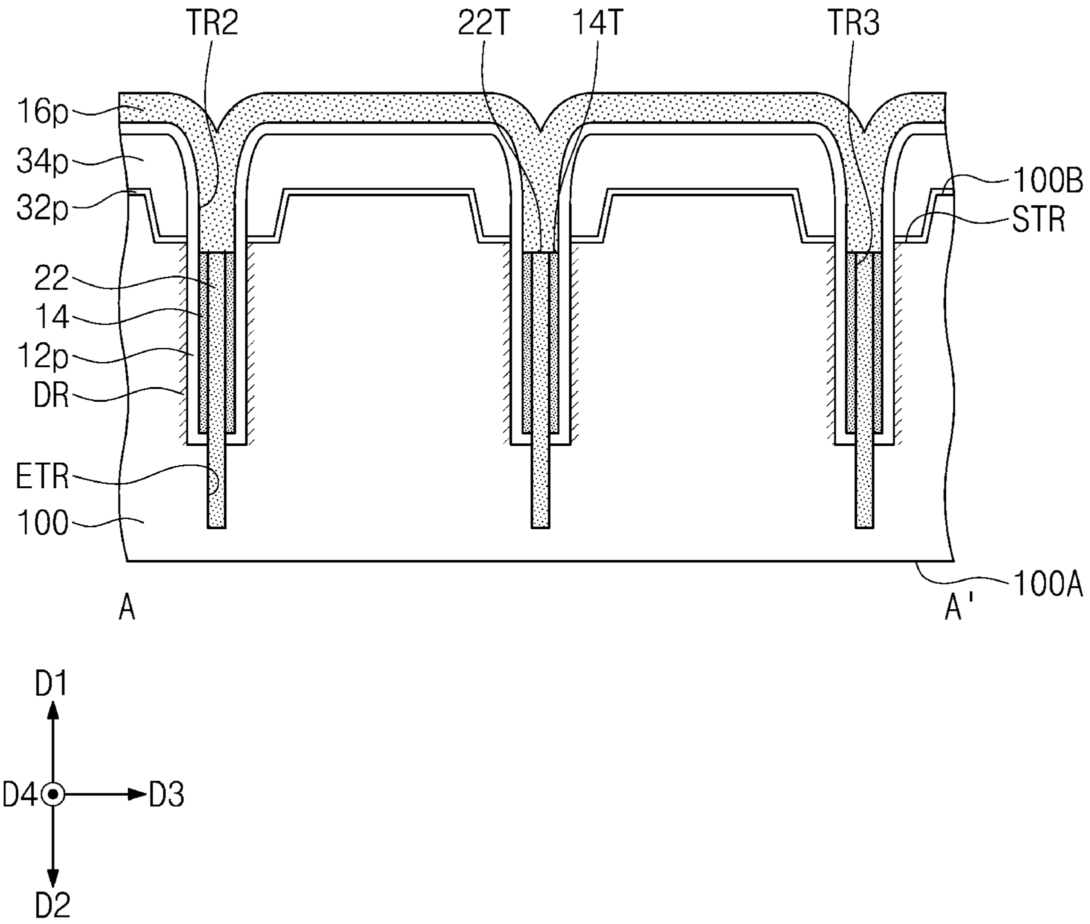
Figure 13B:
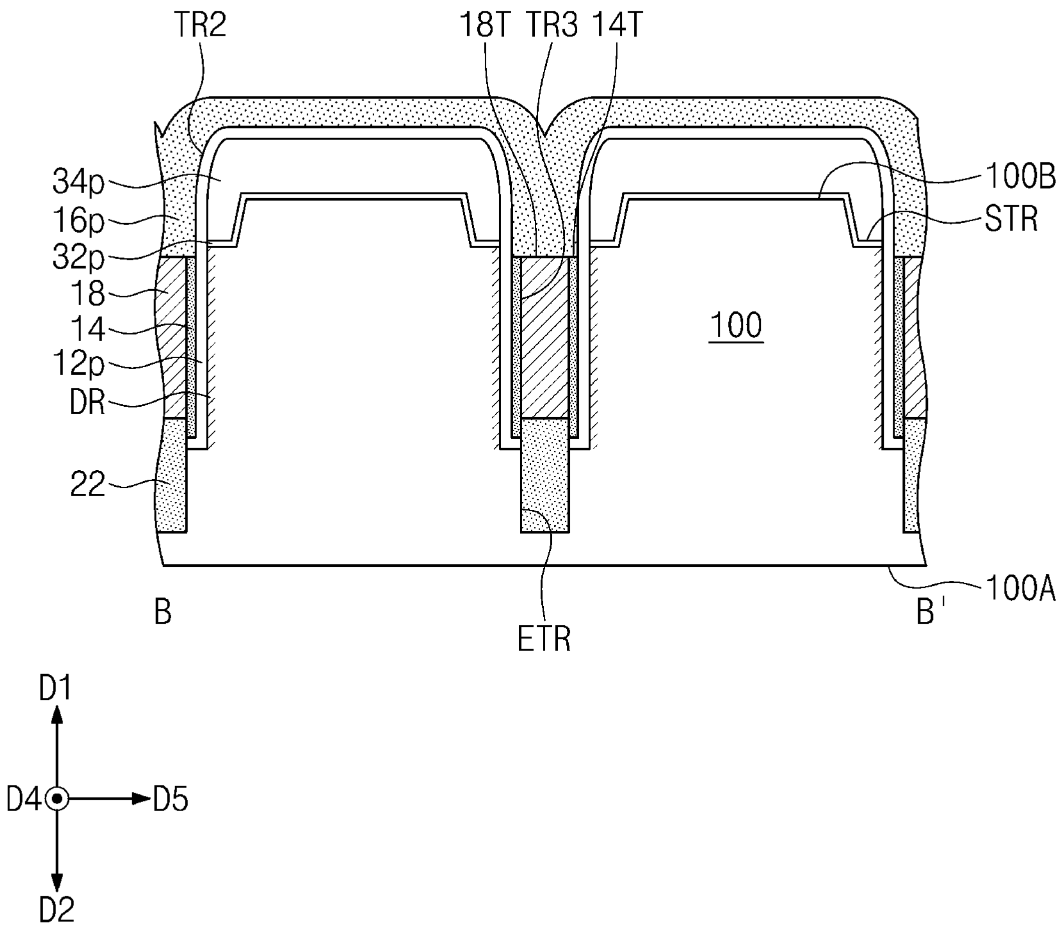

Referring to FIGS. 13A and 13B, the preliminary buried conductive pattern 18*p* may be removed in the intervening region IR, and an upper portion of the preliminary buried conductive pattern 18*p* may be removed in the crossing region CR. The removal of the upper portion of the preliminary buried conductive pattern 18*p* in the crossing region CR may include removing the preliminary buried conductive pattern 18*p* until the top surface 14T of the conductive liner 14 is exposed. The preliminary buried conductive pattern 18*p* may be formed in the third trench TR3. After the removal process, a portion of the second trench TR2 may be exposed. A buried conductive pattern 18 may include the preliminary buried conductive pattern 18*p* that remains after the removal process.

A preliminary buried dielectric pattern 16*p* may be formed on the first dielectric pattern 22 and the conductive liner 14 on the intervening region IR and on the conductive liner 14 and the buried conductive pattern 18 in the crossing region CR. In the crossing region CR, the preliminary buried dielectric pattern 16*p* may be formed to cover or overlap the top surface 18T of the buried conductive pattern 18 and the top surface 14T of the conductive liner 14. The preliminary buried dielectric pattern 16*p* may be formed to conformally cover or overlap the exposed portion of the second trench TR2. According to some embodiments, an annealing process may be additionally performed after the formation of the preliminary buried dielectric pattern 16*p*.

Figure 14A:
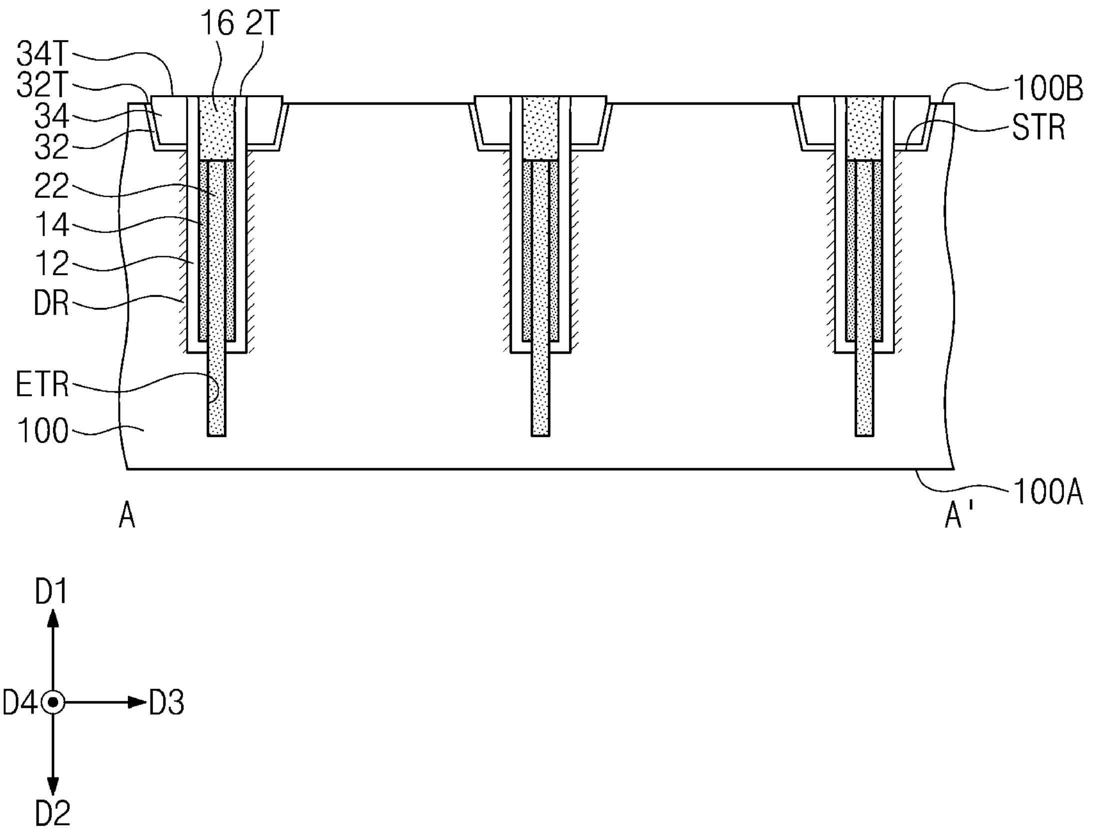
Figure 14B:
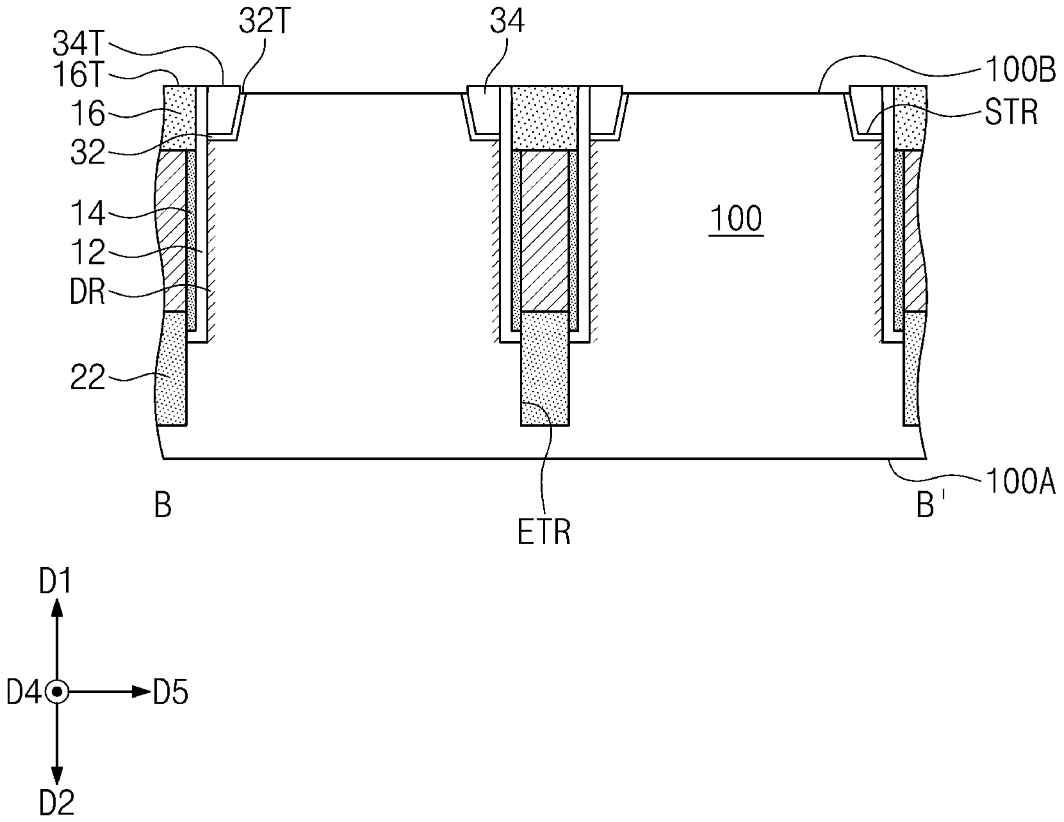

Referring to FIGS. 14A and 14B, a planarization process may be performed. The planarization process may include a chemical mechanical polishing (CMP) process. The planarization process may remove an upper portion of the dielectric liner layer 12*p*, an upper portion of the preliminary buried dielectric pattern 16*p*, and an upper portion of the second isolation layer 34*p*, thereby forming a second dielectric pattern 12, a buried dielectric pattern 16, and a second isolation portion 34. The planarization process may expose a top surface 34T of the second isolation portion 34, a top surface 12T of the second dielectric pattern 12, and a top surface 16T of the buried dielectric pattern 16. In addition, during the planarization process, a portion of the first isolation layer 32*p* may be exposed, and may serve as a polish stop layer. A remaining first isolation layer 32*p* may constitute a first isolation portion 32, and the planarization process may reveal a top surface 32T of the first isolation portion 32.

Figure 15A:
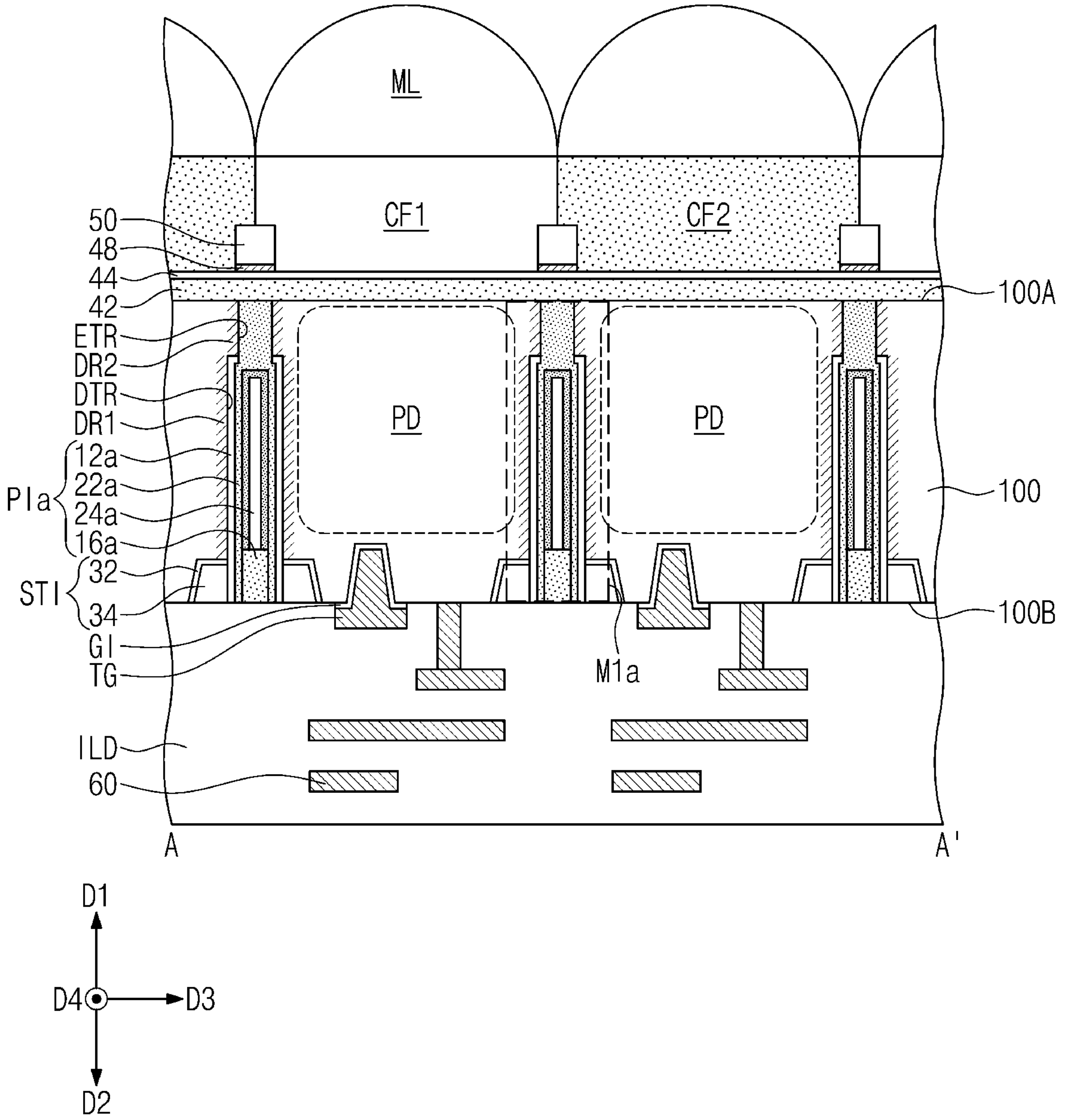
FIG. 15A illustrates a cross-sectional view taken along line A-A' of FIG. 3 and of an image sensor according to some embodiments of the present disclosure.
Figure 15B:
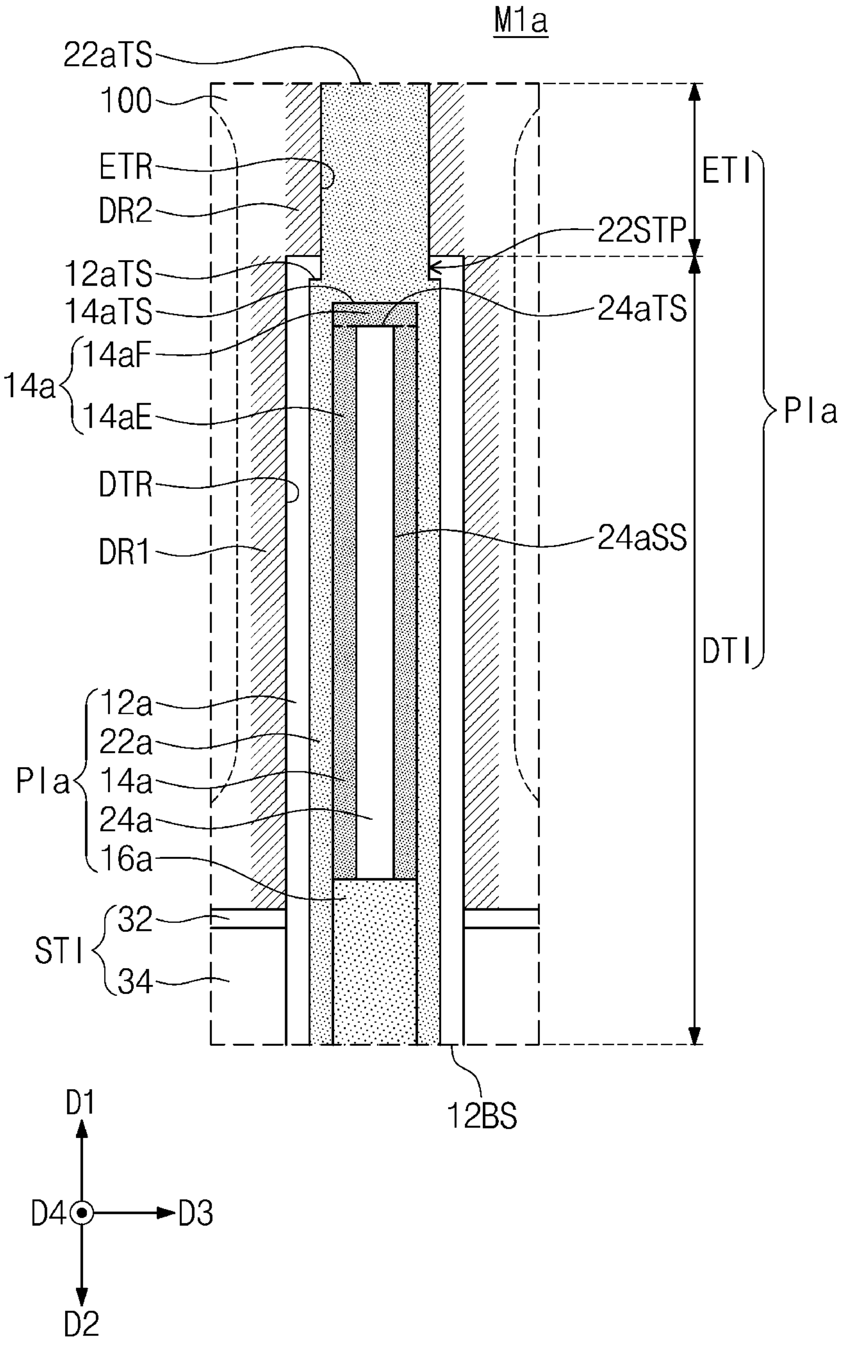
FIG. 15B illustrates an enlarged view showing section M1*a* of FIG. 15A.
Figure 15C:
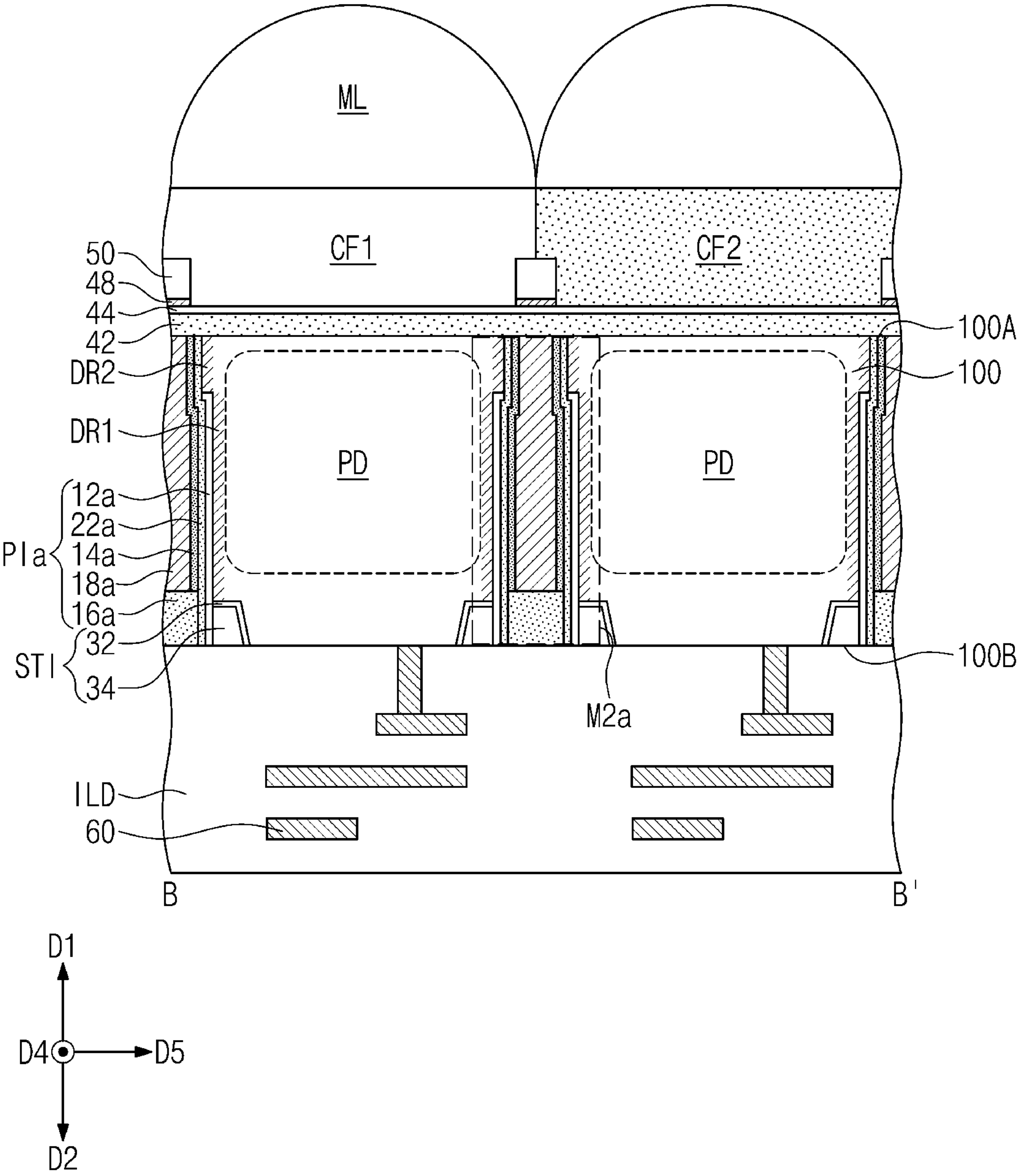
FIG. 15C illustrates a cross-sectional view taken along line B-B' of FIG. 3 and of an image sensor according to some embodiments of the present disclosure.
Figure 15D:
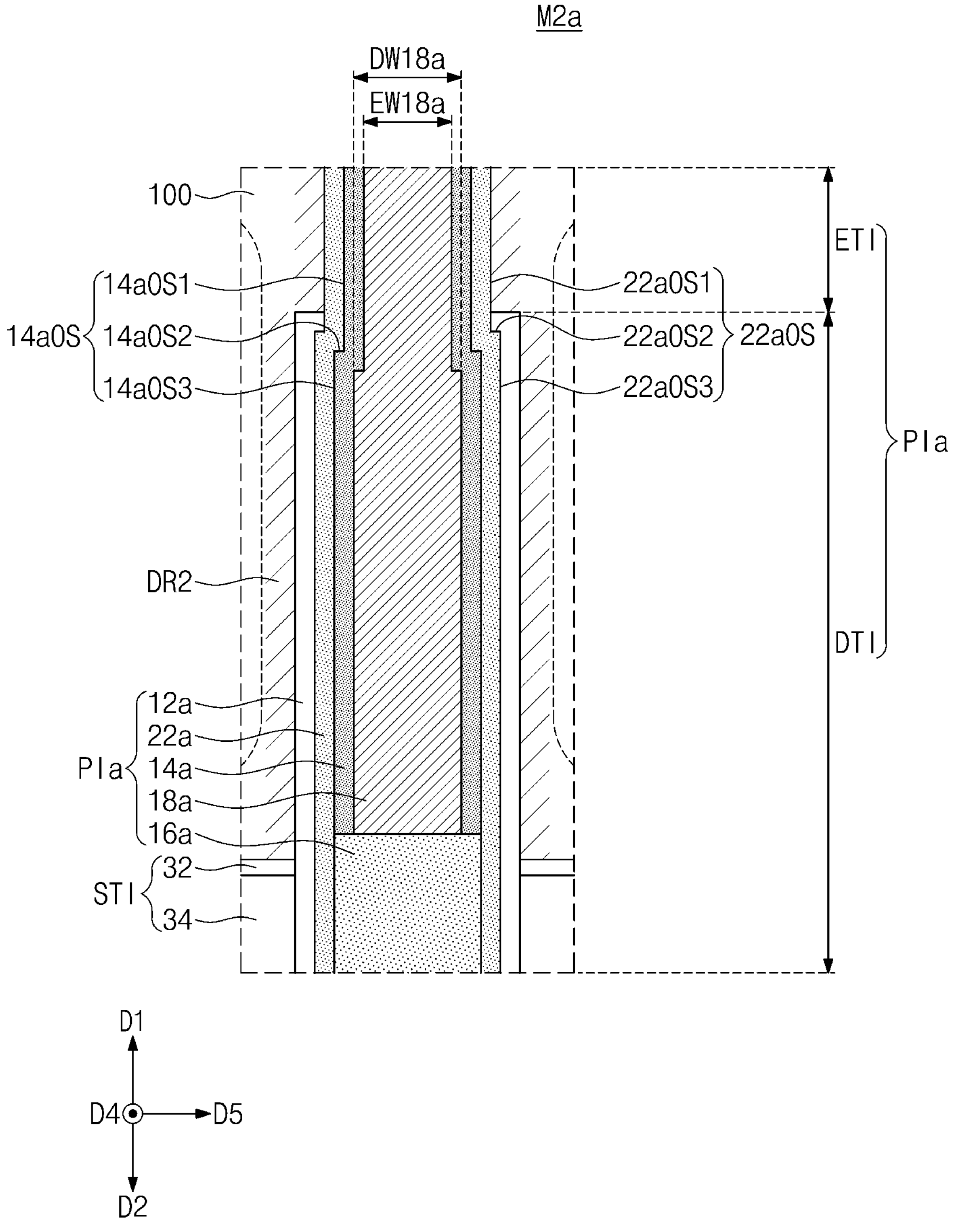
FIG. 15D illustrates an enlarged view showing section M2*a* of FIG. 15C.

FIG. 15A illustrates a cross-sectional view taken along line A-A' of FIG. 3, showing an image sensor according to some embodiments of the present disclosure. FIG. 15B illustrates an enlarged view showing section M1*a* of FIG. 15A. FIG. 15C illustrates a cross-sectional view taken along line B-B' of FIG. 3 and of an image sensor according to some embodiments of the present disclosure. FIG. 15D illustrates an enlarged view showing section M2*a* of FIG. 15C. For brevity of description, a repetitive description will be omitted.

Referring to FIGS. 3, 15A, and 15B, there are illustrated in detail a device isolation pattern PIa and a shallow device isolation portion STI on the intervening region IR.

The device isolation pattern PIa may be provided on the intervening region IR. In the intervening region IR, the device isolation pattern PIa may include an intervening dielectric pattern 24*a*, a conductive liner 14*a* on the intervening dielectric pattern 24*a*, a first dielectric pattern 22*a* on the conductive liner 14*a*, a second dielectric pattern 12*a* on the first dielectric pattern 22*a*, and a buried dielectric pattern 16*a* in contact with the first dielectric pattern 22*a*.

The shallow device isolation portion STI may include a first isolation portion 32 and a second isolation portion 34. The first isolation portion 32 and the second isolation portion 34 may be in contact with the second dielectric pattern 12*a*.

The device isolation pattern PIa may be formed to fill the extension trench ETR and the deep trench DTR. The device isolation pattern PIa may include a first device isolation portion DTI and a second device isolation portion ETI.

The first device isolation portion DTI may be defined between a level of a bottom surface 12BS of the second dielectric pattern 12*a* and a level of a top surface 12*a*TS of the second dielectric pattern 12*a*. The second device isolation portion ETI may be defined between the level of the top surface 12*a*TS of the second dielectric pattern 12*a* and a level of a top surface 22*a*TS of the first dielectric pattern 22.

In the first device isolation portion DTI, the device isolation pattern PIa may include the intervening dielectric pattern 24*a*, the conductive liner 14*a*, the first dielectric pattern 22*a*, the second dielectric pattern 12*a*, and the buried dielectric pattern 16*a*. In the second device isolation portion ETI, the device isolation pattern PIa may include the first dielectric pattern 22*a*.

The first dielectric pattern 22*a* may extend from the first device isolation portion DTI to the second device isolation portion ETI.

A portion adjacent to the deep trench DTR of the substrate 100 may be doped to form a first doping region DR1. The first doping region DR1 may be, for example, doped with boron. A portion adjacent to the extension trench ETR of the substrate 100 may be doped with to form a second doping region DR2. The second doping region DR2 may be, for example, doped with boron. The first doping region DR1 may be in contact with the second dielectric pattern 12*a*. The second doping region DR2 may be in contact with the first dielectric pattern 22*a*.

The conductive liner 14*a* may have a top surface 14*a*TS at a level lower than that of the top surface 12*a*TS of the second dielectric pattern 12*a*.

The first dielectric pattern 22*a* may have a first dielectric step difference 22STP. The first dielectric step difference 22STP may have, for example, a stepwise shape. The first dielectric step difference 22STP may be defined to indicate, for example, a stepwise shape between the top surface 14*a*TS of the conductive liner 14*a* and the top surface 12*a*TS of the second dielectric pattern 12*a*.

The conductive liner 14*a* may at least partially surround a lateral surface 24*a*SS and a top surface 24*a*TS of the intervening dielectric pattern 24*a*.

The conductive liner 14*a* may include a flat conductive portion 14*a*F and an extension conductive portion 14*a*E. The flat conductive portion 14*a*F may be parallel to the substrate 100. The flat conductive portion 14*a*F may extend in the third direction D3 parallel to an extending direction of the substrate 100. The extension conductive portion 14*a*E may extend in the first direction D1 that intersects an extending direction of the substrate 100. The extension conductive portion 14*a*E may extend from the flat conductive portion 14*a*F toward the second surface 100B of the substrate 100. The top surface 24*a*TS of the intervening dielectric pattern 24*a* may be in contact with flat conductive portion 14*a*F. The lateral surface 24*a*SS of the intervening dielectric pattern 24*a* may be in contact with the extension conductive portion 14*a*E. The extension conductive portion 14*a*E may be interposed between the intervening dielectric pattern 24*a* and the first dielectric pattern 22*a*.

Referring to FIGS. 3, 15C, and 15D, there are illustrated in detail the device isolation pattern PIa and the shallow device isolation portion STI on the crossing region CR.

On the crossing region CR, the device isolation pattern PIa may be provided. In the crossing region CR, the device isolation pattern PIa may include a buried conductive pattern

18*a*, a conductive liner 14*a* on the buried conductive pattern 18*a*, a first dielectric pattern 22*a* on the conductive liner 14*a*, a second dielectric pattern 12*a* on the first dielectric pattern 22*a*, and a buried dielectric pattern 16*a* on the first dielectric pattern 22*a*.

The shallow device isolation portion STI may be disposed adjacent to the second surface 100B of the substrate 100. The shallow device isolation portion STI may include a first isolation portion 32 and a second isolation portion 34. The first isolation portion 32 and the second isolation portion 34 may be in contact with the second dielectric pattern 12*a*.

The device isolation pattern PIa may be formed to fill the extension trench ETR and the deep trench DTR. The device isolation pattern PIa may include a first device isolation portion DTI and a second device isolation portion ETI.

The first device isolation portion DTI may be defined between the level of the bottom surface 12BS of the second dielectric pattern 12*a* and the level of the top surface 12*a*TS of the second dielectric pattern 12*a*. The second device isolation portion ETI may be defined between the level of the top surface 12*a*TS of the second dielectric pattern 12*a* and the level of the top surface 22*a*TS of the first dielectric pattern 22.

In the first device isolation portion DTI, the device isolation pattern PIa may include the buried conductive pattern 18*a*, the conductive liner 14*a*, the first dielectric pattern 22*a*, the second dielectric pattern 12*a*, and the buried dielectric pattern 16*a*. In the second device isolation portion ETI, the device isolation pattern PIa may include the first dielectric pattern 22*a*, the conductive liner 14*a*, and the buried conductive pattern 18*a*.

The first dielectric pattern 22*a*, the conductive liner 14*a*, and the buried conductive pattern 18*a* may extend from the first device isolation portion DTI to the second device isolation portion ETI.

A width EW18*a* of the buried conductive pattern 18*a* in the first device isolation portion DTI may be less than a width DW18*a* of the buried conductive pattern 18*a* in the second device isolation portion ETI.

The conductive liner 14*a* may have a liner outer surface 14*a*OS in contact with the first dielectric pattern 22*a*. The liner outer surface 14*a*OS may include a first liner outer surface 14*a*OS1, a second liner outer surface 14*a*OS2 in contact with the first liner outer surface 14*a*OS1, and a third liner outer surface 14*a*OS3 in contact with the second liner outer surface 14*a*OS2. The first liner outer surface 14*a*OS1 may be spaced apart from the third liner outer surface 14*a*OS3 and may extend in the first direction D1, and the second liner outer surface 14*a*OS3 may extend in the second direction D2 that intersects the first direction D1.

The first dielectric pattern 22*a* may include a pattern outer surface 22*a*OS in contact with the substrate 100 and the second dielectric pattern 12*a*. The pattern outer surface 22*a*OS may include a first pattern outer surface 22*a*OS1, a second pattern outer surface 22*a*OS2 in contact with the first pattern outer surface 22*a*OS1, and a third pattern outer surface 22*a*OS3. The first pattern outer surface 22*a*OS1 may be spaced apart from the third pattern outer surface 22*a*OS3.

The first pattern outer surface 22*a*OS1 may be in contact with the substrate 100 and the second dielectric pattern 12*a*. The second pattern outer surface 22*a*OS2 and the third pattern outer surface 22*a*OS3 may be in contact with the second dielectric pattern 12*a*.

FIGS. 16A to 25B illustrate cross-sectional views taken along lines A-A' and B-B' of FIG. 3 and of a method of fabricating an image sensor according to some embodiments of the present disclosure. For brevity of description, a repetitive description will be omitted.

Figure 16A:
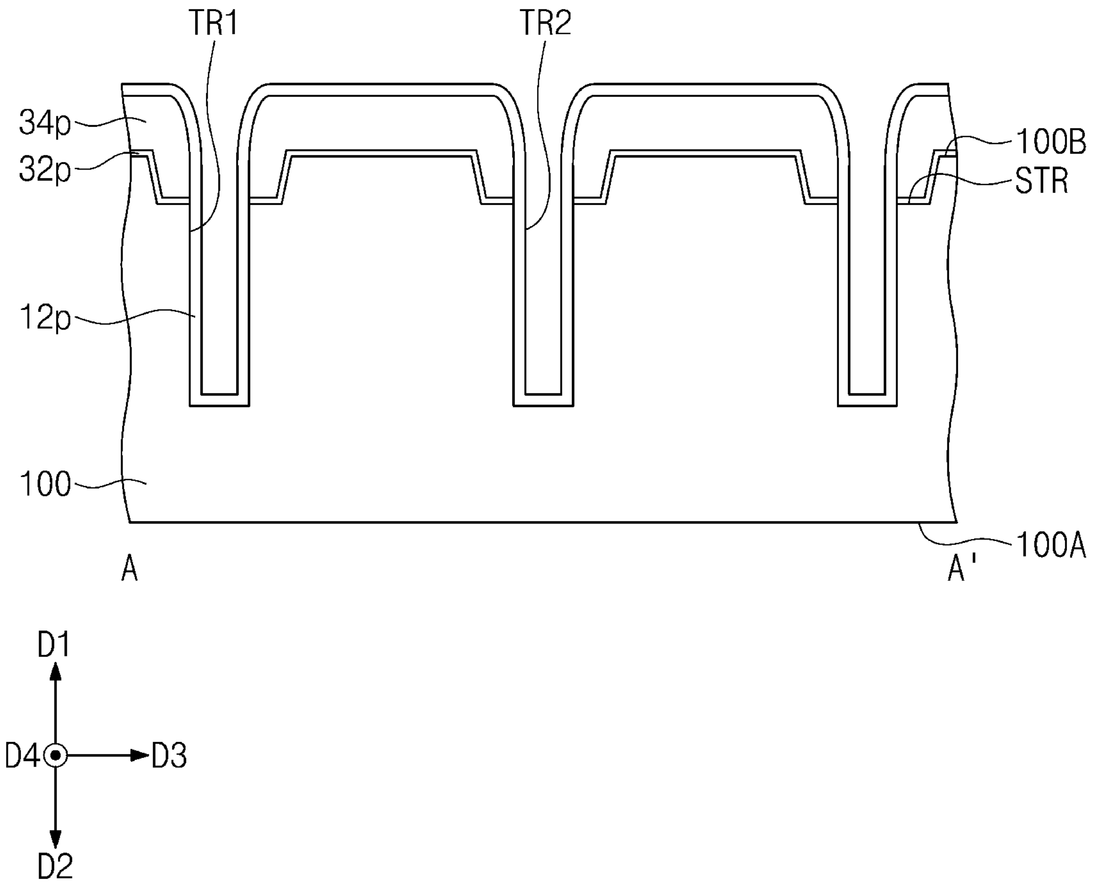
FIGS. 16A, 16B, 17A, 17B, 18A, 18B, 19A, 19B, 20A, 20B, 21A, 21B, 22A, 22B, 23A, 23B, 24A, 24B, 25A, and 25B illustrate cross-sectional views taken along lines A-A' and B-B' of FIG. 3 and of a method of fabricating an image sensor according to some embodiments of the present disclosure.
Figure 16B:
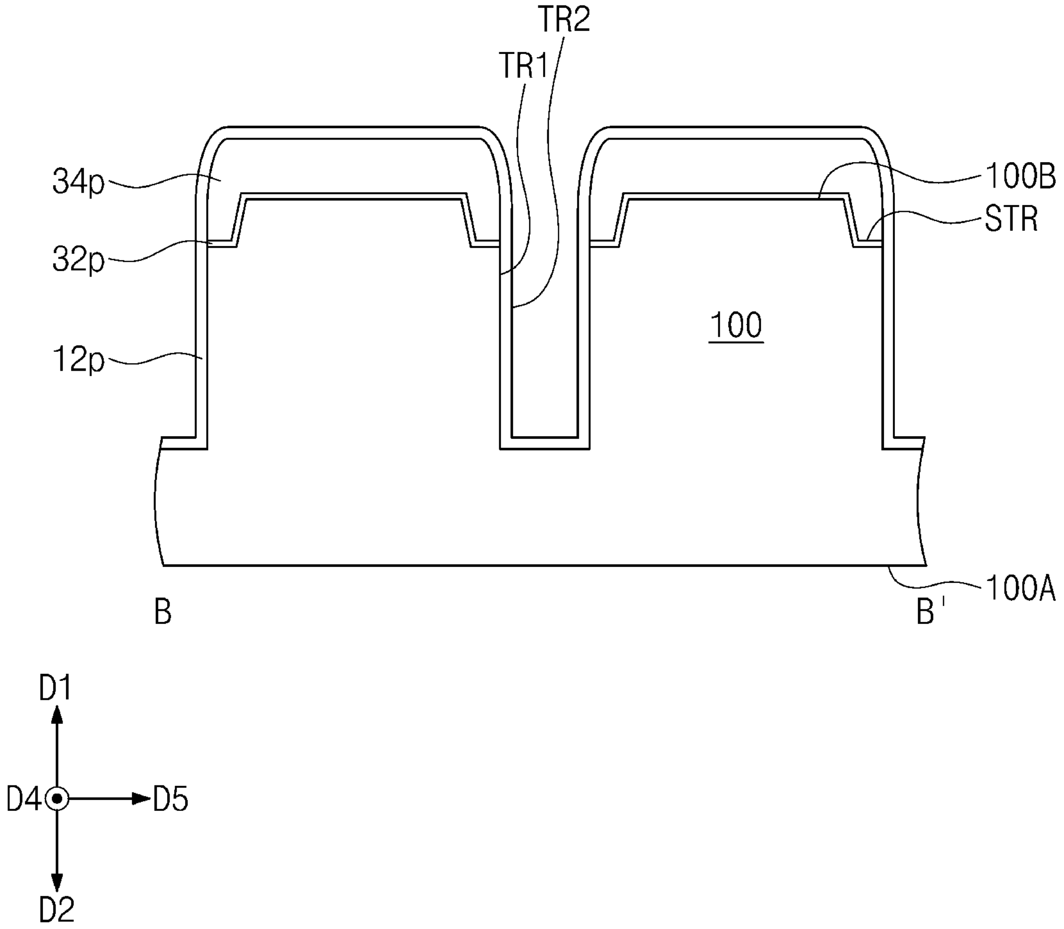

Referring to FIGS. 16A and 16B, there may be formed a substrate 100, a first trench TR1, a dielectric liner layer 12*p* that conformally covers or overlaps the first trench TR1, a second trench TR2, a first isolation layer 32*p*, and a second isolation layer 34*p*.

A shallow device isolation trench STR, the first isolation layer 32*p*, and the second isolation layer 34*p* may be formed on the substrate 100, and then the first trench TR1 may be formed. The dielectric liner layer 12*p* may be formed to conformally cover or overlap an inner wall of the first trench TR1.

Figure 17A:
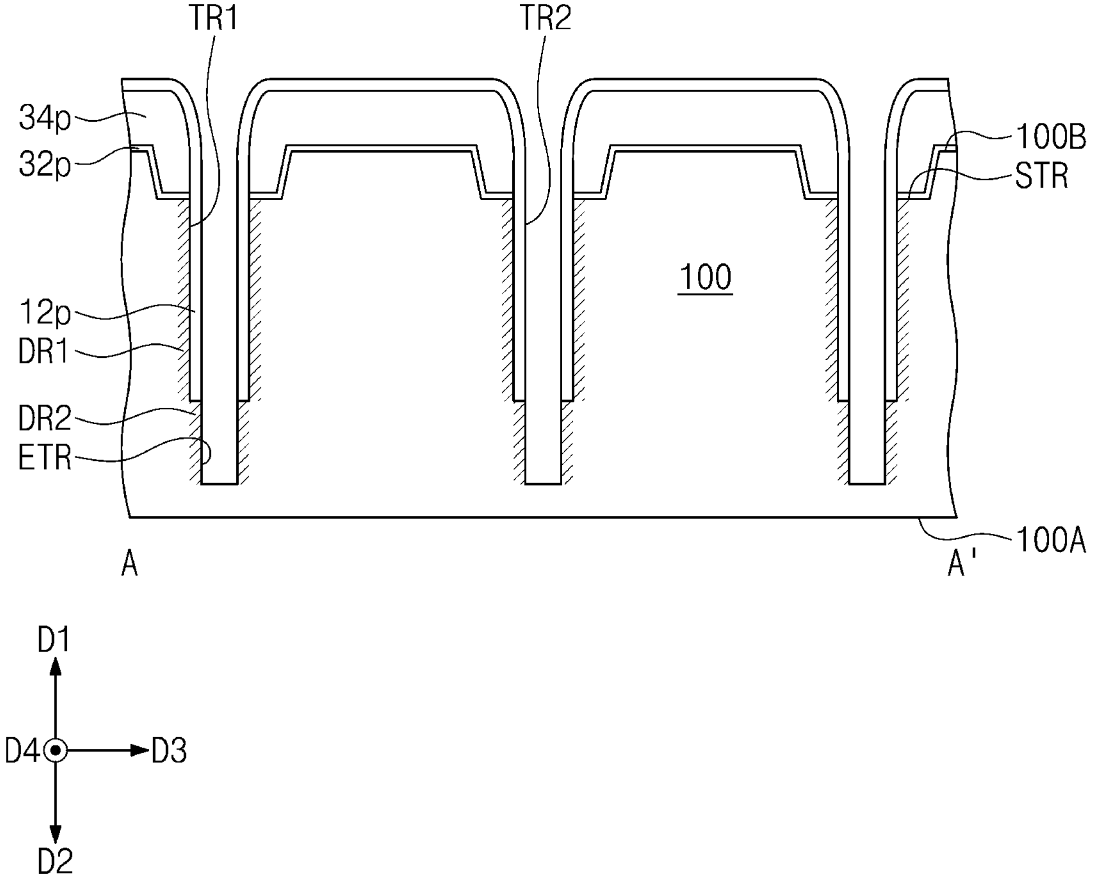
Figure 17B:
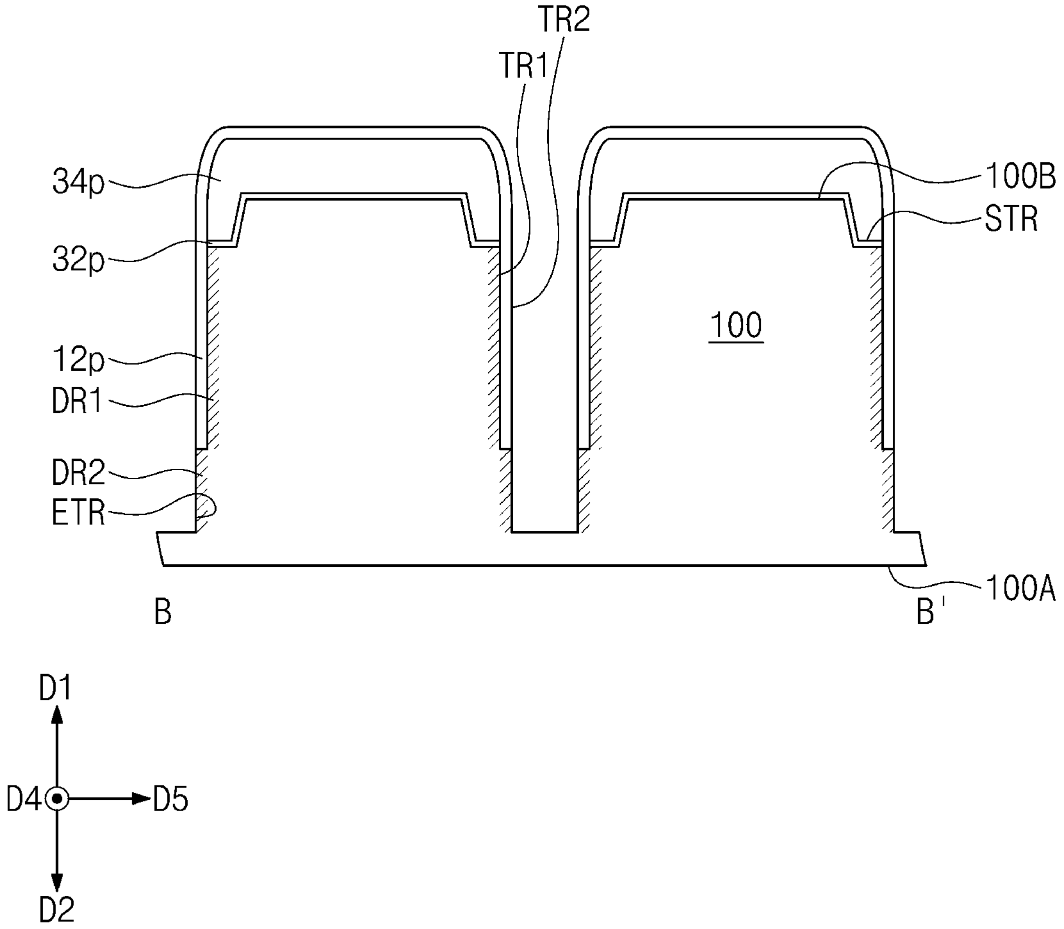

Referring to FIGS. 17A and 17B, an extension trench ETR may be formed to extend into the dielectric liner layer 12*p* and a portion of the substrate 100. The extension trench ETR may be formed to extend from the second trench TR2.

A first doping region DR1 may be formed adjacent to the dielectric liner layer 12*p*. A second doping region DR2 may be formed adjacent to the extension trench ETR. The first doping region DR1 and the second doping region DR2 may be doped with boron.

Figure 18A:
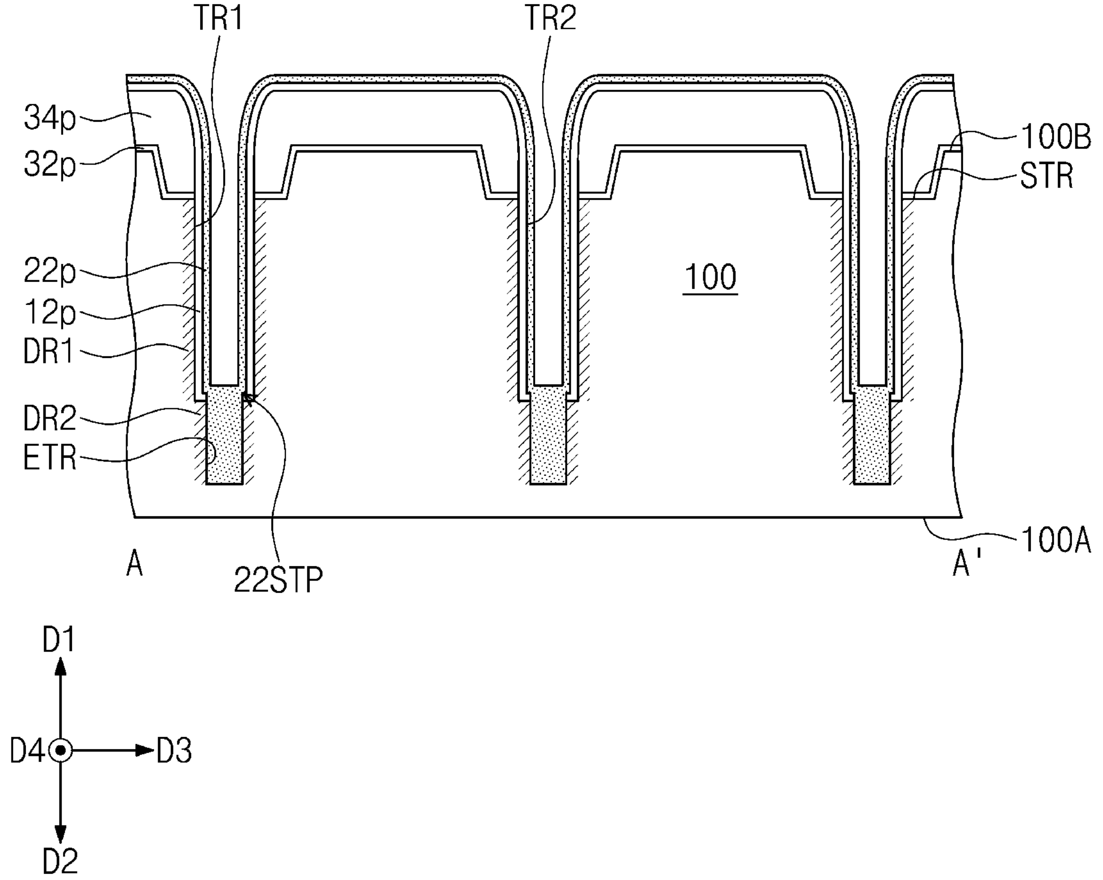
Figure 18B:
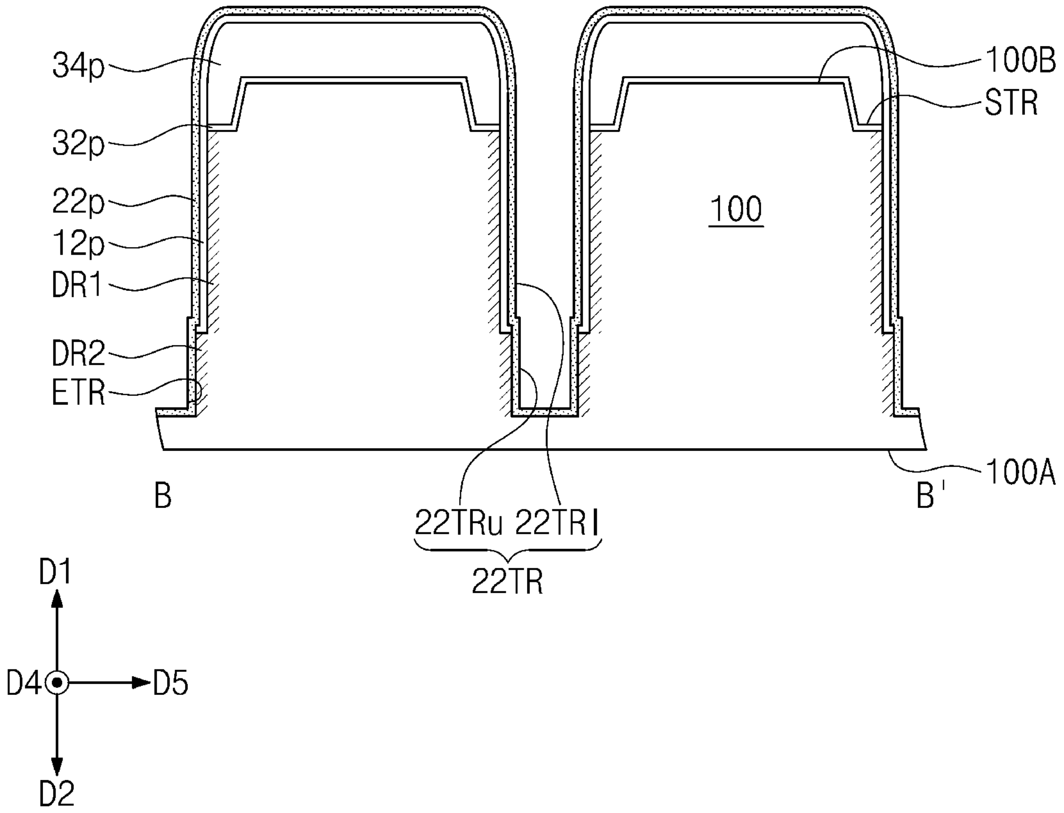

Referring to FIGS. 18A and 18B, a preliminary first dielectric pattern 22*p* may be formed on the dielectric liner layer 12*p* and the extension trench ETR. While the preliminary first dielectric pattern 22*p* is formed, a portion of the dielectric liner layer 12*p* may be etched. In this case, a portion of the dielectric liner layer 12*p* may be etched and then the preliminary first dielectric pattern 22*p* may be formed, with the result that a first dielectric step difference 22STP may be formed.

In the intervening region IR, the preliminary first dielectric pattern 22*p* may be formed to fill the extension trench ETR and to conformally cover or overlap the dielectric liner layer 12*p*. In the crossing region CR, the preliminary first dielectric pattern 22*p* may be formed, and thus a preliminary dielectric pattern trench 22TR may be formed.

In the crossing region CR, the preliminary first dielectric pattern 22*p* may be formed to conformally cover or overlap the dielectric liner layer 12*p* and the extension trench ETR. In the crossing region CR, the preliminary dielectric pattern trench 22TR may include an upper preliminary dielectric pattern trench 22TRu and a lower preliminary dielectric trench 22TR1. The upper preliminary dielectric pattern trench 22TRu and the lower preliminary dielectric trench 22TR1 may be divided across the first dielectric step difference 22STP. A trench on the first dielectric step difference 22STP may be defined as the upper preliminary dielectric pattern trench 22TRu. A trench below the first dielectric step difference 22STP may be defined as the lower preliminary dielectric trench 22TR1.

Figure 19A:
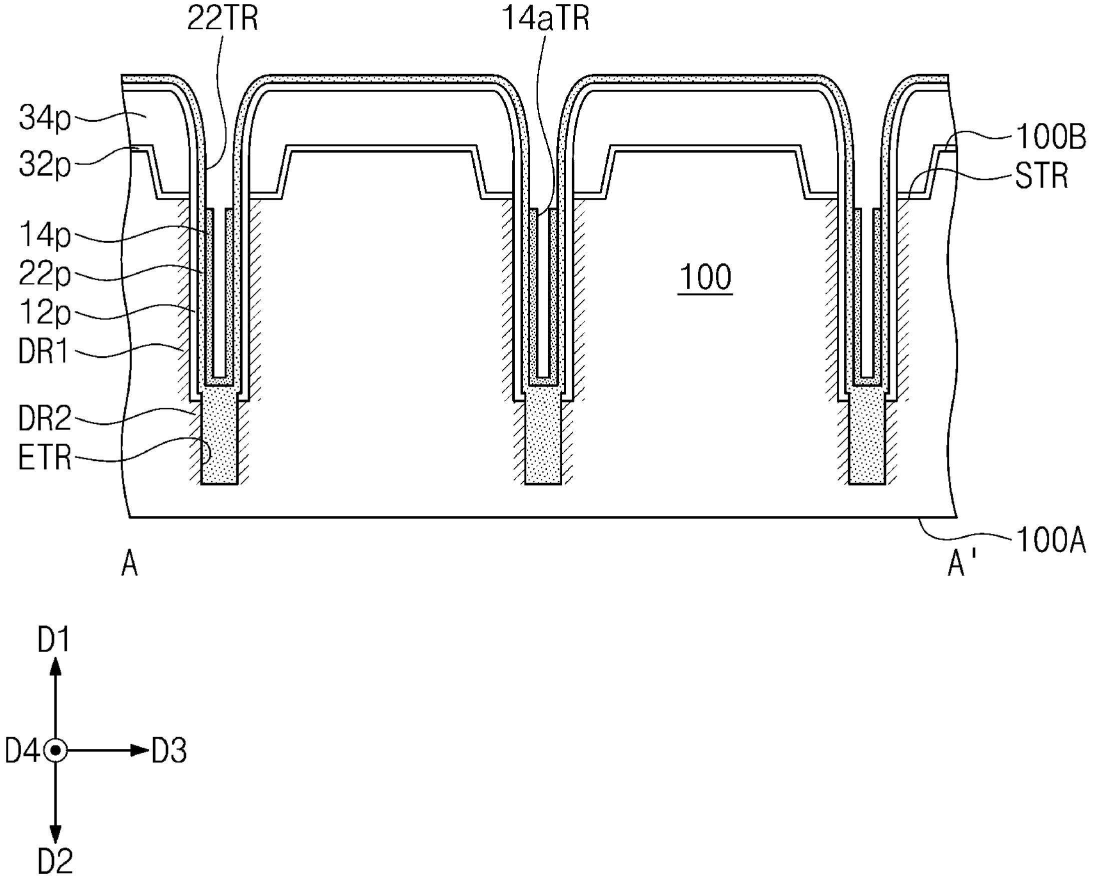
Figure 19B:
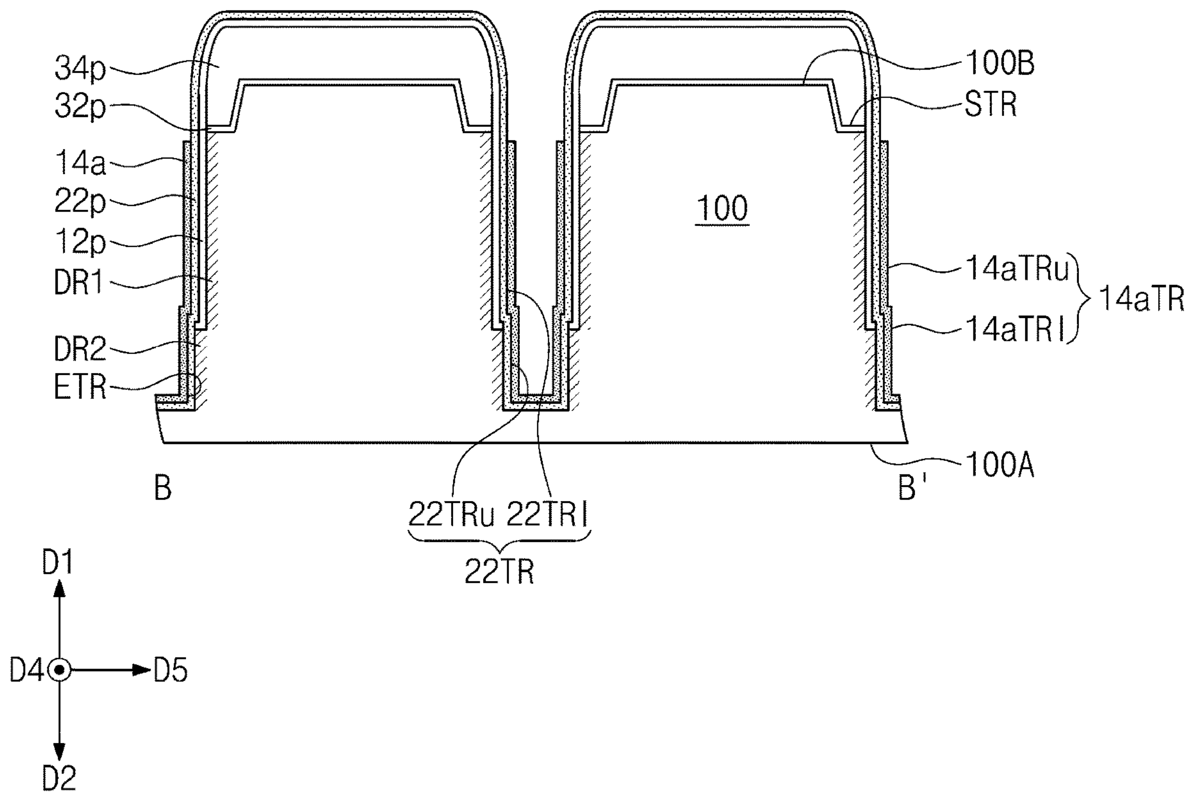

Referring to FIGS. 19A and 19B, a conductive liner 14*a* may be formed on the preliminary first dielectric pattern 22*p*. The conductive liner 14*a* may conformally cover or overlap an inner wall of the preliminary dielectric pattern trench 22TR. The conductive liner 14*a* may conformally cover or overlap a bottom surface of the preliminary dielectric pattern trench 22TR and a portion of a sidewall of the preliminary dielectric pattern trench 22TR. The formation of the conductive liner 14*a* may form a conductive liner trench 14*a*TR.

In the crossing region CR, the preliminary dielectric pattern trench 22TR may include an upper preliminary dielectric pattern trench 22TRu and a lower preliminary dielectric trench 22TR1, and as the conductive liner 14*a* is conformally formed along the preliminary dielectric pattern trench 22TR, the conductive liner trench 14*a*TR may include an upper conductive liner trench 14*a*TRu and a lower conductive liner trench 14*a*TR1.

Figure 20A:
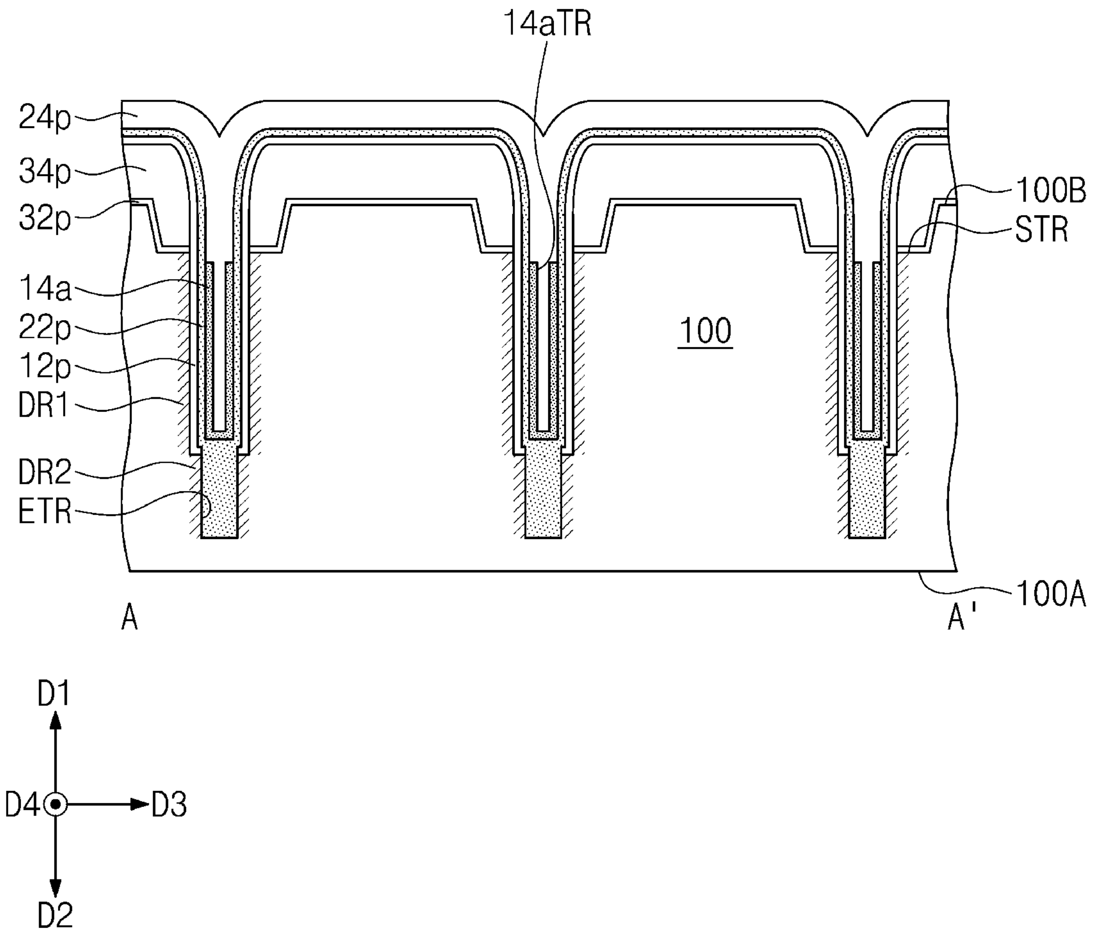
Figure 20B:
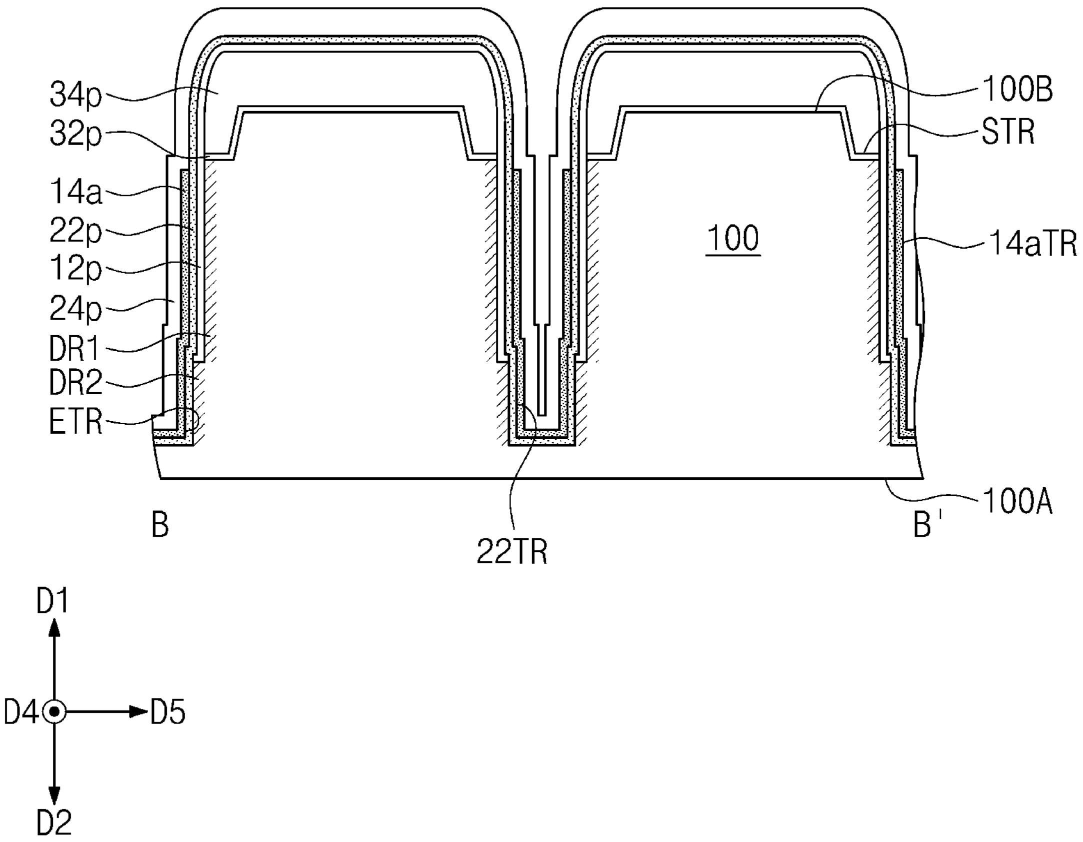

Referring to FIGS. 20A and 20B, a preliminary intervening dielectric pattern 24*p* may be formed in the conductive liner trench 14*a*TR and a portion of the preliminary dielectric pattern trench 22TR.

On the intervening region IR, the preliminary intervening dielectric pattern 24*p* may be formed in the conductive liner trench 14*a*TR. The preliminary intervening dielectric pattern 24*p* may be conformally formed on the preliminary first dielectric pattern 22*p*.

In the crossing region CR, the preliminary intervening dielectric pattern 24*p* may be conformally formed along the conductive liner trench 14*a*TR.

Figure 21A:
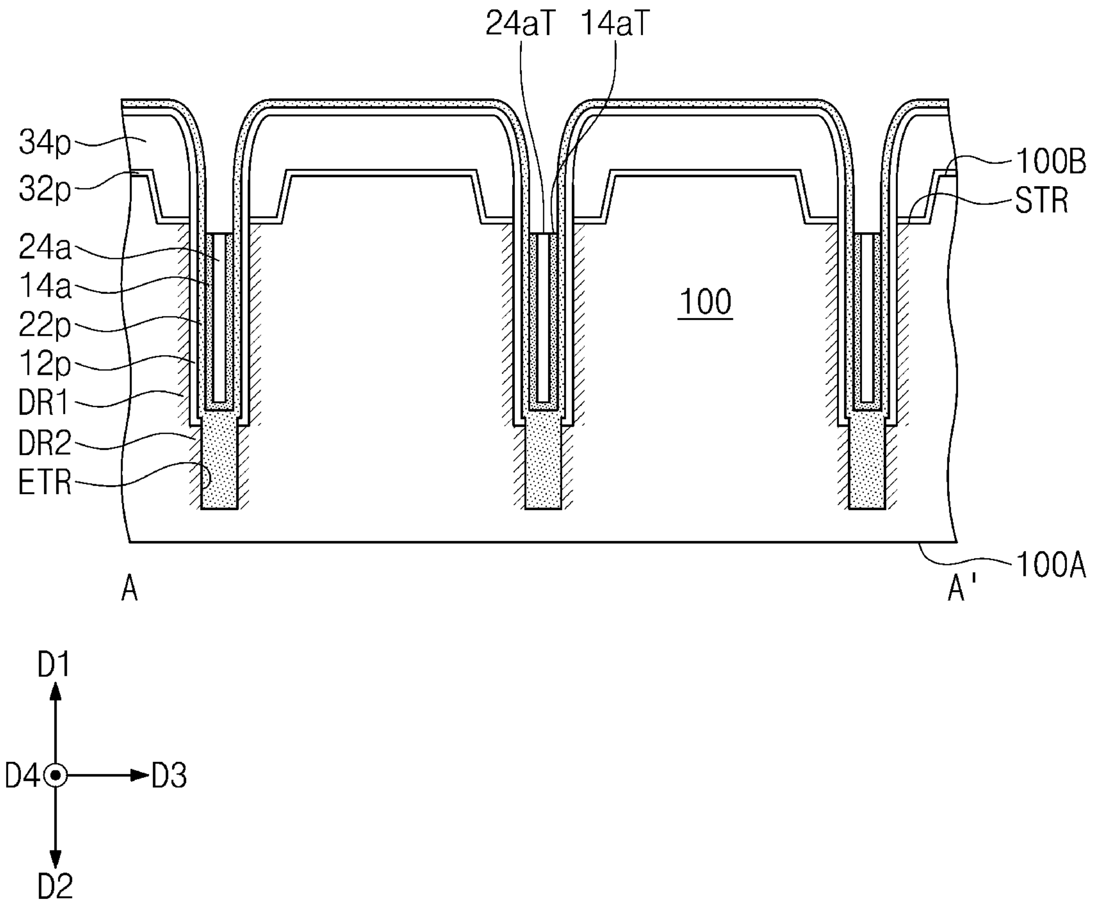
Figure 21B:
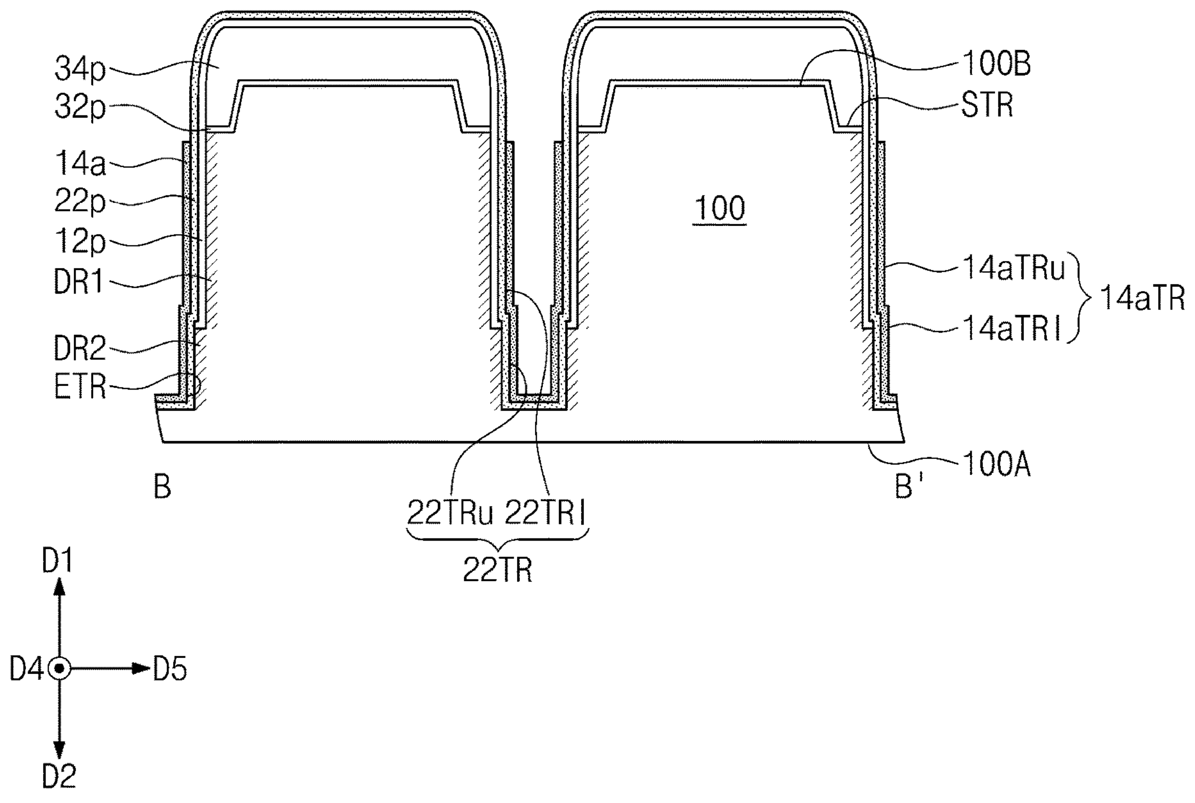

Referring to FIGS. 21A and 21B, in the intervening region IR, an upper portion of the preliminary intervening dielectric pattern 24*p* may be removed. In the crossing region CR, the preliminary intervening dielectric pattern 24*p* may be removed. The removal process may form an intervening dielectric pattern 24*a*.

The removal of the upper portion of the preliminary intervening dielectric pattern 24*p* of the intervening region IR may include, for example, removing the preliminary intervening dielectric pattern 24*p* until a top surface 14*a*T of the conductive liner 14*a* is exposed. In this case, the top surface 14*a*T of the conductive liner 14*a* may be located at the same level as that of a top surface 24*a*T of the intervening dielectric pattern 24*a*.

The removal of the preliminary intervening dielectric pattern 24*p* of the crossing region CR may include removing the preliminary intervening dielectric pattern 24*p* that is conformally formed along the conductive liner trench 14*a*TR. In this case, the removal process may expose the preliminary dielectric pattern trench 22TR and the conductive liner trench 14*a*TR.

Figure 22A:
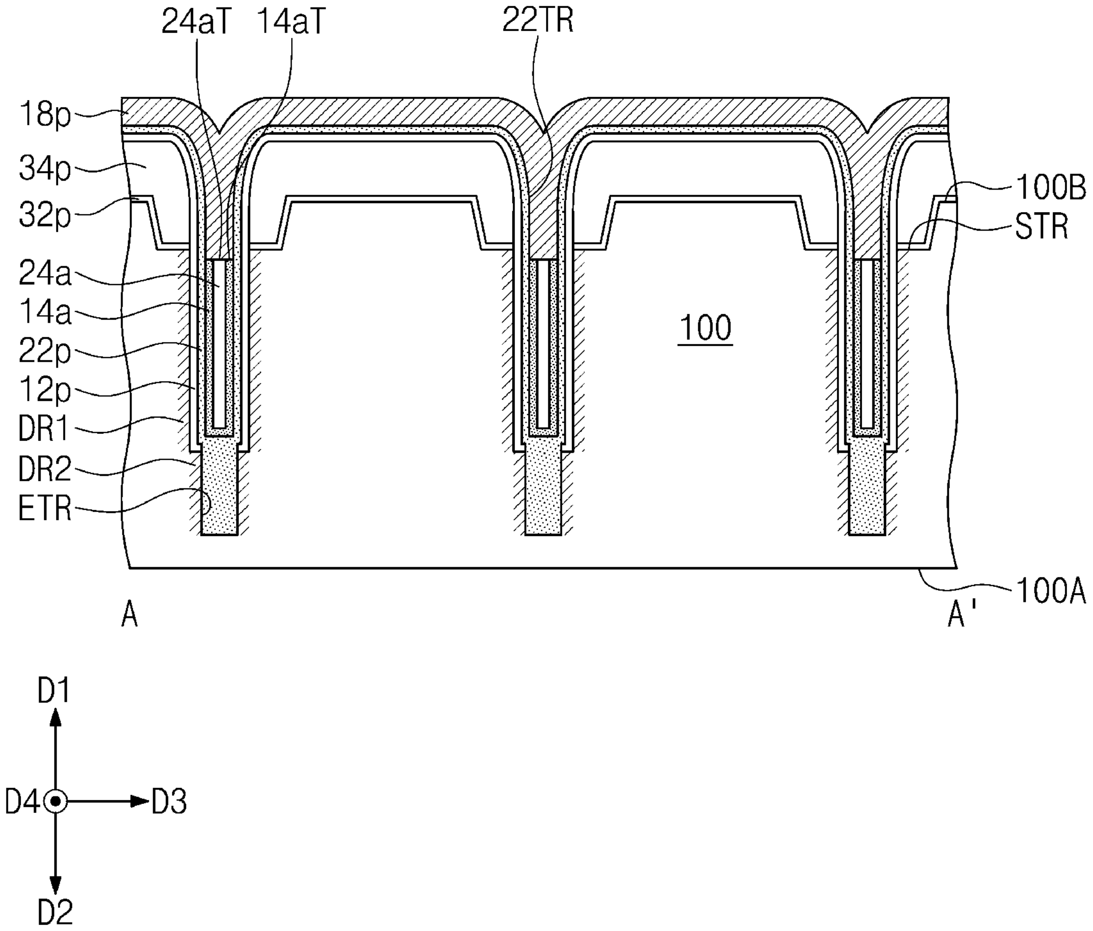
Figure 22B:
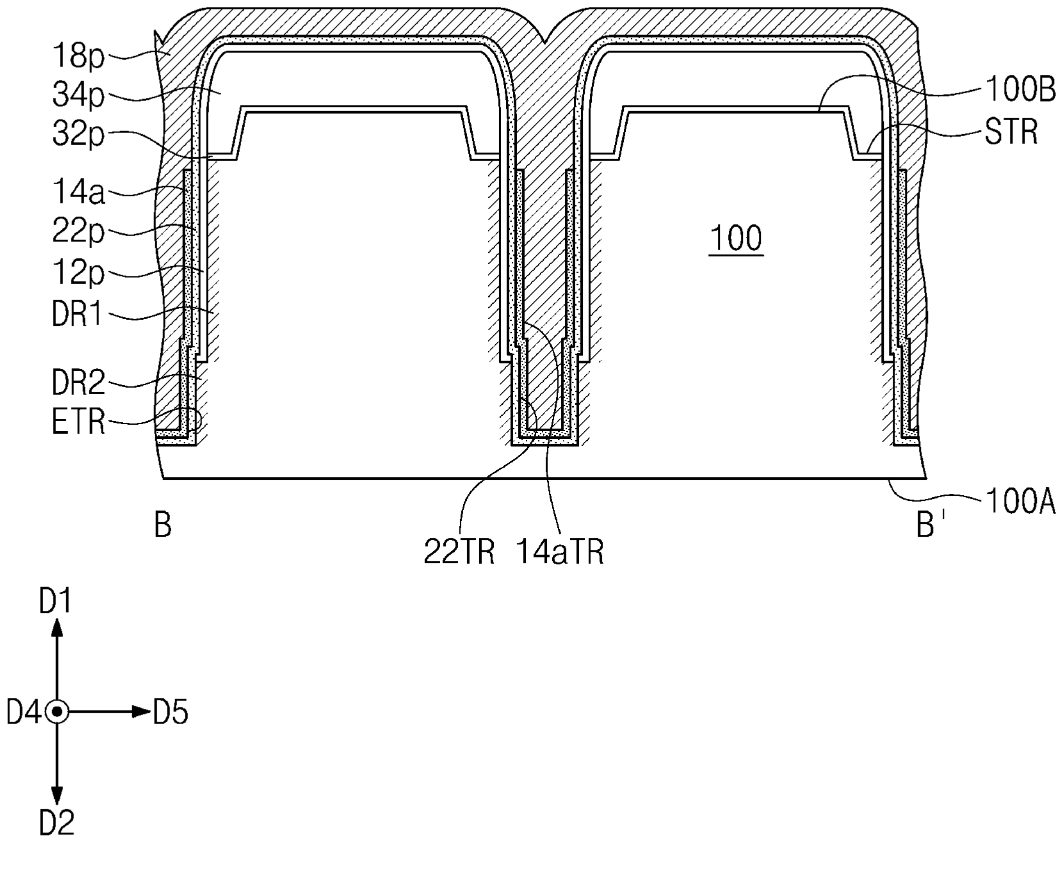

Referring to FIGS. 22A and 22B, a preliminary buried conductive pattern 18*p* may be formed on the preliminary first dielectric pattern 22*p*, the intervening dielectric pattern 24*a*, and the conductive liner 14*a*. The preliminary buried conductive pattern 18*p* may be formed to conformally cover or overlap an exposed portion of the preliminary dielectric pattern trench 22TR and an exposed portion of the conductive liner trench 14*a*TR.

In the intervening region IR, the formation of the preliminary buried conductive pattern 18*p* may include the preliminary buried conductive pattern 18*p* being conformally formed along the exposed preliminary dielectric pattern trench 22TR.

In the crossing region CR, the formation of the preliminary buried conductive pattern 18*p* may include the preliminary buried conductive pattern 18*p* being conformally formed along the exposed preliminary dielectric pattern trench 22TR to completely be in the conductive liner trench 14*a*TR.

Figure 23A:
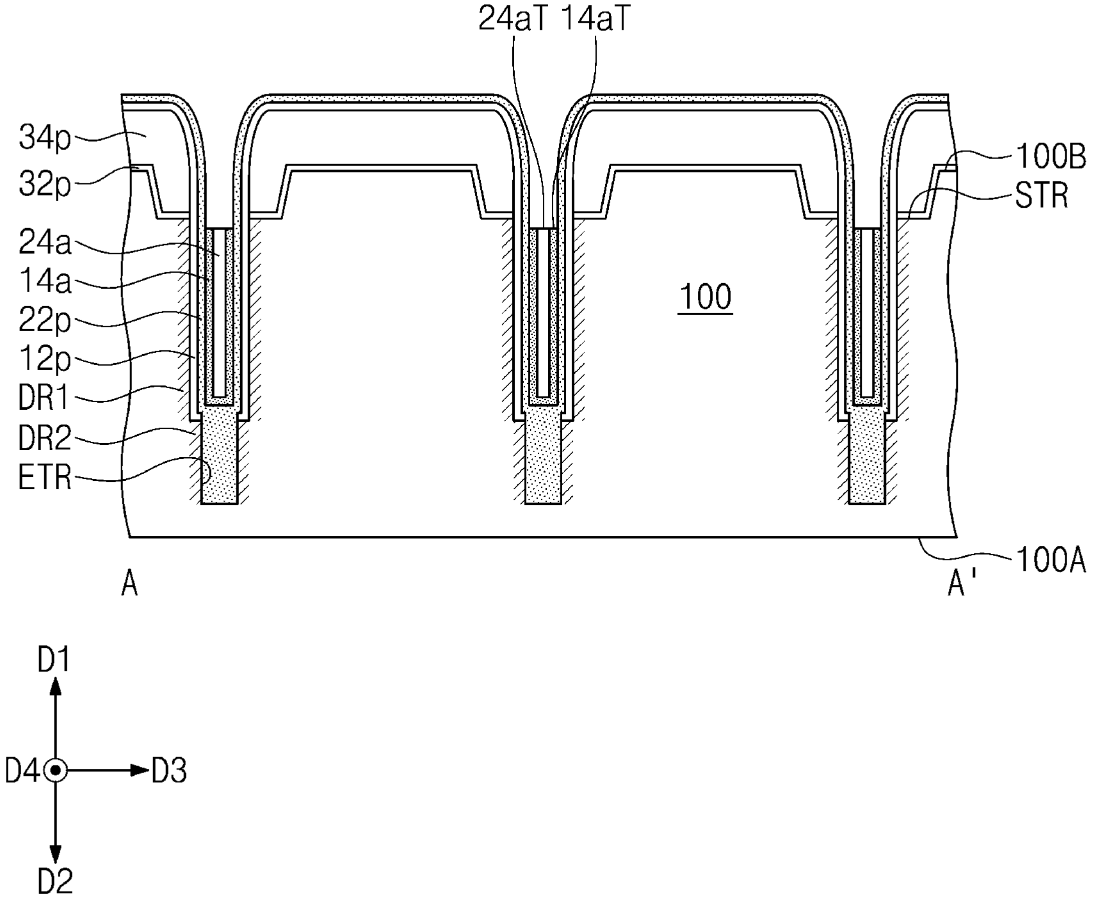
Figure 23B:
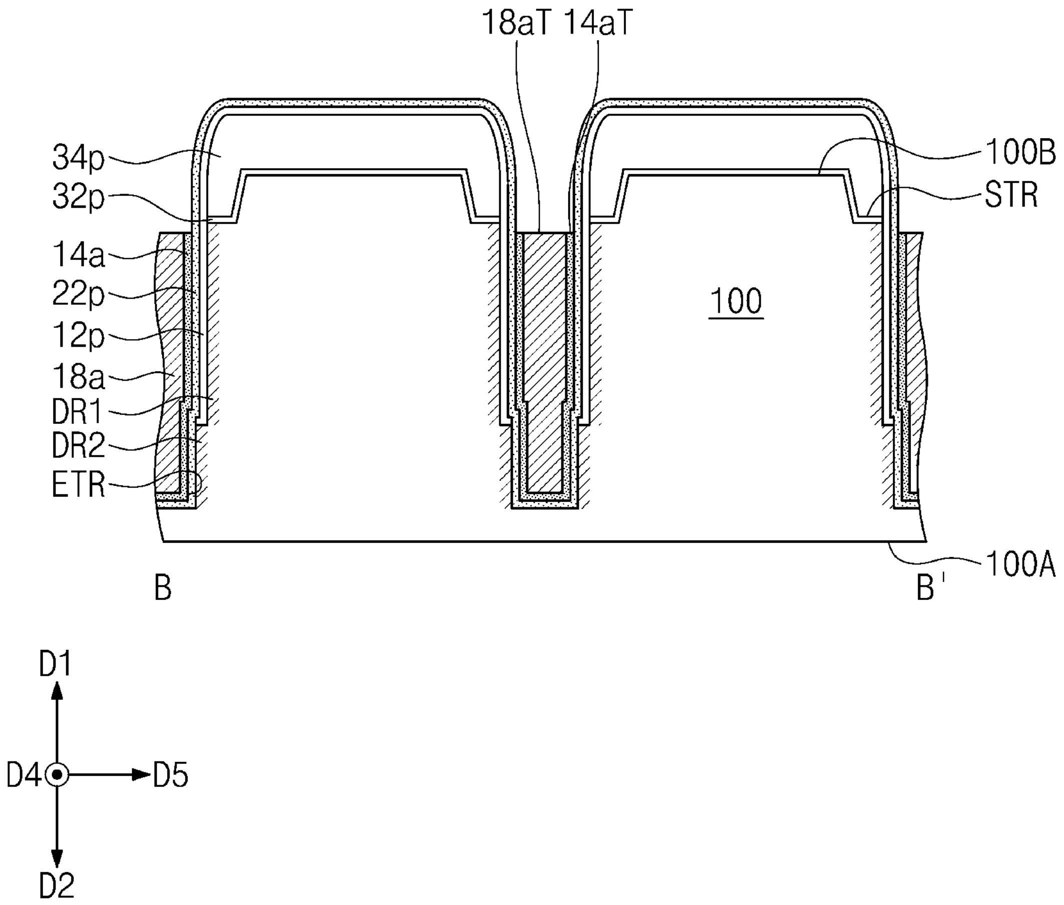

Referring to FIGS. 23A and 23B, an upper portion of the preliminary buried conductive pattern 18*p* may be removed to form a buried conductive pattern 18*a*.

The removal of the upper portion of the preliminary buried conductive pattern 18*p* of the intervening region IR may include removing the preliminary buried conductive pattern 18*p*. In this case, the top surface 14*a*T of the conductive liner 14*a* may be exposed, and likewise the top surface 24*a*T of the intervening dielectric pattern 24*a* may be exposed.

The removal of the upper portion of the preliminary buried conductive pattern 18*p* on the crossing region CR may include removing the preliminary buried conductive pattern 18*p* until the top surface 14*a*T of the conductive liner 14 is exposed. The removal process may form a buried conductive pattern 18. In this, the top surface 14*a*T of the conductive liner 14*a* may be located at the same level as that of a top surface 18*a*T of the buried conductive pattern 18*a*.

Figure 24A:
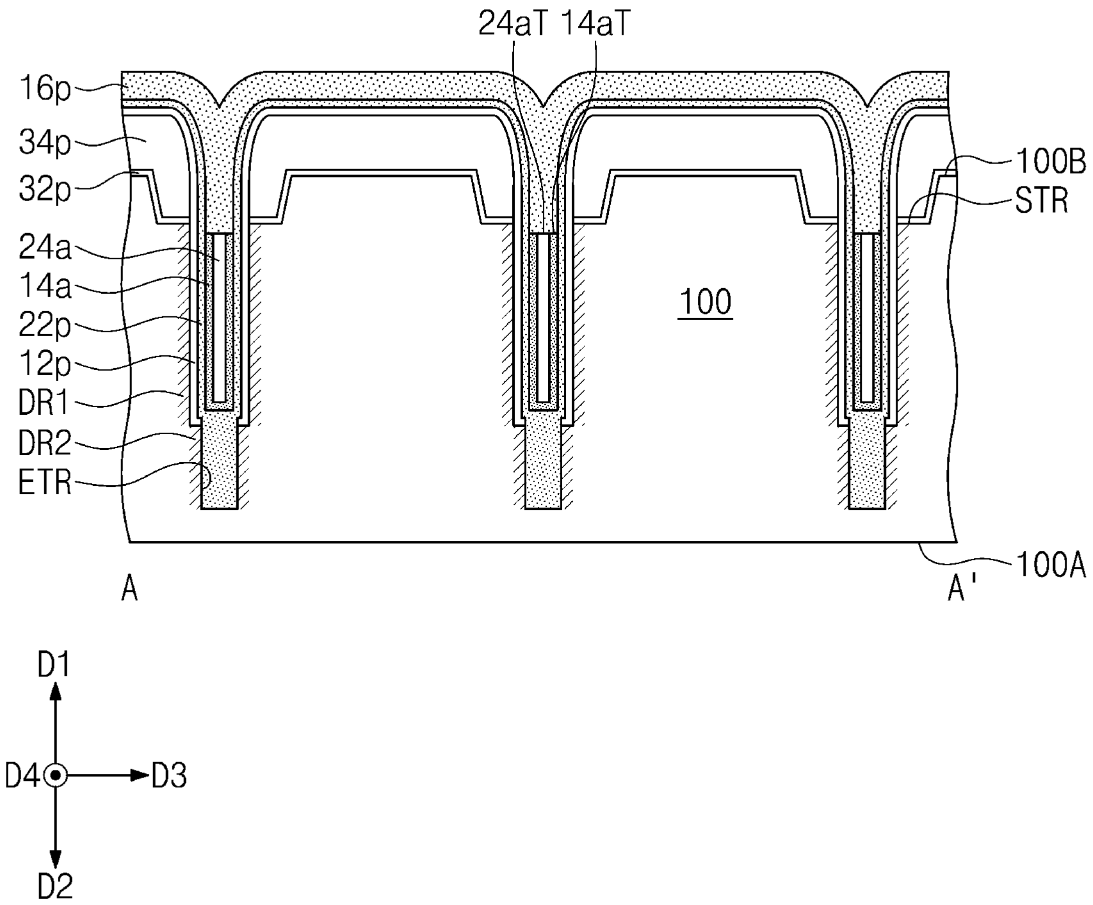
Figure 24B:
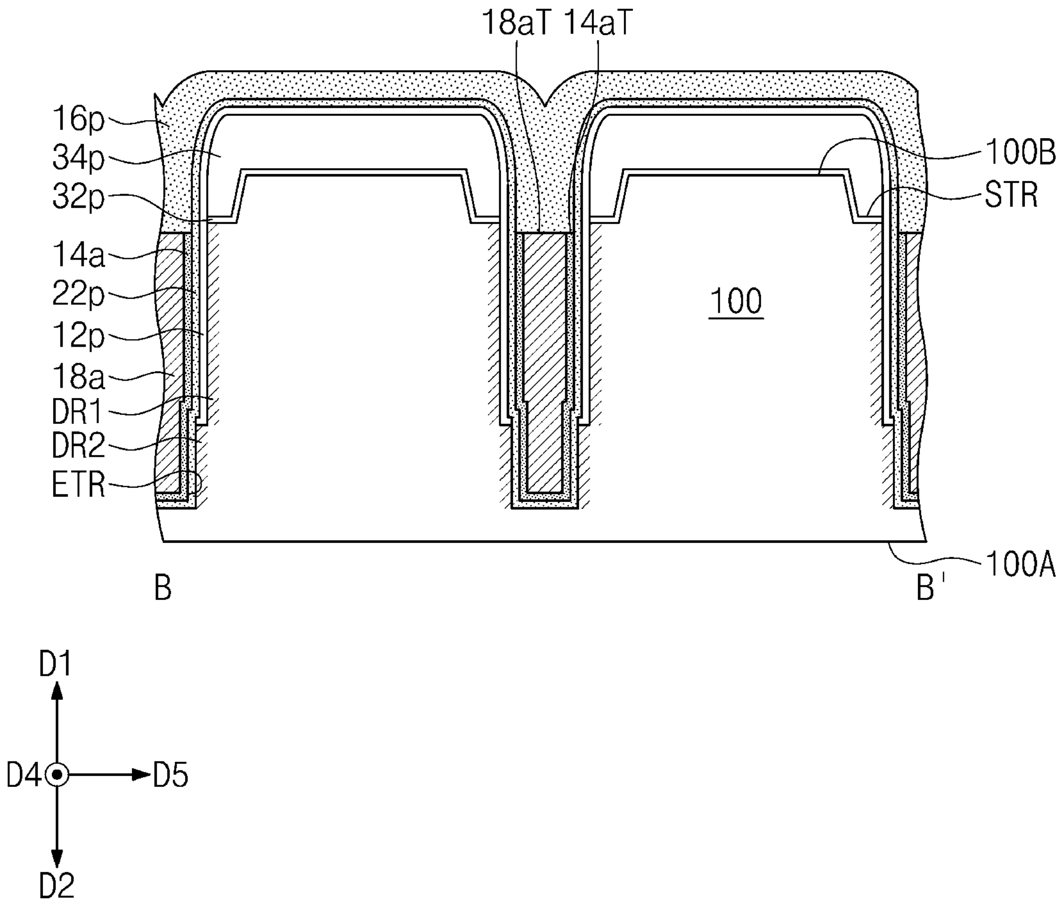

Referring to FIGS. 24A and 24B, a preliminary buried dielectric pattern 16*p* may be formed on the preliminary first dielectric pattern 22*p*, the conductive liner 14*a*, and the intervening dielectric pattern 24*a* on the intervening region IR, and may also formed on the conductive liner 14*a* and the buried conductive pattern 18*a* of the crossing region CR.

In the crossing region CR, the preliminary buried dielectric pattern 16*p* may be formed to cover or overlap the top surface 18*a*T of the buried conductive pattern 18*a* and the top surface 14*a*T of the conductive liner 14*a*.

In the intervening region IR, the preliminary buried dielectric pattern 16*p* may be formed to cover or overlap the top surface 24*a*T of the intervening dielectric pattern 24*a* and the top surface 14*a*T of the conductive liner 14*a*.

Figure 25A:
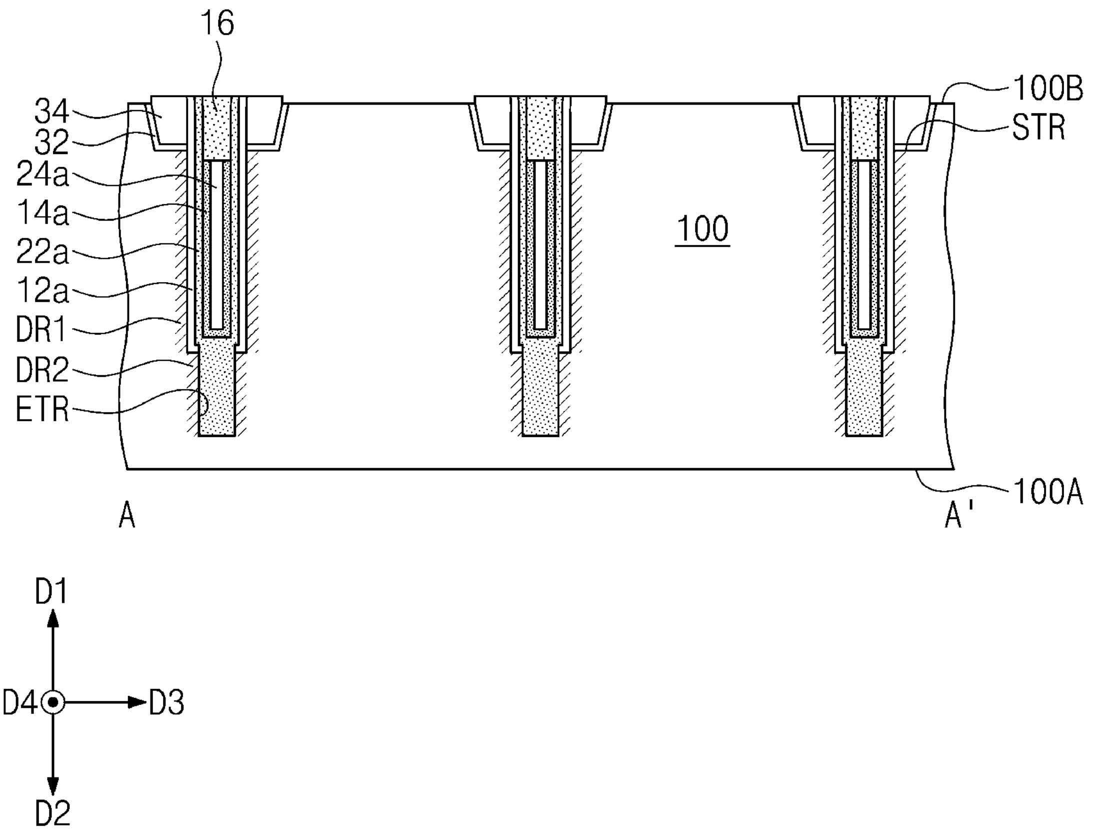
Figure 25B:
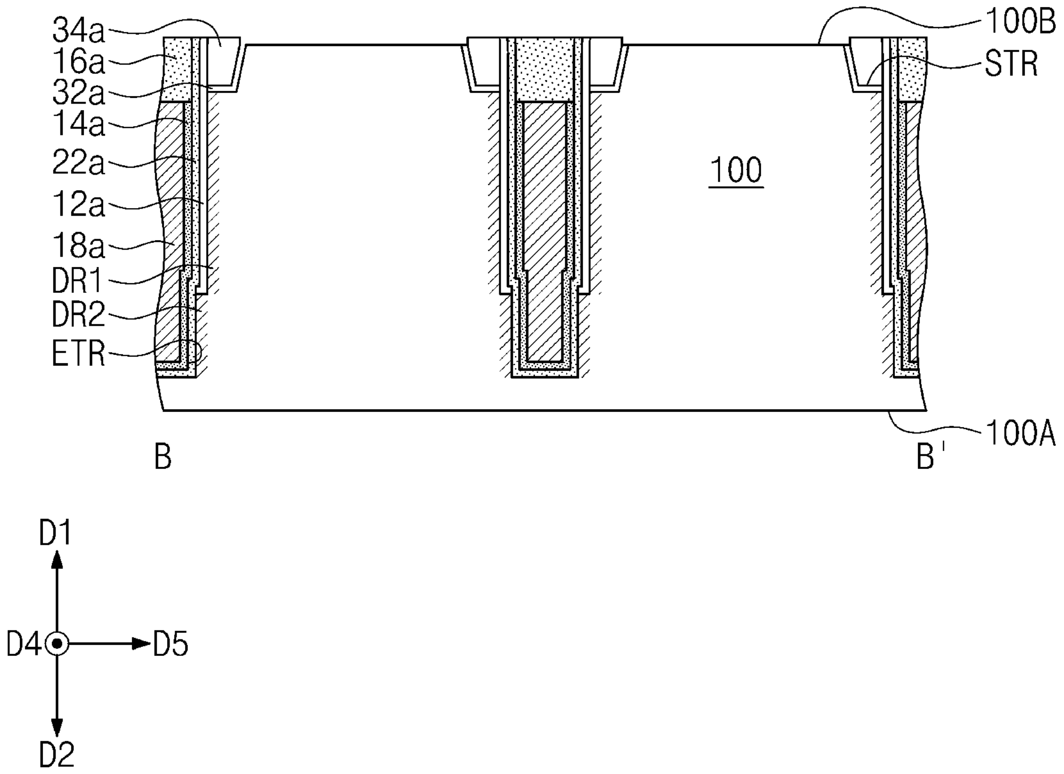

Referring to FIGS. 25A and 25B, a planarization process may be performed. In the planarization process, an upper portion of the dielectric liner layer 12*p*, an upper portion of the preliminary buried dielectric pattern 16*p*, and an upper portion of the second isolation layer 34*p* may be removed to form a second dielectric pattern 12*a*, a buried dielectric pattern 16*a*, and a second isolation portion 34*a*.

Figure 26A:
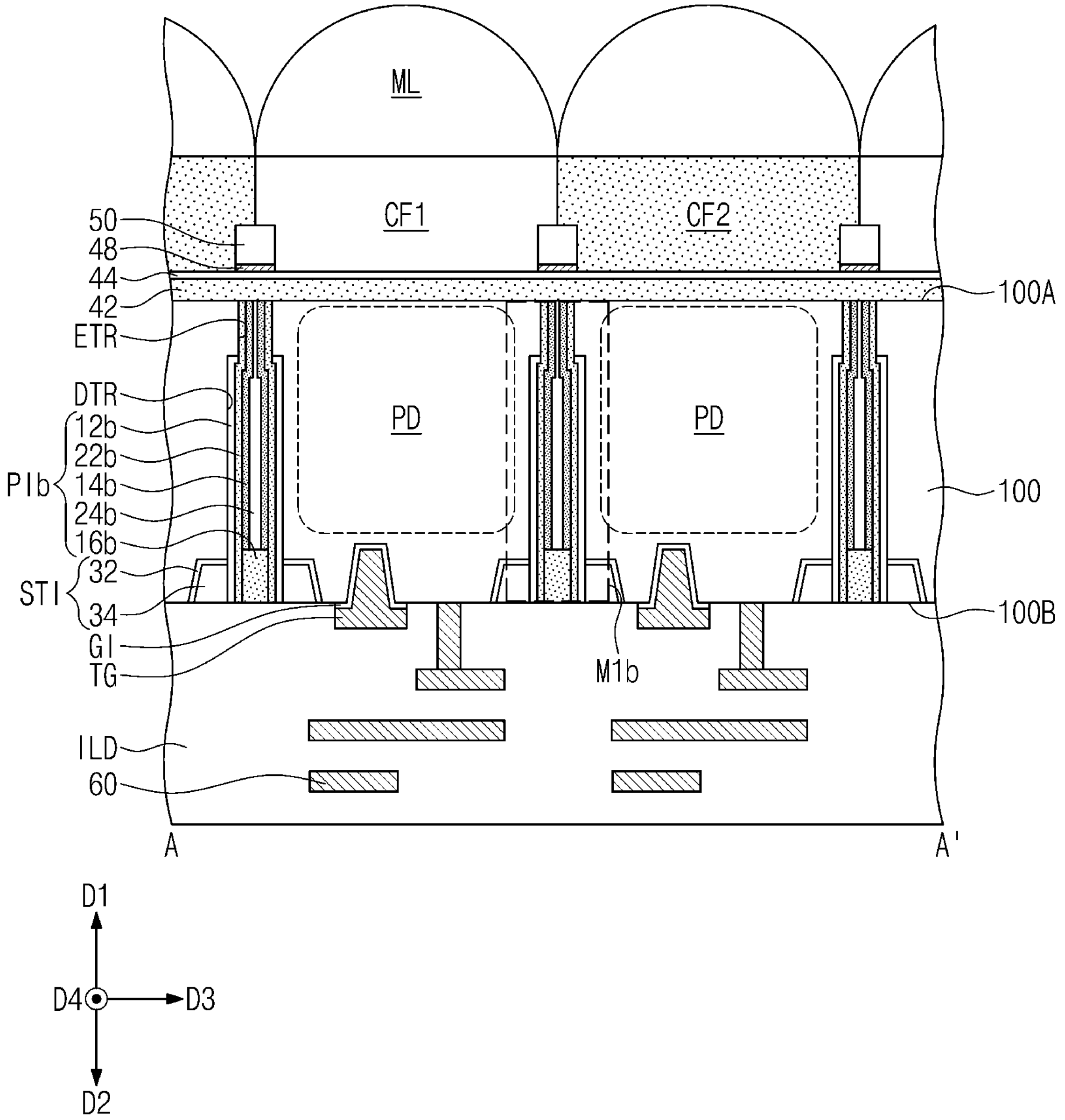
FIG. 26A illustrates a cross-sectional view taken along line A-A' of FIG. 3 of an image sensor according to some embodiments of the present disclosure.
Figure 26B:
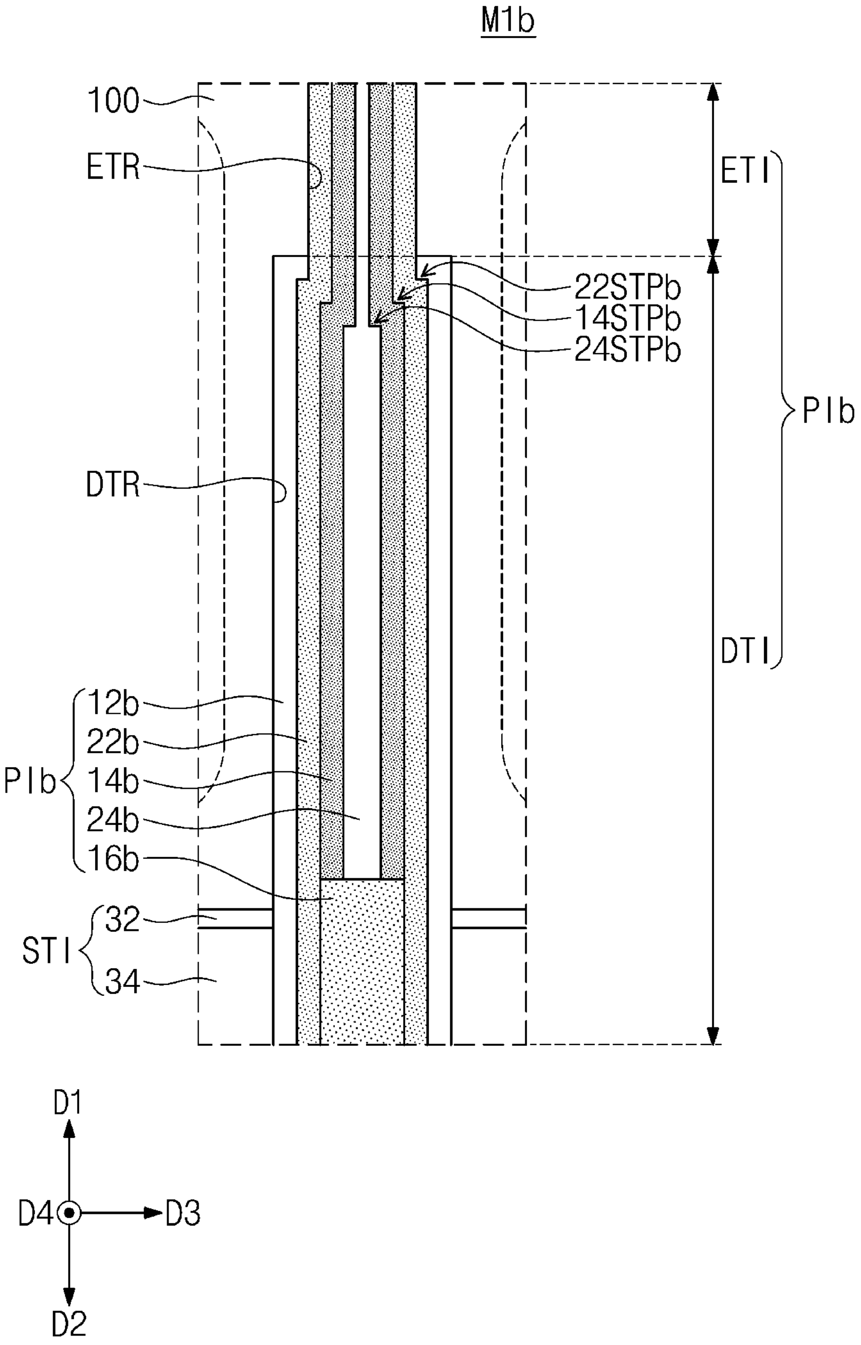
FIG. 26B illustrates an enlarged view showing section M1*b* of FIG. 26A.
Figure 26C:
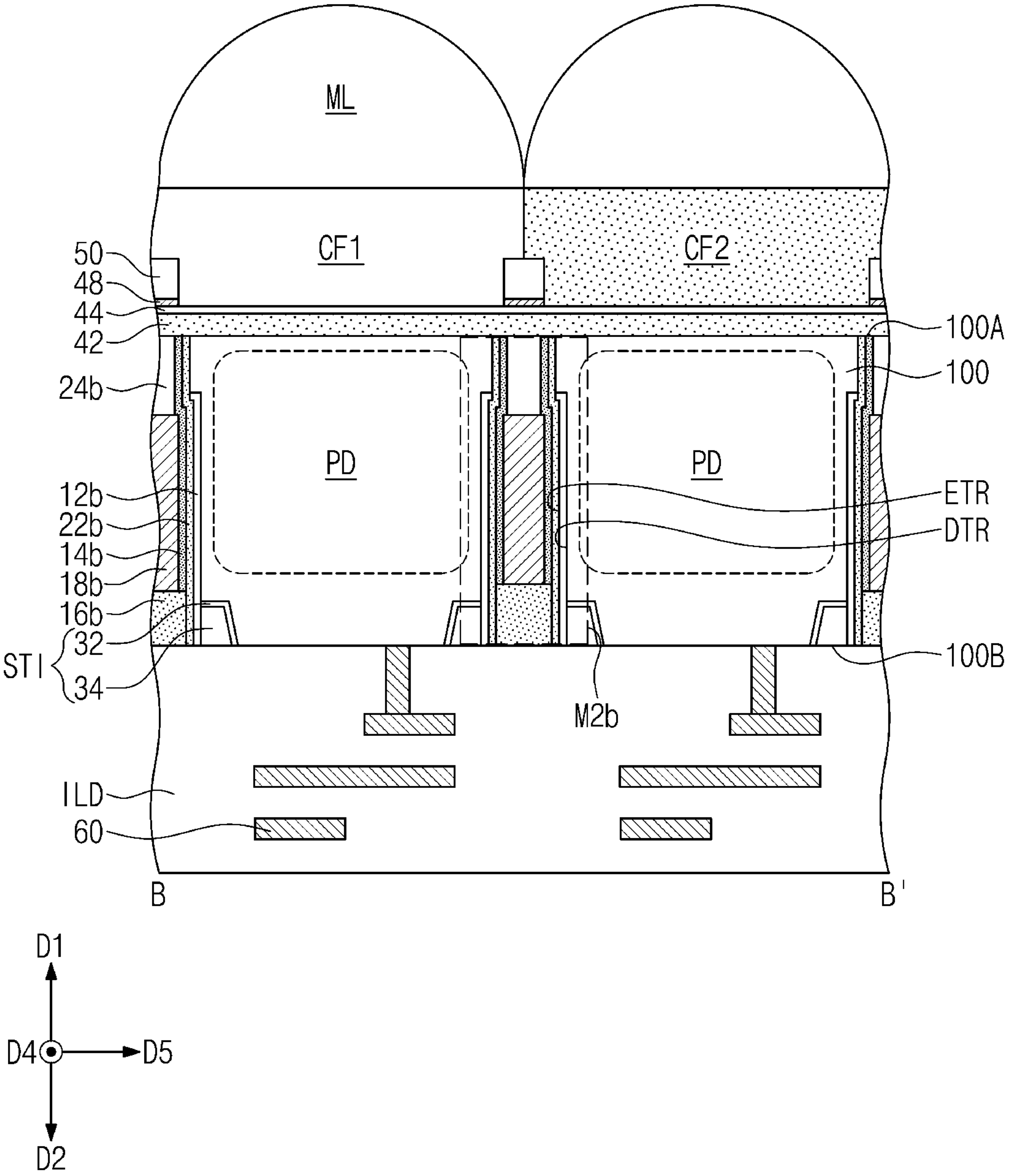
FIG. 26C illustrates a cross-sectional view taken along line B-B' of FIG. 3 and of an image sensor according to some embodiments of the present disclosure.
Figure 26D:
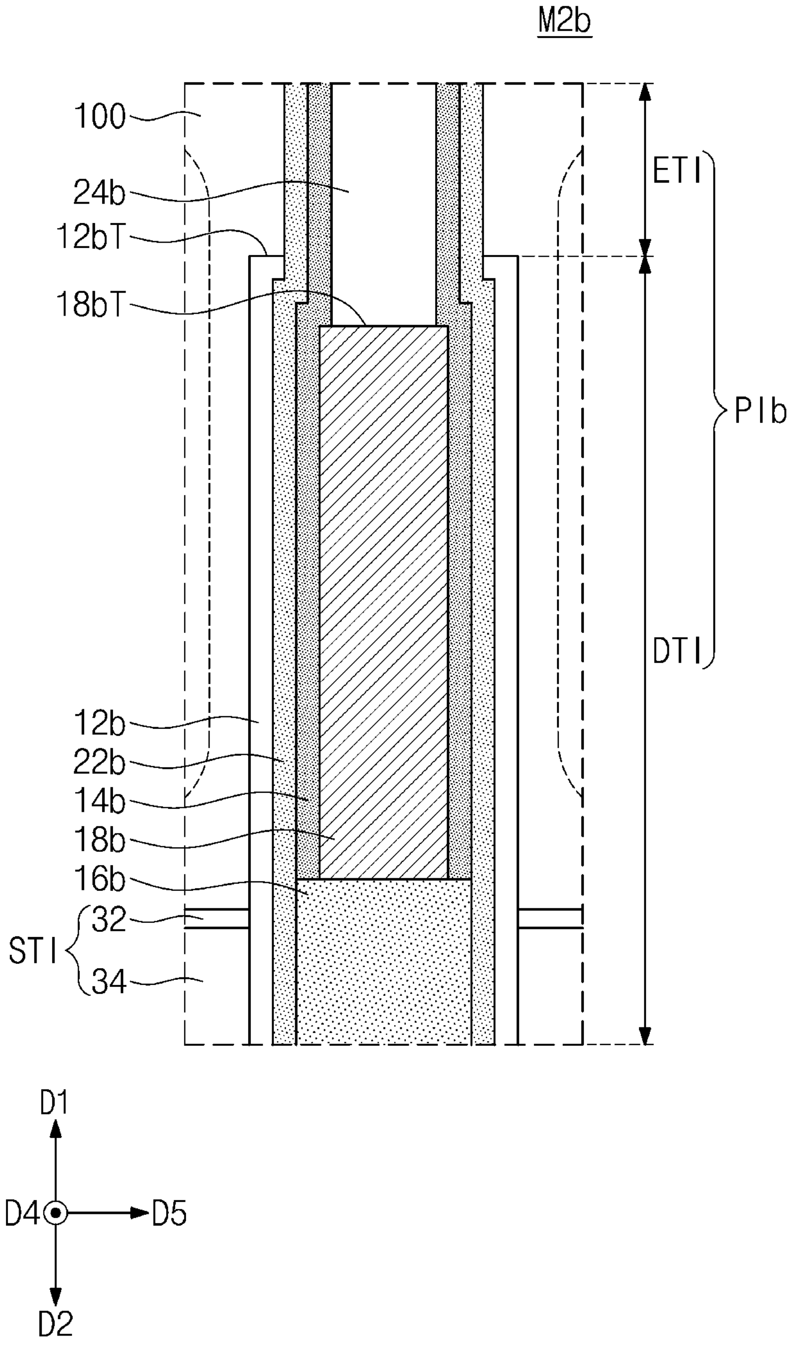
FIG. 26D illustrates an enlarged view showing section M2*b* of FIG. 26C.

FIG. 26A illustrates a cross-sectional view taken along line A-A' of FIG. 3 and of an image sensor according to some embodiments of the present disclosure. FIG. 26B illustrates an enlarged view showing section M1*b* of FIG. 26A. FIG. 26C illustrates a cross-sectional view taken along line B-B' of FIG. 3 and of an image sensor according to some embodiments of the present disclosure. FIG. 26D illustrates an enlarged view showing section M2*b* of FIG. 26C. For brevity of description, the following will mainly describe a difference from the image sensor discussed with reference to FIGS. 1 to 4D.

Referring to FIGS. 3 and 26A to 26D, a device isolation pattern PIb may extend from the first surface 100A into the substrate 100, and may be interposed between a plurality of pixel areas PX. The device isolation pattern PIb may include an intervening region IR and a crossing region CR. The device isolation pattern PIb may include a first device isolation portion DTI and a second device isolation portion ETI.

In the intervening region IR, the device isolation pattern PIb may include an intervening dielectric pattern 24*b*, a conductive liner 14*b* on the intervening dielectric pattern 24*b*, a first dielectric pattern 22*b* on the conductive liner 14*b*, a second dielectric pattern 12*b* on the first dielectric pattern 22*b*, and a buried dielectric pattern 16*b*.

In the intervening region IR, the first dielectric pattern 22*b* may have a first dielectric step difference 22STPb. The first dielectric step difference 22STPb may have, for example, a stepwise shape. The first dielectric step difference 22STPb may be defined to indicate, for example, a stepwise shape of the first dielectric pattern 22*b* in the vicinity of an interface between the first device isolation portion DTI and the second device isolation portion ETI.

In the intervening region IR, the conductive liner 14*b* may have a liner step difference 14STPb. The liner step difference 14STPb may have, for example, a stepwise shape. The liner step difference 14STPb may be defined to indicate, for example, a stepwise shape of the conductive liner 14*b* in the vicinity of an interface between the first device isolation portion DTI and the second device isolation portion ETI.

In the intervening region IR, the intervening dielectric pattern 24*b* may have an intervening dielectric step difference 24STPb. The intervening dielectric step difference 24STPb may have, for example, a stepwise shape. The intervening dielectric step difference 24STPb may be defined to indicate, for example, a stepwise shape of the intervening dielectric pattern 24*b* in the vicinity of an interface between the first device isolation portion DTI and the second device isolation portion ETI.

In the crossing region CR, the device isolation pattern PIb may include a buried conductive pattern 18*b*, an intervening dielectric pattern 24*b* on the buried conductive pattern 18*b*, a conductive liner 14*b* in contact with the buried conductive pattern 18*b* and the intervening dielectric pattern 24*b*, a first dielectric pattern 22*b* on the conductive liner 14*b*, a second dielectric pattern 12*b* on the first dielectric pattern 22*b*, and a buried dielectric pattern 16*b*.

In the crossing region CR, the buried conductive pattern 18*b* may have a top surface 18*b*T in contact with the intervening dielectric pattern 24*b*. The top surface of the buried conductive pattern 18*b* may be located at a level lower than that of a top surface 12*b*T of the second dielectric pattern 12*b*.

Figure 27A:
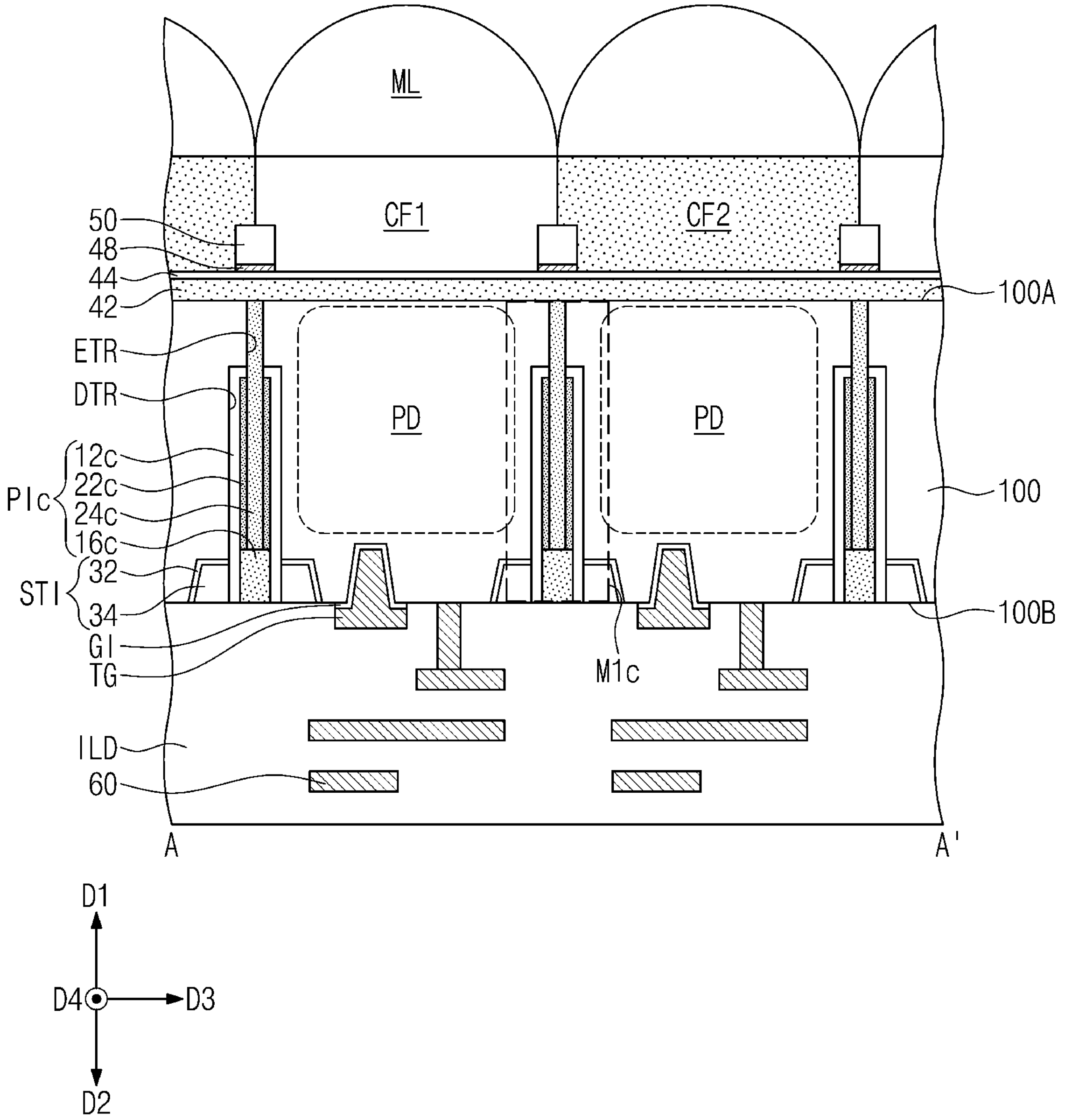
FIG. 27A illustrates a cross-sectional view taken along line A-A' of FIG. 3 and of an image sensor according to some embodiments of the present disclosure.
Figure 27B:
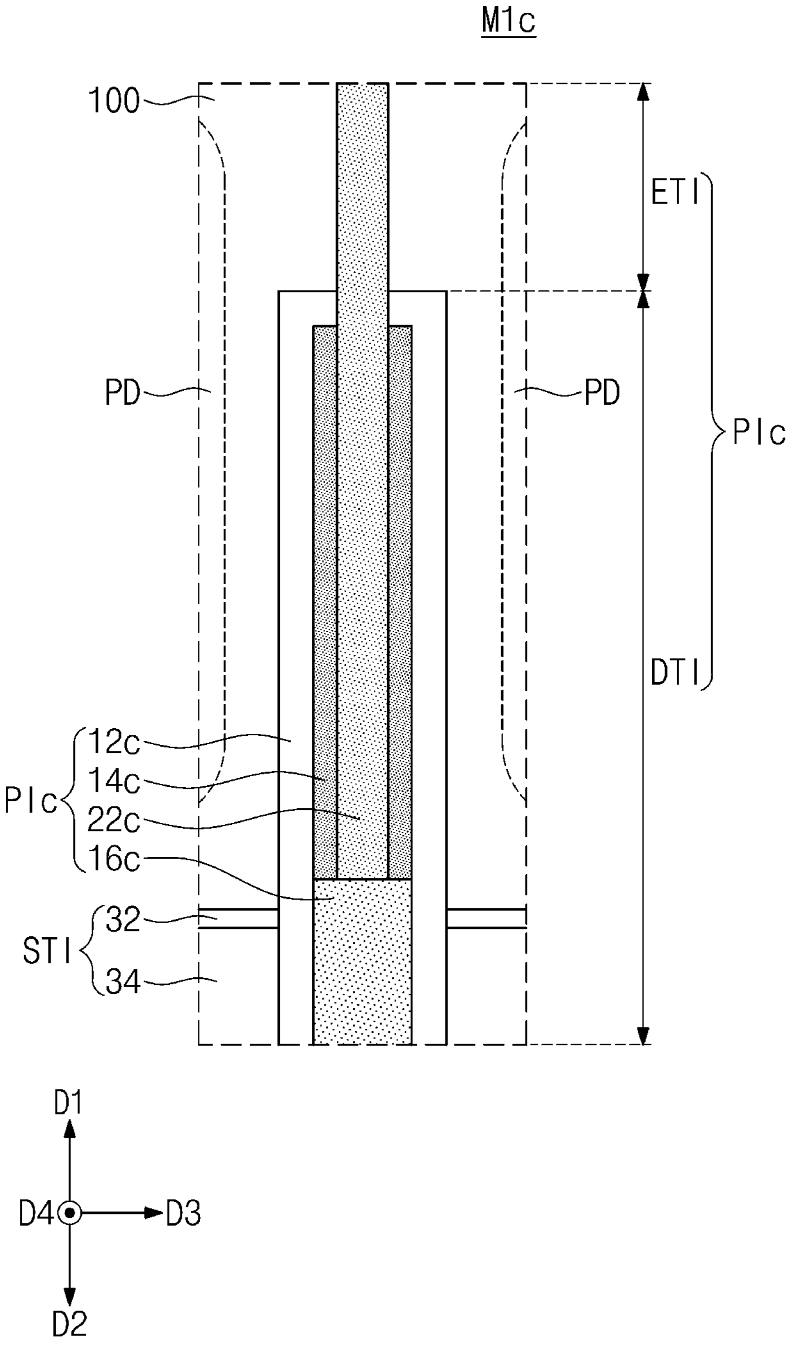
FIG. 27B illustrates an enlarged view showing section M1*c* of FIG. 27A.
Figure 27C:
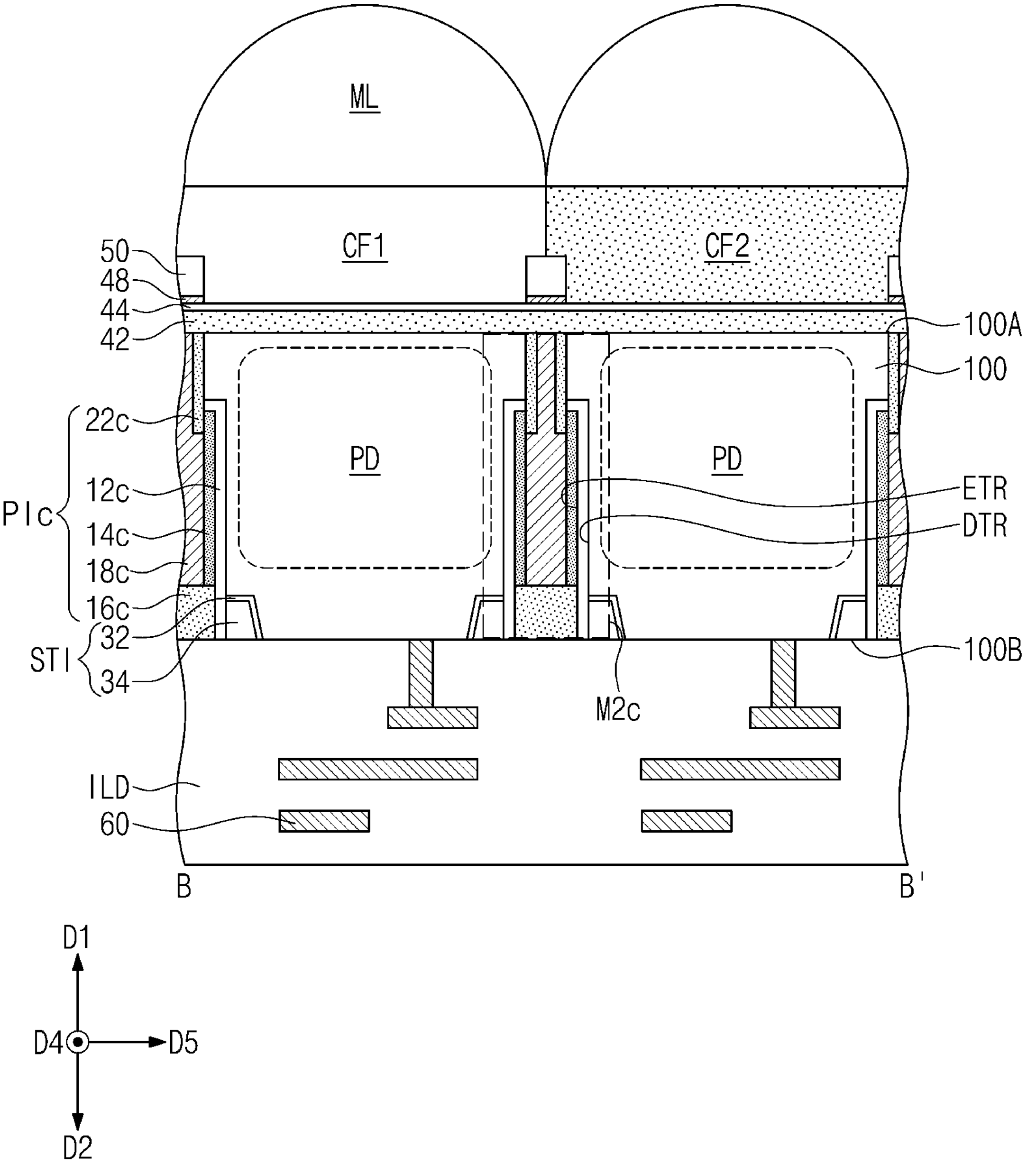
FIG. 27C illustrates a cross-sectional view taken along line B-B' of FIG. 3 and of an image sensor according to some embodiments of the present disclosure.
Figure 27D:
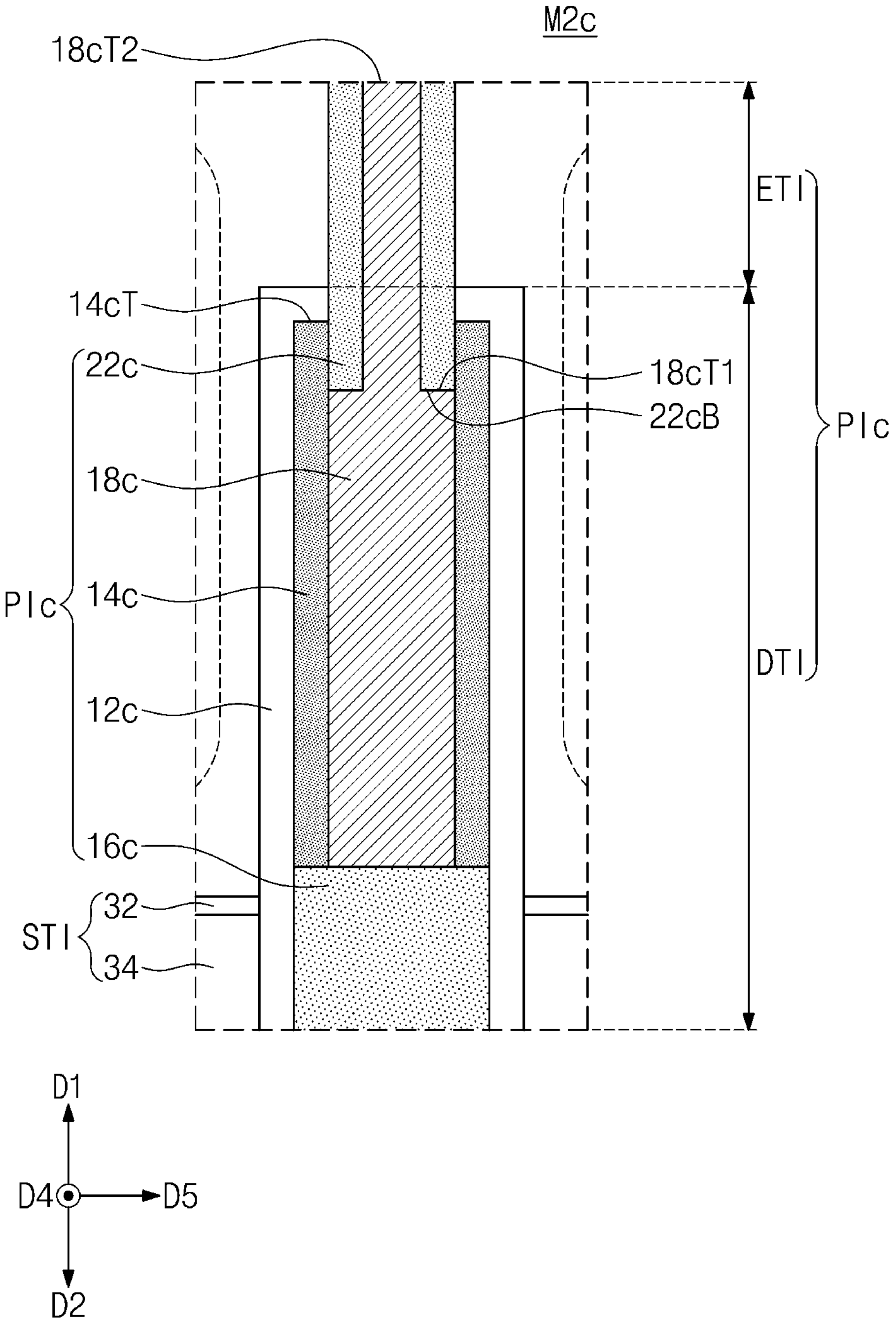
FIG. 27D illustrates an enlarged view showing section M2*c* of FIG. 27C.

FIG. 27A illustrates a cross-sectional view taken along line A-A' of FIG. 3 and of an image sensor according to some embodiments of the present disclosure. FIG. 27B illustrates an enlarged view showing section M1*c* of FIG. 27A. FIG. 27C illustrates a cross-sectional view taken along line B-B' of FIG. 3 and of an image sensor according to some embodiments of the present disclosure. FIG. 27D illustrates an enlarged view showing section M2*c* of FIG. 27C. For brevity of description, the following will mainly describe a difference from the image sensor discussed with reference to FIGS. 1 to 4D.

Referring to FIGS. 3 and 27A to 27D, a device isolation pattern PIc may extend from the first surface 100A into the substrate 100, and may be interposed between a plurality of pixel areas PX. The device isolation pattern PIc may include an intervening region IR and a crossing region CR. The device isolation pattern PIc may include a first device isolation portion DTI and a second device isolation portion ETI.

In the intervening region IR, the device isolation pattern PIc may include a first dielectric pattern 22*c*, a conductive liner 14*c* on the first dielectric pattern 22*c*, a second dielectric pattern 12*c* on the conductive liner 14*c*, and a buried dielectric pattern 16*c*.

The first dielectric pattern 22*c* may extend from the first device isolation portion DTI to the second device isolation portion ETI. The first dielectric pattern 22*c* may extend from a top surface of the buried dielectric pattern 16*c* to the first surface 100A of the substrate 100. A sidewall of the first dielectric pattern 22*c* may be in contact with the conductive liner 14*c*.

The first device isolation portion DTI may include the first dielectric pattern 22*c*, the conductive liner 14*c*, the second dielectric pattern 12*c*, and the buried dielectric pattern 16*c*. The second device isolation portion ETI may include the first dielectric pattern 22*c*.

In the crossing region CR, the device isolation pattern PIc may include a buried conductive pattern 18*c*, a conductive liner 14*c* in contact with the buried conductive pattern 18*c*, a first dielectric pattern 22*c* in contact with the buried conductive pattern 18*c* and the conductive liner 14*c*, and a buried dielectric pattern 16*c*.

In the crossing region CR, a top surface of the buried conductive pattern 18*c* may include a first buried conductive top surface 18*c*T1 in contact with a bottom surface 22*c*B of the first dielectric pattern 22*c* and a second buried conductive top surface 18*c*T2 in contact with the first surface 100A of the substrate 100. The first buried conductive top surface 18*c*T1 and the second buried conductive top surface 18*c*T2 may be spaced apart from each other. The first buried conductive top surface 18*c*T1 may be located at a level lower than that of the second buried conductive top surface 18*c*T2.

The level of the first buried conductive top surface 18*c*T1 may be lower than that of a top surface 14*c*T of the conductive liner 14*c*.

Figure 28A:
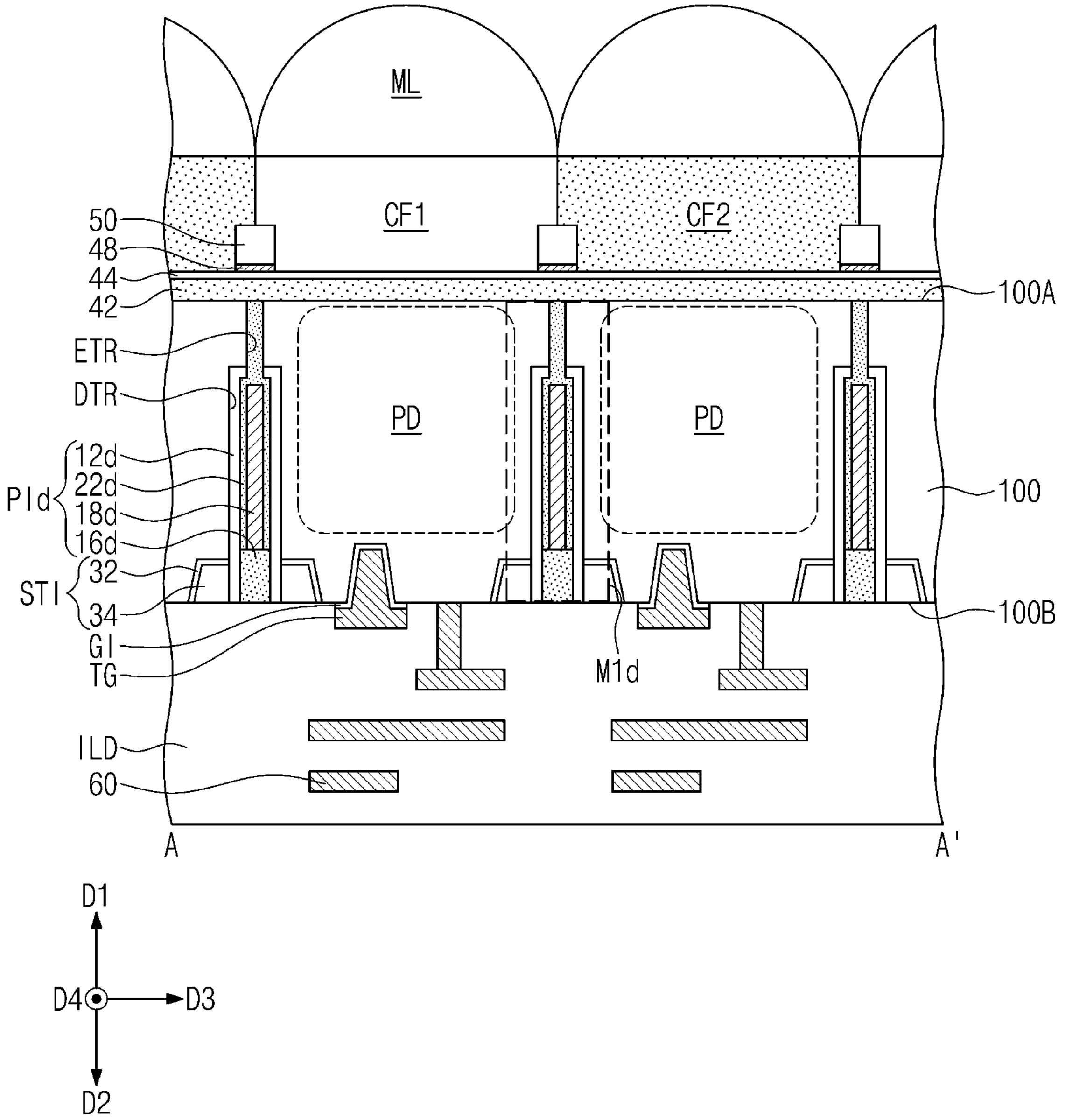
FIG. 28A illustrates a cross-sectional view taken along line A-A' of FIG. 3 and of an image sensor according to some embodiments of the present disclosure.
Figure 28B:
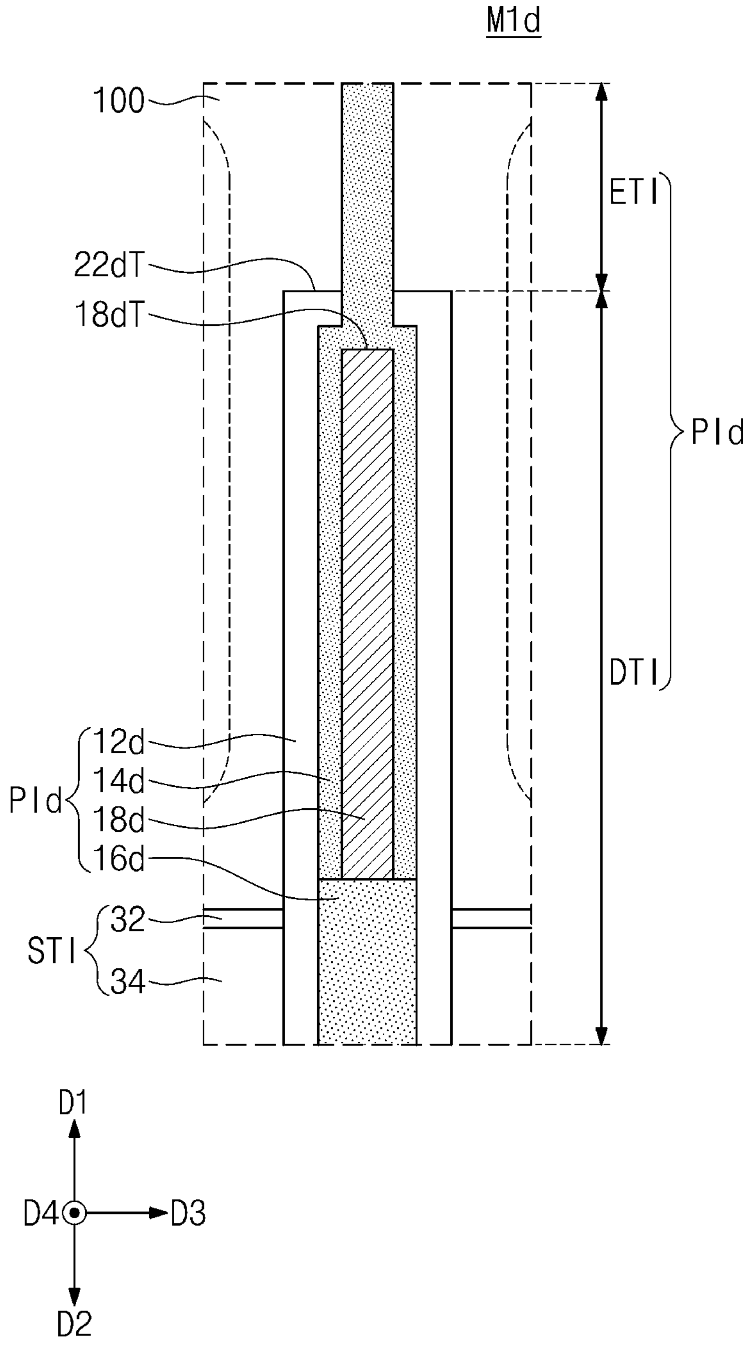
FIG. 28B illustrates an enlarged view showing section M1*d* of FIG. 28A.
Figure 28C:
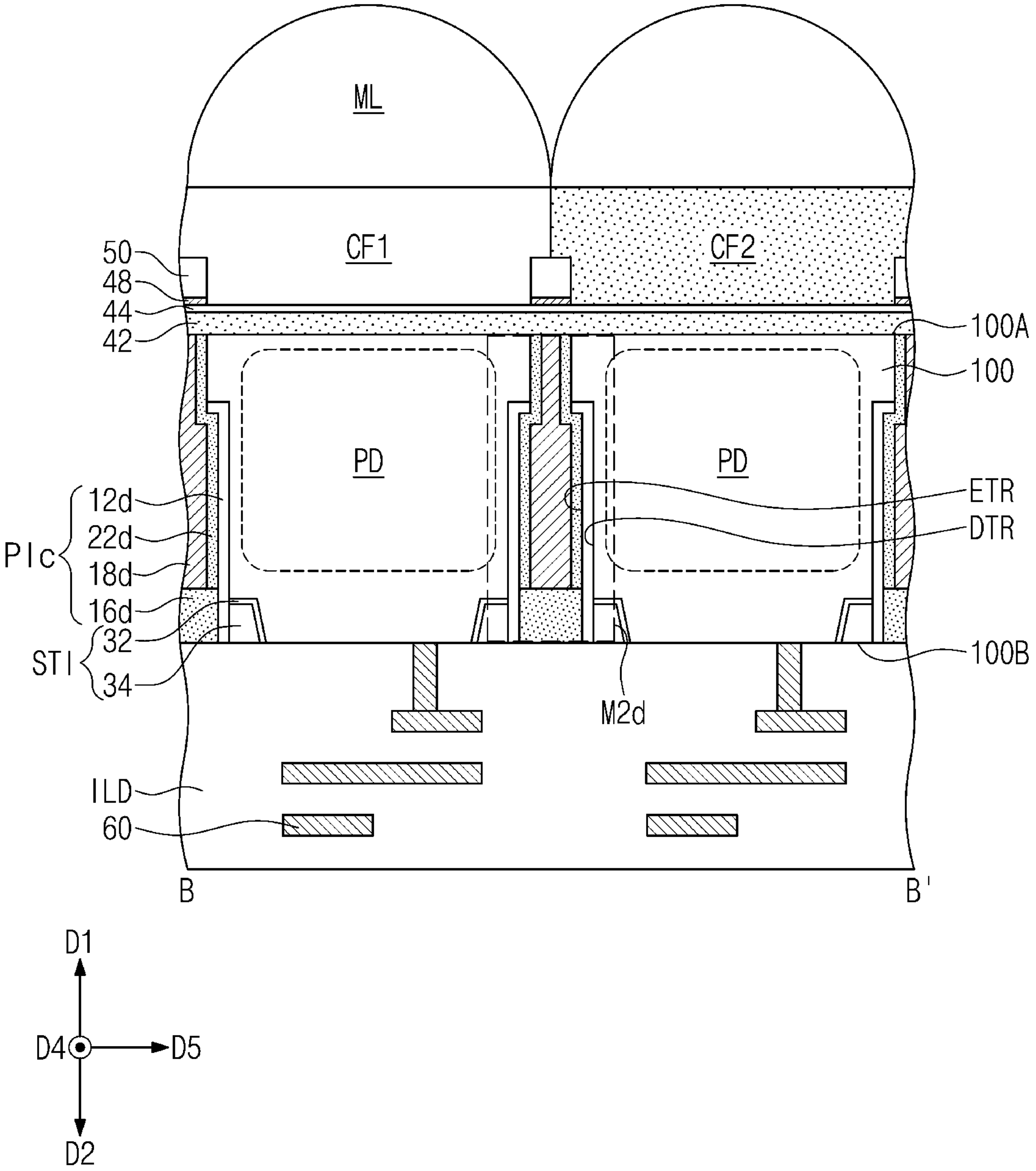
FIG. 28C illustrates a cross-sectional view taken along line B-B' of FIG. 3 and of an image sensor according to some embodiments of the present disclosure.
Figure 28D:
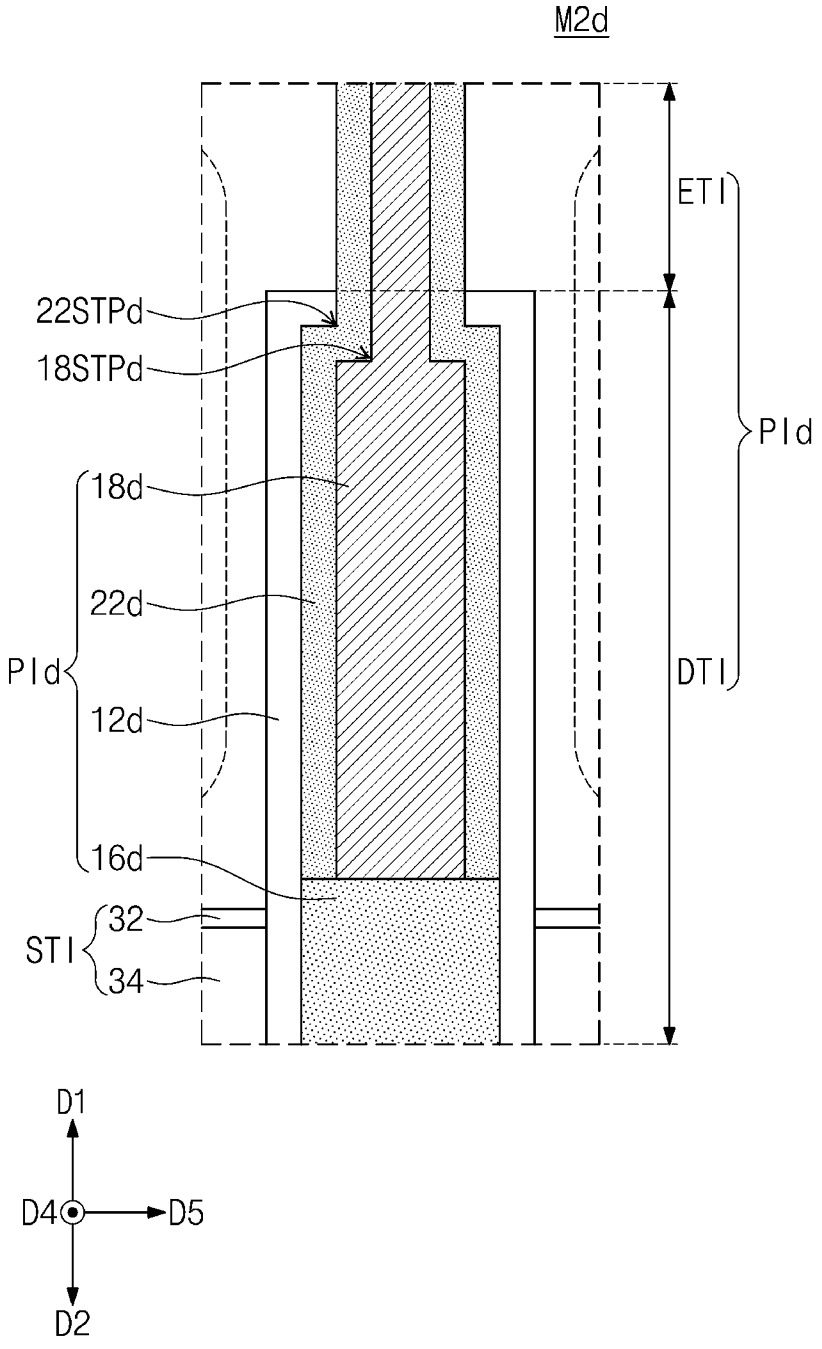
FIG. 28D illustrates an enlarged view showing section M2*d* of FIG. 28C.

FIG. 28A illustrates a cross-sectional view taken along line A-A' of FIG. 3 and of an image sensor according to some embodiments of the present disclosure. FIG. 28B illustrates an enlarged view showing section M1*d* of FIG. 28A. FIG. 28C illustrates a cross-sectional view taken along line B-B' of FIG. 3 and of an image sensor according to some embodiments of the present disclosure. FIG. 28D illustrates an enlarged view showing section M2*d* of FIG. 28C. For brevity of description, the following will mainly describe a difference from the image sensor discussed with reference to FIGS. 1 to 4D.

Referring to FIGS. 3 and 28A to 28D, a device isolation pattern PId may extend from the first surface 100A into the substrate 100, and may be interposed between a plurality of pixel areas PX. The device isolation pattern PId may include an intervening region IR and a crossing region CR. The device isolation pattern PId may include a first device isolation portion DTI and a second device isolation portion ETI.

In the intervening region IR, the device isolation pattern PId may include a buried conductive pattern 18*d*, a first dielectric pattern 22*d* on the buried conductive pattern 18*d*, a second dielectric pattern 12*d* on the first dielectric pattern 22*d*, and a buried dielectric pattern 16*d*.

The first device isolation portion DTI may include the first dielectric pattern 22*d*, the buried conductive pattern 18*d*, the second dielectric pattern 12*d*, and the buried dielectric pattern 16*d*. The second device isolation portion ETI may include the first dielectric pattern 22*d*.

The buried conductive pattern 18*d* may have a top surface 18*d*T at a level lower than a top surface 22*d*T of the first dielectric pattern 22*d*. The first dielectric pattern 22*d* may surround the top surface 18*d*T and a lateral surface of the buried conductive pattern 18*d*.

In the crossing region CR, the device isolation pattern PId may include a buried conductive pattern 18*d*, a first dielectric pattern 22*d* on the buried conductive pattern 18*d*, a second dielectric pattern 12*d* on the first dielectric pattern 22*d*, and a buried dielectric pattern 16*d*. The buried conductive pattern 18*d* and the first dielectric pattern 22*d* may extend from the first device isolation portion DTI to the second device isolation portion ETI.

In the crossing region CR, the first dielectric pattern 22*d* may have a first dielectric step difference 22STPd. The first dielectric step difference 22STPd may have, for example, a stepwise shape. The first dielectric step difference 22STPd may be defined to indicate, for example, a stepwise shape of the first dielectric pattern 22*d* in the vicinity of an interface between the first device isolation portion DTI and the second device isolation portion ETI.

In the crossing region CR, the buried conductive pattern 18*d* may have a buried conductive step difference 18STd. The buried conductive step difference 18STPd may have, for example, a stepwise shape. The buried conductive step difference 18STPd may be defined to indicate, for example, a stepwise shape of the buried conductive pattern 18*d* in the vicinity of an interface between the first device isolation portion DTI and the second device isolation portion ETI.

The first dielectric step difference 22STPd may be closer to an interface between the first device isolation portion DTI and the second device isolation portion ETI than the buried conductive pattern 18*d*.

Figure 29A:
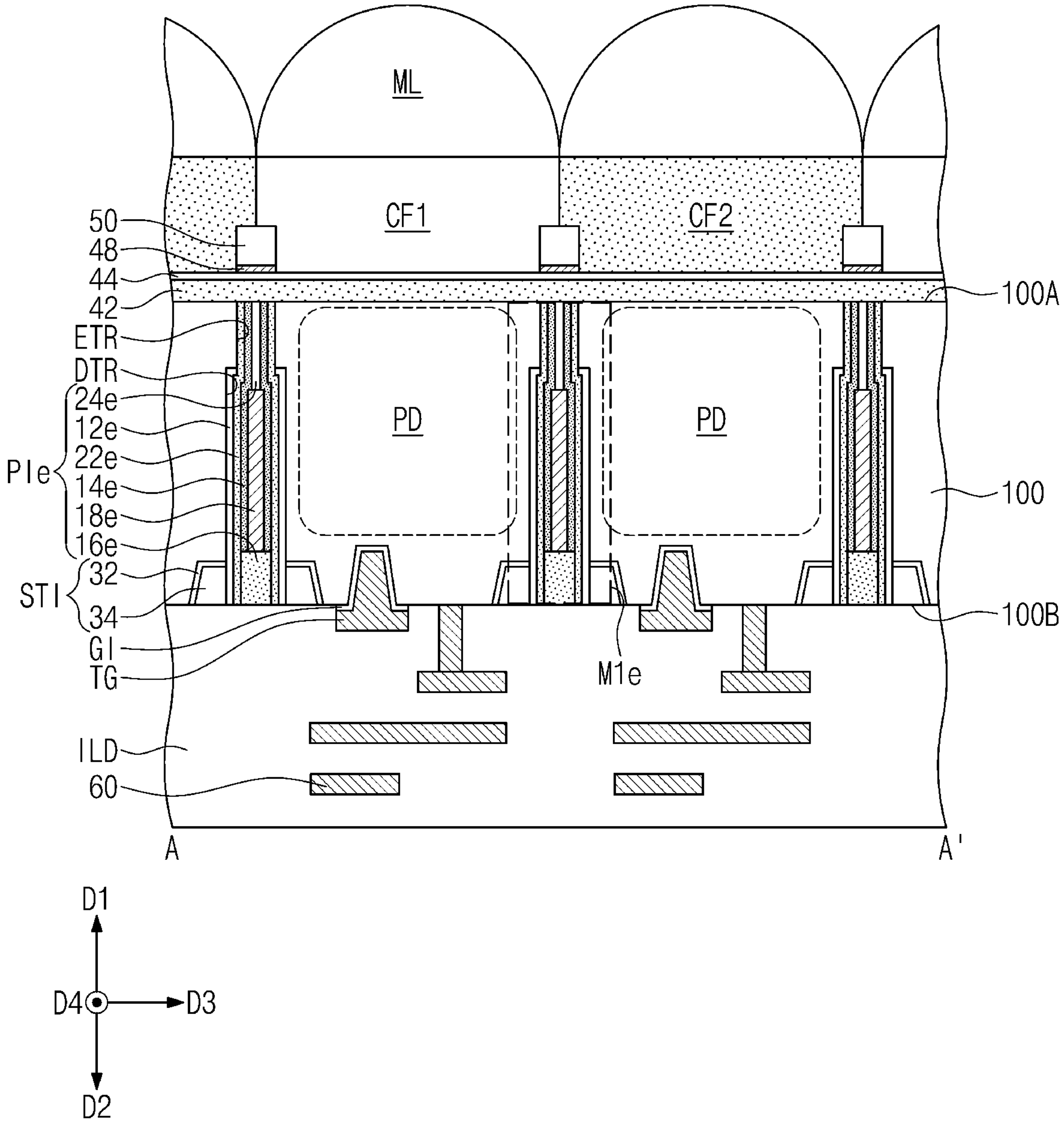
FIG. 29A illustrates a cross-sectional view taken along line A-A' of FIG. 3 and of an image sensor according to some embodiments of the present disclosure.
Figure 29B:
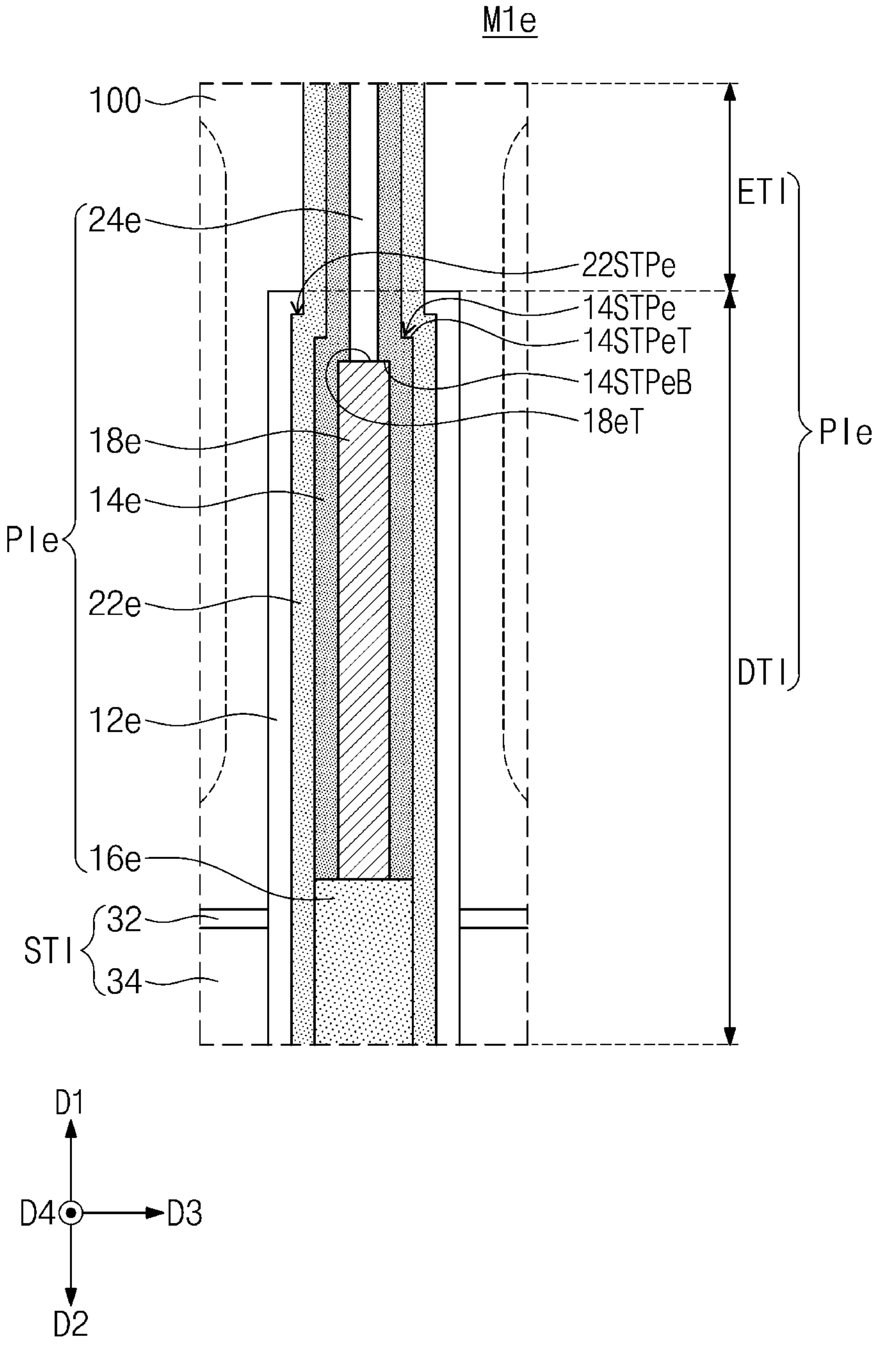
FIG. 29B illustrates an enlarged view showing section M1*e* of FIG. 29A.
Figure 29C:
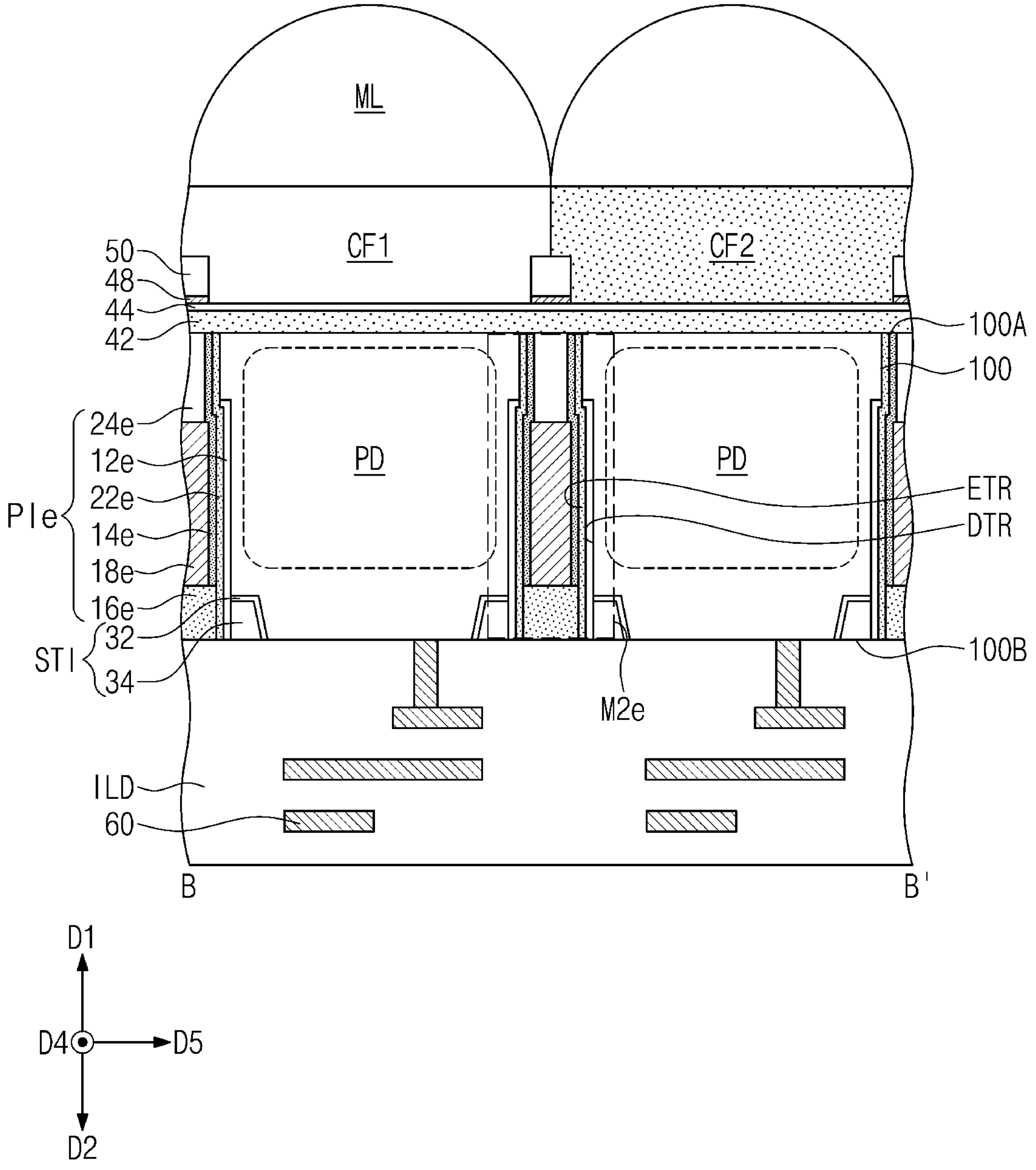
FIG. 29C illustrates a cross-sectional view taken along line B-B' of FIG. 3 and of an image sensor according to some embodiments of the present disclosure.
Figure 29D:
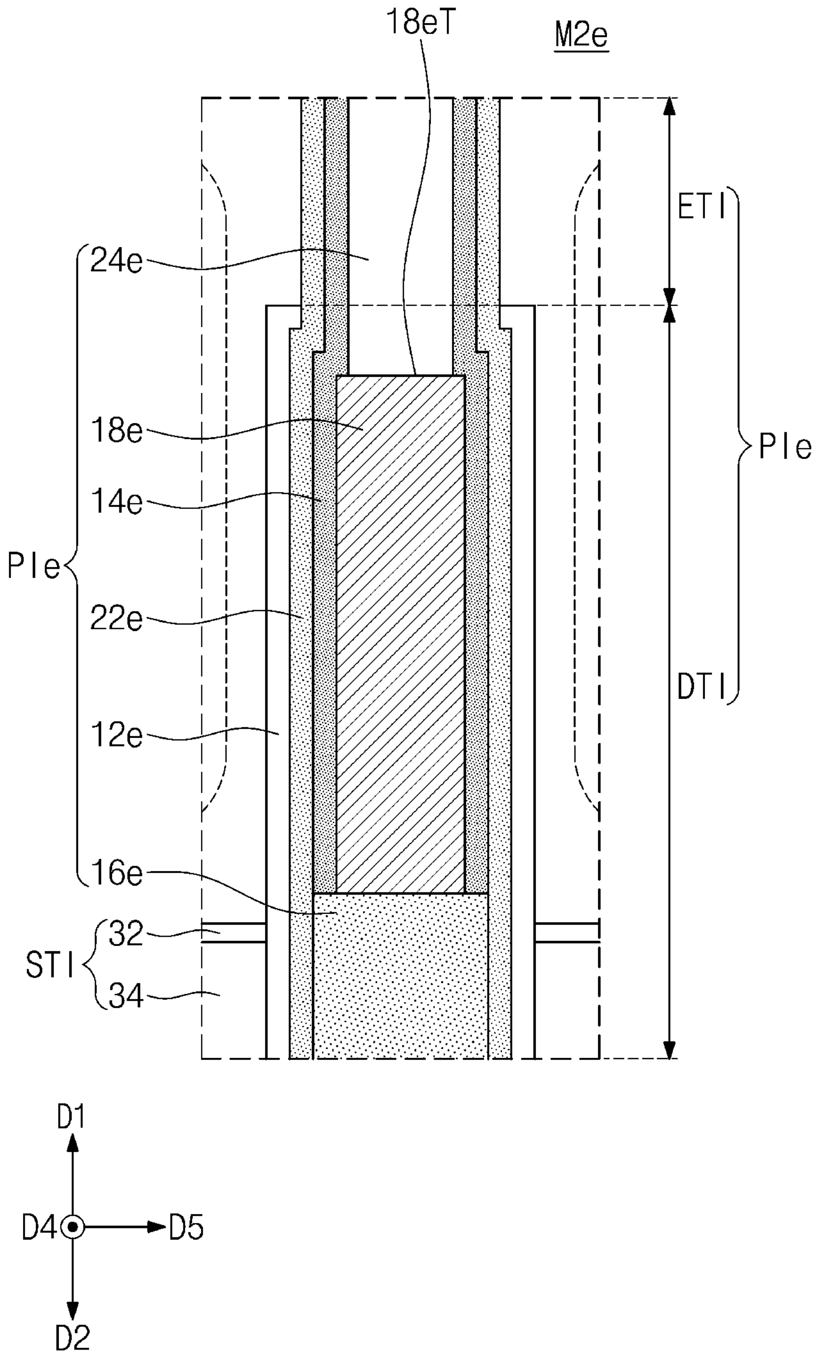
FIG. 29D illustrates an enlarged view showing section M2*e* of FIG. 29C.

FIG. 29A illustrates a cross-sectional view taken along line A-A' of FIG. 3 and of an image sensor according to some embodiments of the present disclosure. FIG. 29B illustrates an enlarged view showing section M1*e* of FIG. 29A. FIG. 29C illustrates a cross-sectional view taken along line B-B' of FIG. 3 and of an image sensor according to some embodiments of the present disclosure. FIG. 29D illustrates an enlarged view showing section M2*e* of FIG. 29C. For brevity of description, the following will mainly describe a difference from the image sensor discussed with reference to FIGS. 1 to 4D.

Referring to FIGS. 3 and 29A to 29D, a device isolation pattern Pie may extend from the first surface 100A into the substrate 100, and may be interposed between a plurality of pixel areas PX. The device isolation pattern PIe may include an intervening region IR and a crossing region CR. The device isolation pattern Pie may include a first device isolation portion DTI and a second device isolation portion ETI.

The device isolation pattern Pie may include a buried conductive pattern 18*e*, a conductive liner 14*e* in contact with the buried conductive pattern 18*e*, an intervening dielectric pattern 24*e* on the buried conductive pattern 18*e*, a first dielectric pattern 22*e* on the conductive liner 14*e*, a second dielectric pattern 12*e* on the first dielectric pattern 22*e*, and a buried dielectric pattern 16*e*.

The first dielectric pattern 22*e* and the conductive liner 14*e* may extend from the first device isolation portion DTI to the second device isolation portion ETI.

The first device isolation portion DTI may include the first dielectric pattern 22*e*, the buried conductive pattern 18*e*, the second dielectric pattern 12*e*, the intervening dielectric pattern 24*e*, and the buried dielectric pattern 16*e*. The second device isolation portion ETI may include the first dielectric pattern 22*e*, the conductive liner 14*e*, and the intervening dielectric pattern 24*e*.

The conductive liner 14*e* may have a liner step difference 14STPe. The liner step difference 14STPe may have, for example, a stepwise shape. The liner step difference 14STPe may be defined to indicate, for example, a stepwise shape of the conductive liner 14*e* in the vicinity of an interface between the first device isolation portion DTI and the second device isolation portion ETI.

The liner step difference 14STPe may include a top surface 14STPeT of the liner step difference 14STPe and a bottom surface 14STPeB of the liner step difference 14STPe.

The first dielectric pattern 22*e* may have a first dielectric step difference 22STPe. The first dielectric step difference 22STPe may have, for example, a stepwise shape. The first dielectric step difference 22STPe may be defined to indicate, for example, a stepwise shape of the first dielectric pattern 22*e* in the vicinity of an interface between the first device isolation portion DTI and the second device isolation portion ETI.

The buried conductive pattern 18*e* may have a top surface 18*e*T at a level lower than that of the top surface 14STPeT of the liner step difference 14STPe. The level of the top surface 18*e*T of the buried conductive pattern 18*e* may be the same as that of the bottom surface 14STPeB of the liner step difference 14STPe. The top surface 18*e*T of the buried conductive pattern 18*e* may be coplanar with the bottom surface 14STPeB of the liner step difference 14STPe.

Figure 30A:
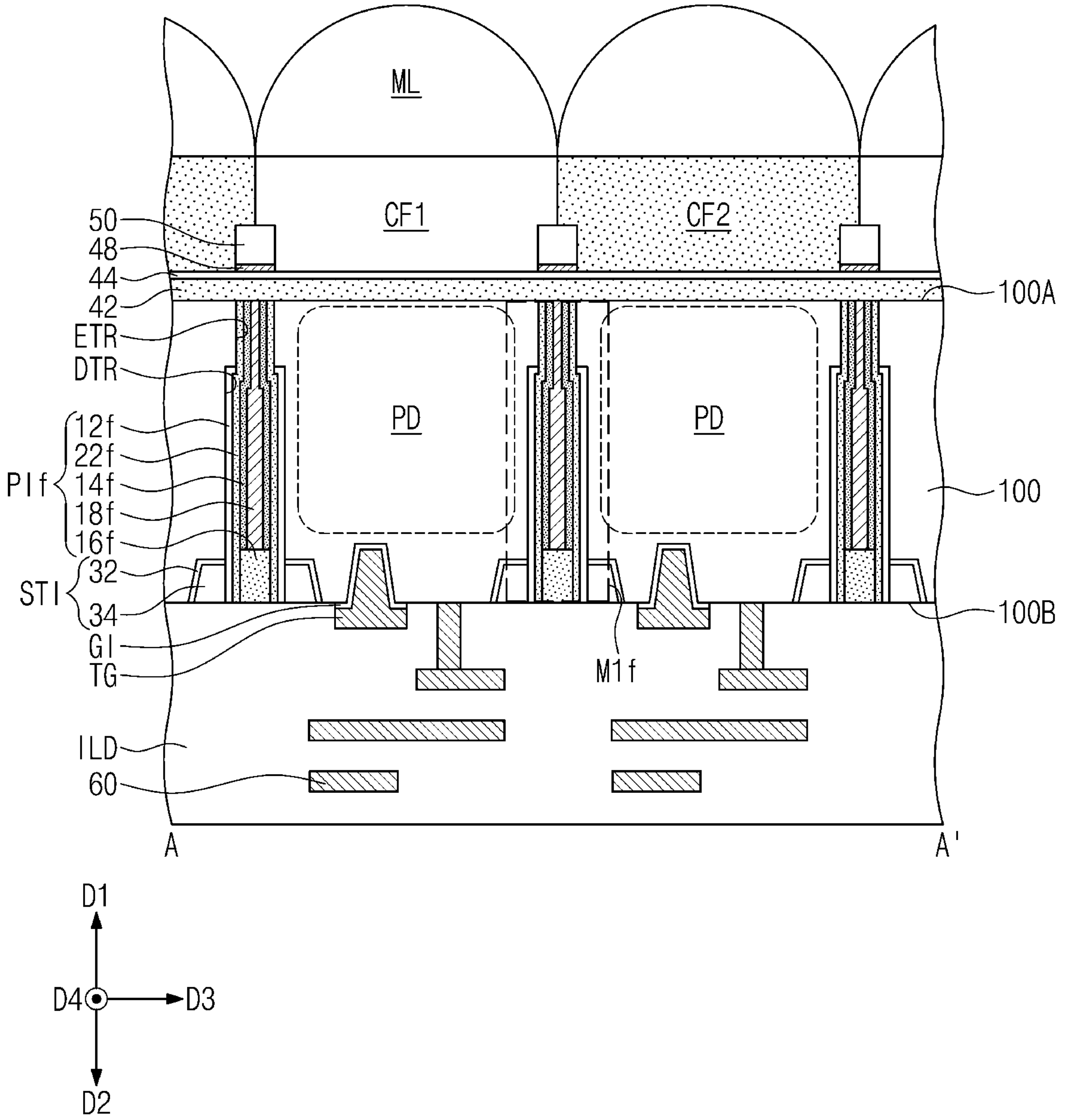
FIG. 30A illustrates a cross-sectional view taken along line A-A' of FIG. 3 and of an image sensor according to some embodiments of the present disclosure.
Figure 30B:
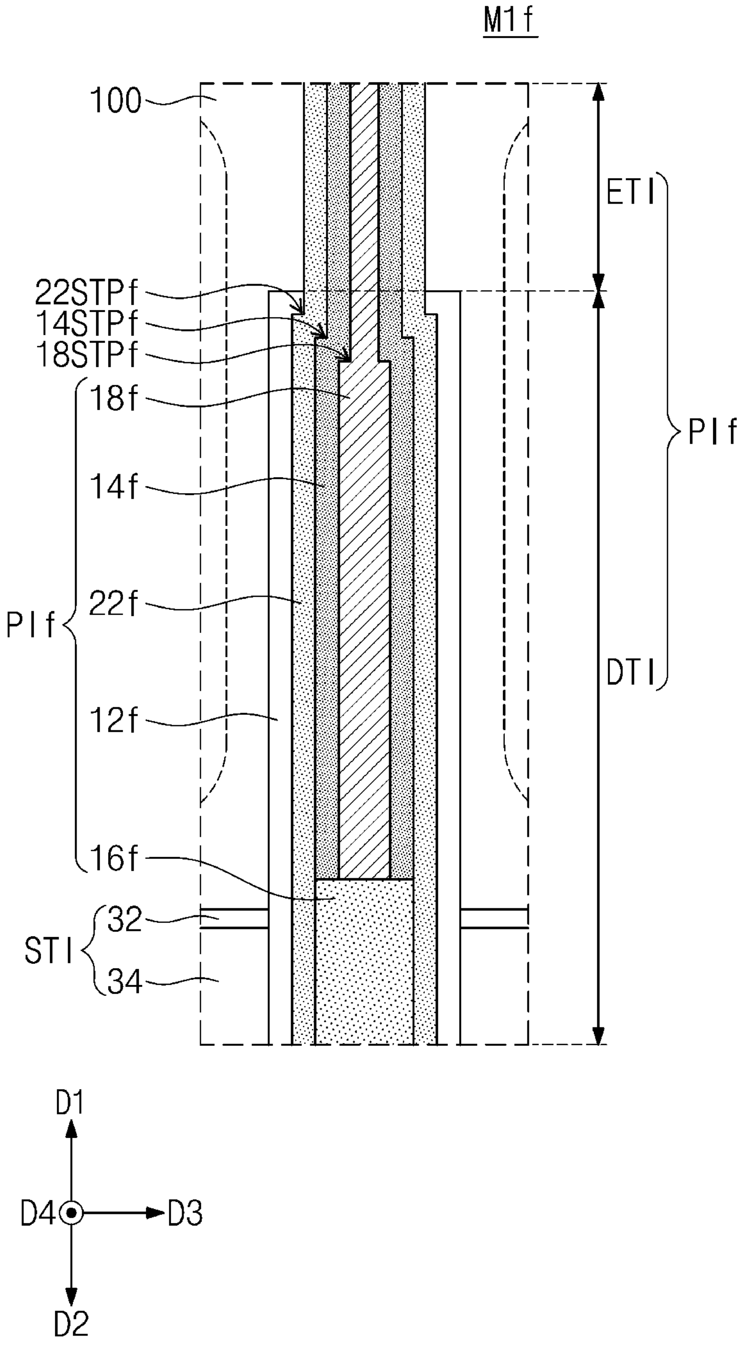
FIG. 30B illustrates an enlarged view showing section M1*f* of FIG. 30A.
Figure 30C:
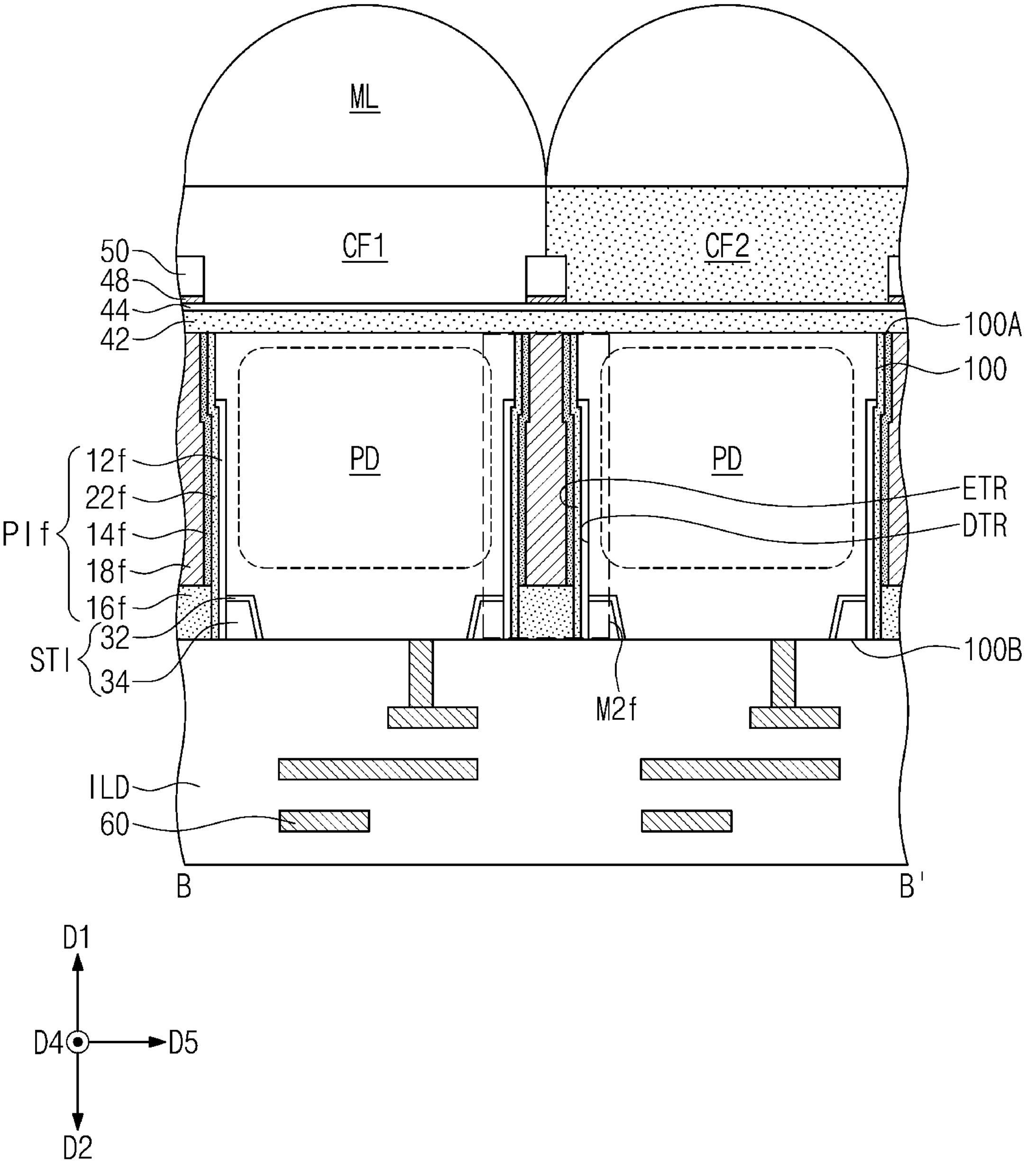
FIG. 30C illustrates a cross-sectional view taken along line B-B' of FIG. 3 and of an image sensor according to some embodiments of the present disclosure.
Figure 30D:
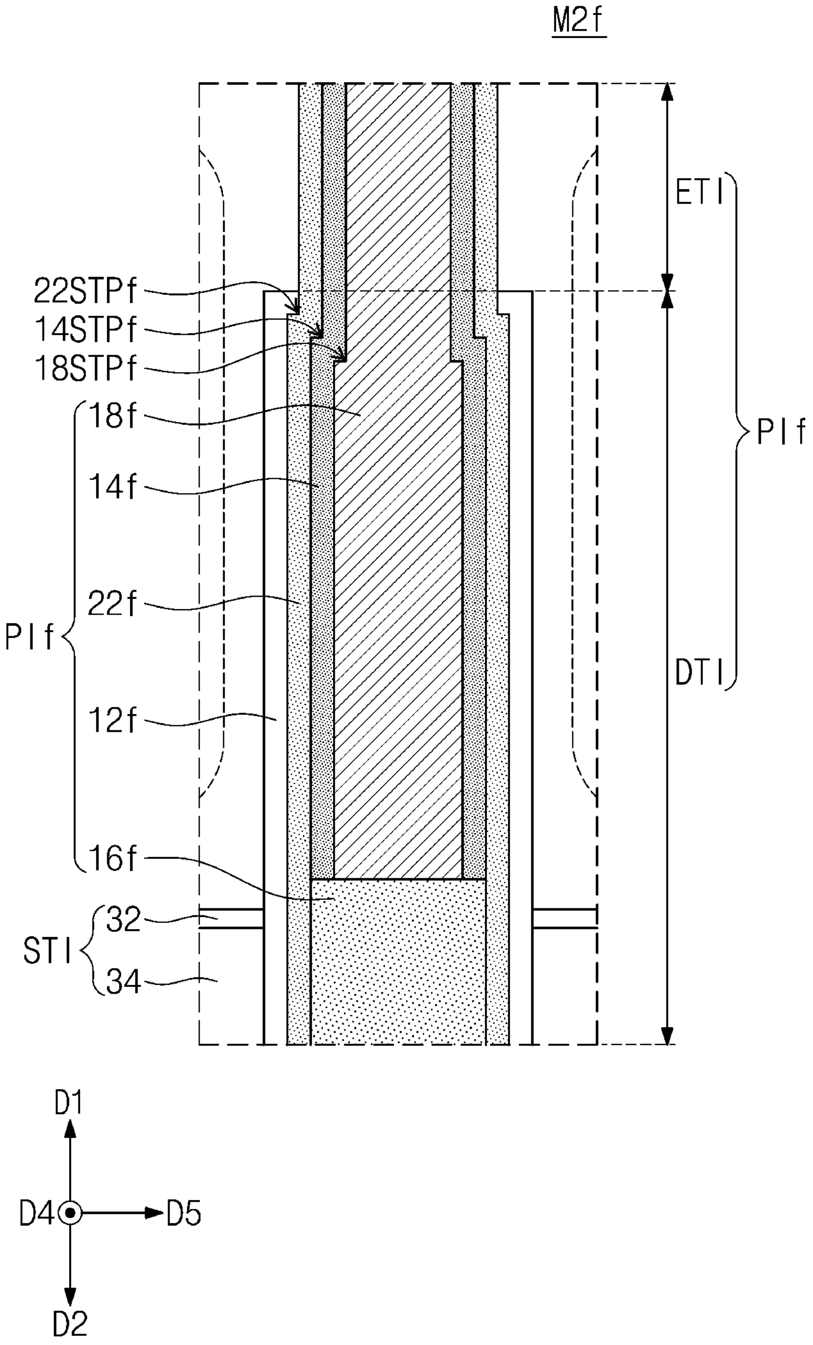
FIG. 30D illustrates an enlarged view showing section M2*f* of FIG. 30C.

FIG. 30A illustrates a cross-sectional view taken along line A-A' of FIG. 3 and of an image sensor according to some embodiments of the present disclosure. FIG. 30B illustrates an enlarged view showing section M1*f* of FIG. 30A. FIG. 30C illustrates a cross-sectional view taken along line B-B' of FIG. 3 and of an image sensor according to some embodiments of the present disclosure. FIG. 30D illustrates an enlarged view showing section M2*f* of FIG. 30C. For brevity of description, the following will mainly describe a difference from the image sensor discussed with reference to FIGS. 1 to 4D.

Referring to FIGS. 3 and 30A to 30D, a device isolation pattern PIf may extend from the first surface 100A into the substrate 100, and may be interposed between a plurality of pixel areas PX. The device isolation pattern PIf may include an intervening region IR and a crossing region CR. The device isolation pattern PIf may include a first device isolation portion DTI and a second device isolation portion ETI.

The device isolation pattern PIf may include a buried conductive pattern 18*f*, a conductive liner 14*f* on the buried conductive pattern 18*f*, a first dielectric pattern 22*f* on the conductive liner 14*f*, a second dielectric pattern 12*f* on the first dielectric pattern 22*f*, and a buried dielectric pattern 16*f*.

The first dielectric pattern 22*f*, the conductive liner 14*f*, and the buried conductive pattern 18*f* may extend from the first device isolation portion DTI to the second device isolation portion ETI.

The first device isolation portion DTI may include the first dielectric pattern 22*f*, the buried conductive pattern 18*f*, the second dielectric pattern 12*f*, the conductive liner 14*f*, and the buried dielectric pattern 16*f*. The second device isolation portion ETI may include the first dielectric pattern 22*f*, the conductive liner 14*f*, and the buried conductive pattern 18*f*.

The conductive liner 14*f* may have a liner step difference 14STPf. The liner step difference 14STPf may have, for example, a stepwise shape. The liner step difference 14STPf may be defined to indicate, for example, a stepwise shape of the conductive liner 14*f* in the vicinity of an interface between the first device isolation portion DTI and the second device isolation portion ETI.

The buried conductive pattern 18*f* may have a buried conductive step difference 18STPf. The buried conductive step difference 18STPf may have, for example, a stepwise shape. The buried conductive step difference 18STPf may be defined to indicate, for example, a stepwise shape of the buried conductive pattern 18*f* in the vicinity of an interface between the first device isolation portion DTI and the second device isolation portion ETI.

The first dielectric pattern 22*f* may have a first dielectric step difference 22STPf. The first dielectric step difference 22STPf may have, for example, a stepwise shape. The first dielectric step difference 22STPf may be defined to indicate, for example, a stepwise shape of the first dielectric pattern 22*f* in the vicinity of an interface between the first device isolation portion DTI and the second device isolation portion ETI.

According to the present disclosure, an image sensor may have a deep device isolation pattern formed through a multi-stepped trench, and the deep device isolation pattern may have a first device isolation portion and a second device isolation portion.

The first device isolation portion and the second device isolation portion may have different materials disposed therein. In addition, boron may be doped in a sidewall of the multi-stepped trench.

Therefore, there may be an increase in expansion of a light-receiving region, an increase in sensitivity, a reduction in optical adsorption, and an improvement in total reflection. Moreover, the embodiments described herein provide improved control of dark currents and white spots.

The aforementioned description provides some embodiments for explaining the present disclosure. Therefore, the present disclosure are not limited to the embodiments described above, and it will be understood by one of ordinary skill in the art that variations in form and detail may be made therein without departing from the spirit and essential features of the present disclosure.

What is claimed is:

1. An image sensor, comprising:

a substrate that comprises a plurality of pixel areas, wherein the substrate comprises a first surface and a second surface that are opposite to each other; and a device isolation pattern that extends from the first surface and into the substrate, wherein the device isolation pattern is between the plurality of pixel areas, wherein the device isolation pattern comprises an intervening region, a crossing region, a first device isolation portion, and a second device isolation portion, wherein the intervening region comprises:

a first dielectric pattern;

a conductive liner that contacts a sidewall of the first dielectric pattern; and a second dielectric pattern that contacts a sidewall of the conductive liner and a top surface of the conductive liner, wherein the first dielectric pattern extends from the first device isolation portion and toward the second device isolation portion, and wherein the first device isolation portion comprises the conductive liner and the second dielectric pattern.

2. The image sensor of claim 1, wherein a width of the first dielectric pattern is less than a width of the second dielectric pattern.

3. The image sensor of claim 1, wherein a width of the conductive liner is greater than a width of the first dielectric pattern.

4. The image sensor of claim 1, further comprising a doping region on the substrate, wherein the doping region contacts the first device isolation portion and is doped with boron.

5. The image sensor of claim 1, wherein the crossing region comprises a buried conductive pattern that contacts the conductive liner, and wherein the buried conductive pattern is in the first device isolation portion.

6. The image sensor of claim 5, wherein a top surface of the buried conductive pattern extends from the second surface of the substrate by a first distance, wherein the top surface of the conductive liner extends from the second surface of the substrate by a second distance, and wherein the first distance is less than the second distance.

7. The image sensor of claim 5, further comprising:

a shallow device isolation pattern that is adjacent to the second surface of the substrate; and a buried dielectric pattern that extends into the shallow device isolation pattern, wherein the second dielectric pattern is between the buried dielectric pattern and the shallow device isolation pattern.

8. The image sensor of claim 7, wherein a top surface of the buried dielectric pattern contacts the conductive liner and the buried conductive pattern.

9. The image sensor of claim 5, wherein a width of the buried conductive pattern is greater than a width of the first dielectric pattern.

10. An image sensor, comprising:

a substrate that comprises a plurality of pixel areas, wherein the substrate comprises a first surface and a second surface that are opposite to each other; and a device isolation pattern that extends from the first surface and into the substrate, wherein the device isolation pattern is between the plurality of pixel areas, wherein the device isolation pattern comprises an intervening region, a crossing region, a first device isolation portion, and a second device isolation portion, wherein the intervening region comprises:

an intervening dielectric pattern;

a conductive liner that contacts the intervening dielectric pattern;

a first dielectric pattern that contacts the conductive liner; and a second dielectric pattern on the first dielectric pattern, wherein the first dielectric pattern extends from the first device isolation portion and toward the second device isolation portion, wherein the first device isolation portion comprises the intervening dielectric pattern, the conductive liner, and the second dielectric pattern, and wherein the first dielectric pattern comprises a stepwise shape on the first device isolation portion.

11. The image sensor of claim 10, wherein the conductive liner further comprises:

a flat conductive portion that is parallel to the substrate; and an extension conductive portion that extends from the flat conductive portion and toward the second surface of the substrate, wherein the extension conductive portion contacts the intervening dielectric pattern.

12. The image sensor of claim 11, wherein the extension conductive portion is between the intervening dielectric pattern and the first dielectric pattern.

13. The image sensor of claim 10, further comprising a doping region on the substrate, wherein the doping region is doped with boron and contacts the first device isolation portion and the second device isolation portion.

14. The image sensor of claim 10, wherein the conductive liner at least partially surrounds a lateral surface of the intervening dielectric pattern and a top surface of the intervening dielectric pattern.

15. The image sensor of claim 10, wherein, in the crossing region, the device isolation pattern further comprises a buried conductive pattern that contacts the conductive liner, and wherein the buried conductive pattern extends from the first device isolation portion and toward the second device isolation portion.

16. The image sensor of claim 15, wherein the first dielectric pattern further comprises:

a first pattern outer surface;

a second pattern outer surface that contacts the first pattern outer surface; and a third pattern outer surface that contacts the second pattern outer surface, wherein the first pattern outer surface is spaced apart from the third pattern outer surface.

17. The image sensor of claim 15, wherein the conductive liner further comprises:

a first liner outer surface;

a second liner outer surface that contacts the first liner outer surface; and a third liner outer surface that contacts the second liner outer surface, wherein the first liner outer surface is spaced apart from the third liner outer surface, wherein the first liner outer surface extends in a first direction, and wherein the second liner outer surface extends in a second direction that intersects the first direction.

18. The image sensor of claim 15, wherein a width of the buried conductive pattern in the first device isolation portion is less than a width of the buried conductive pattern in the second device isolation portion.

19. The image sensor of claim 10, further comprising:

a shallow device isolation pattern that is adjacent to the second surface of the substrate; and a buried dielectric pattern that extends into the shallow device isolation pattern, wherein the second dielectric pattern and the first dielectric pattern are between the buried dielectric pattern and the shallow device isolation pattern.

* * * * *